United States Patent
Lai et al.

(10) Patent No.: US 12,364,006 B2
(45) Date of Patent: Jul. 15, 2025

(54) INTEGRATED CIRCUIT AND METHOD OF FORMING SAME

(71) Applicant: TAIWAN SEMICONDUCTOR MANUFACTURING COMPANY, LTD., Hsinchu (TW)

(72) Inventors: Chih-Yu Lai, Hsinchu (TW); Chih-Liang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 393 days.

(21) Appl. No.: 17/444,923

(22) Filed: Aug. 12, 2021

(65) Prior Publication Data

US 2023/0050555 A1    Feb. 16, 2023

(51) Int. Cl.
| | |
|---|---|
| *H01L 27/11* | (2006.01) |
| *H10D 84/01* | (2025.01) |
| *H10D 84/03* | (2025.01) |
| *H10D 84/90* | (2025.01) |
| *H10D 89/10* | (2025.01) |

(52) U.S. Cl.
CPC ....... *H10D 84/907* (2025.01); *H10D 84/0186* (2025.01); *H10D 84/038* (2025.01); *H10D 89/10* (2025.01); *H10D 84/966* (2025.01); *H10D 84/981* (2025.01); *H10D 84/988* (2025.01)

(58) Field of Classification Search
CPC .......... H01L 27/11807; H01L 27/0207; H10D 84/907; H10D 89/10; H10D 84/981; H10D 84/966; H10D 84/988
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Taiwan | |
| 2015/0278429 A1 | 10/2015 | Chang | |
| 2018/0151550 A1* | 5/2018 | Peng | H01L 27/0207 |
| 2018/0308796 A1* | 10/2018 | Peng | H01L 23/53271 |
| 2021/0134783 A1* | 5/2021 | Li | H01L 27/0207 |

* cited by examiner

*Primary Examiner* — Mounir S Amer
*Assistant Examiner* — Alexander Belousov
(74) *Attorney, Agent, or Firm* — Hauptman Ham LLP

(57) ABSTRACT

An integrated circuit includes a set of transistors including a set of active regions, a set of power rails, a first set of conductors and a first conductor. The set of active regions extends in a first direction, and is on a first level. The set of power rails extends in the first direction and is on a second level. The set of power rails has a first width. The first set of conductors extends in the first direction, is on the second level, and overlaps the set of active regions. The first set of conductors has a second width. The first conductor extends in the first direction, is on the second level and is between the first set of conductors. The first conductor has the first width, electrically couples a first transistor of the set of transistors to a second transistor of the set of transistors.

20 Claims, 29 Drawing Sheets

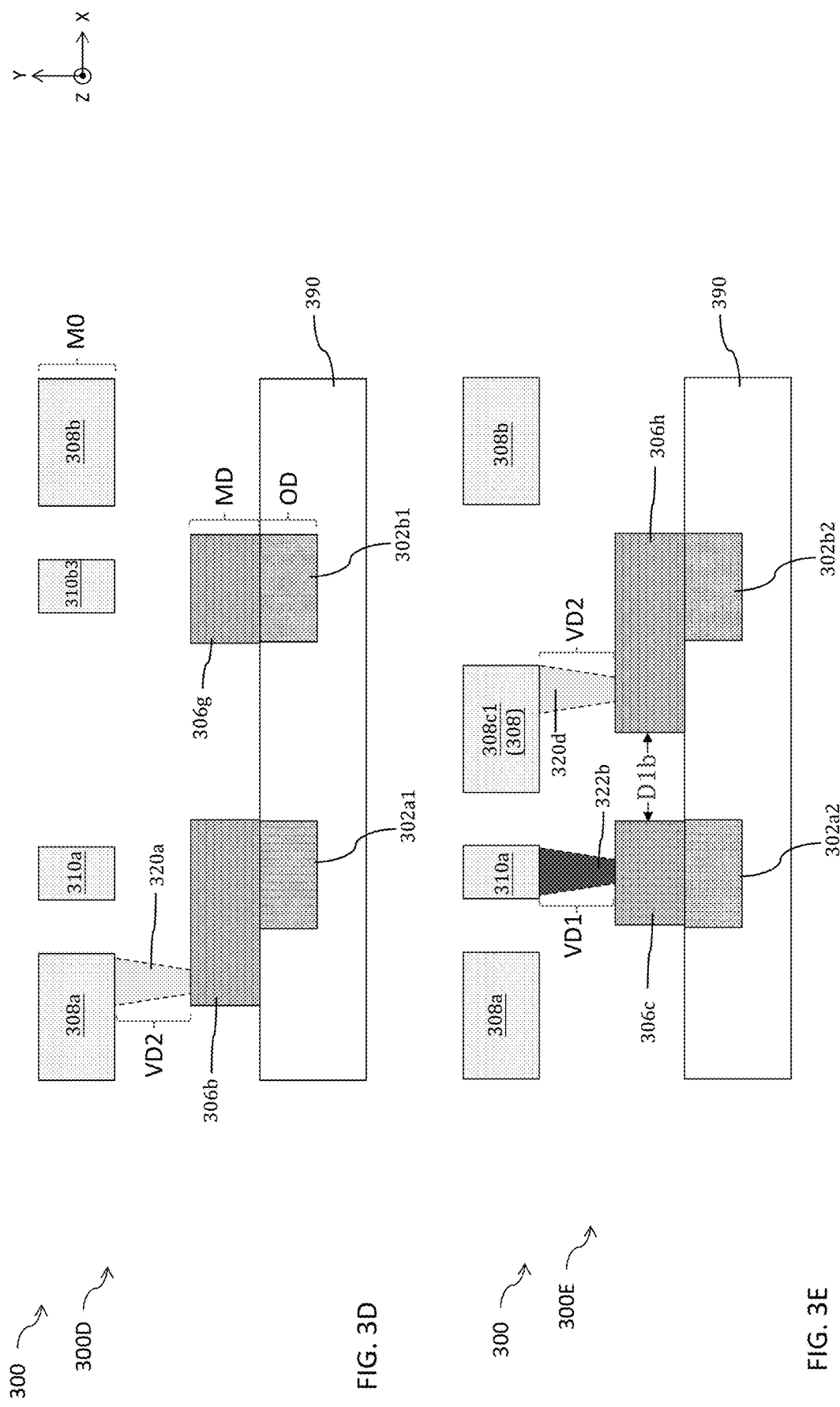

INTEGRATED CIRCUIT AND METHOD OF FORMING SAME

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are diagrams of an integrated circuit, in accordance with some embodiments.

DETAILED DESCRIPTION

Figure 1:
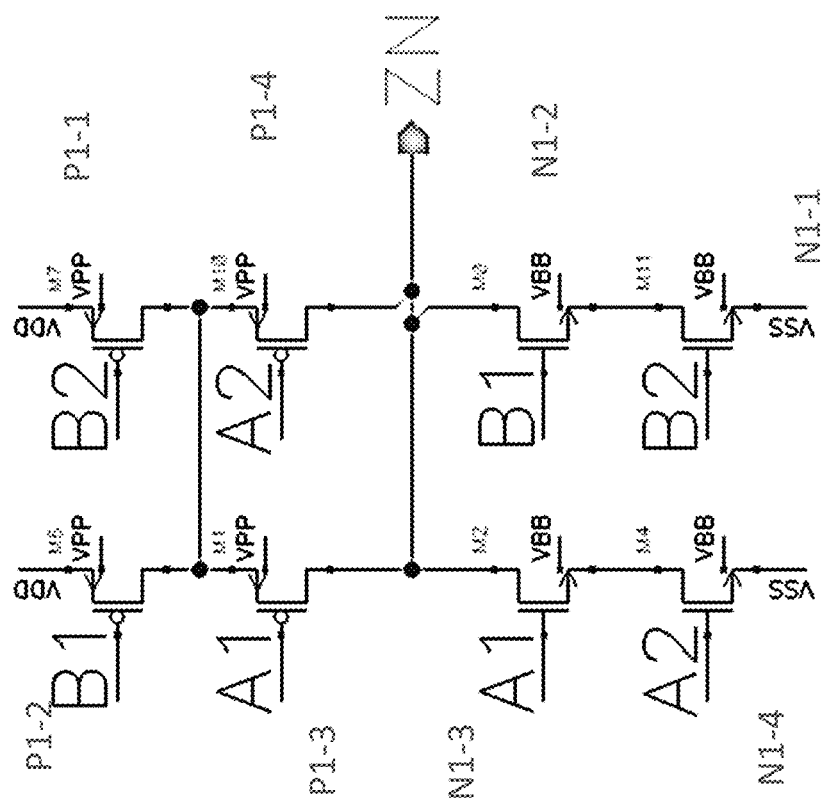
FIG. 1 is a circuit diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a set of transistors, a set of power rails, a first set of conductors and a first conductor.

In some embodiments, the set of transistors includes a set of active regions. In some embodiments, the set of active regions extends in a first direction, and is on a first level of a substrate.

In some embodiments, the set of power rails extends in the first direction, and is on a second level different from the first level. In some embodiments, the set of power rails is configured to supply a first supply voltage or a second supply voltage to the set of transistors. In some embodiments, the set of power rails is on a second level different from the first level. In some embodiments, the set of power rails has a first width.

In some embodiments, the first set of conductors extends in the first direction and is on the second level. In some embodiments, the first set of conductors overlaps the set of active regions, and is separated from the set of power rails in a second direction different from the first direction. In some embodiments, the first set of conductors has a second width different from the first width.

In some embodiments, the first conductor extends in the first direction and is on the second level. In some embodiments, the first conductor is between the first set of conductors.

In some embodiments, the first conductor has the first width. In some embodiments, by having the first width different from the second width, the first conductor electrically couples a first transistor of the set of transistors to a second transistor of the set of transistors, and the integrated circuit of the present disclosure thereby offers more routing flexibility and more via landing spots, thus increasing routing resources compared to other approaches.

FIG. 1 is a circuit diagram of an integrated circuit 100, in accordance with some embodiments. In some embodiments, integrated circuit 100 is a 2-2 AND OR INVERT (AOI) circuit. A 2-2 AOI circuit is used for illustration, other types of circuits including other types of AOI circuits are within the scope of the present disclosure.

Integrated circuit 100 includes PMOS transistors P1-1, P1-2, P1-3 and P1-4 coupled to NMOS transistors N1-1, N1-2, N1-3 and N1-4.

A gate terminal of PMOS transistor P1-1 and NMOS transistor N1-1 are coupled together, and are configured as an input node B2. A gate terminal of PMOS transistor P1-2 and NMOS transistor N1-2 are coupled together, and are configured as an input node B1. A gate terminal of PMOS transistor P1-3 and NMOS transistor N1-3 are coupled together, and are configured as an input node A1. A gate terminal of PMOS transistor P1-4 and NMOS transistor N1-4 are coupled together, and are configured as an input node A2.

A source terminal of PMOS transistor P1-1 and a source terminal of PMOS transistor P1-2 are coupled to the voltage supply VDD. A source terminal of NMOS transistor N1-1 and a source terminal of NMOS transistor N1-4 are coupled to the reference voltage supply VSS.

A source terminal of NMOS transistor N1-2 and a drain terminal of NMOS transistor N1-1 are coupled to each other. A source terminal of NMOS transistor N1-3 and a drain terminal of NMOS transistor N1-4 are coupled to each other.

A source terminal of PMOS transistor P1-4, a source terminal of PMOS transistor P1-3, a drain terminal of PMOS transistor P1-2 and a drain terminal of PMOS transistor P1-1 are coupled to each other.

Figure 3A:
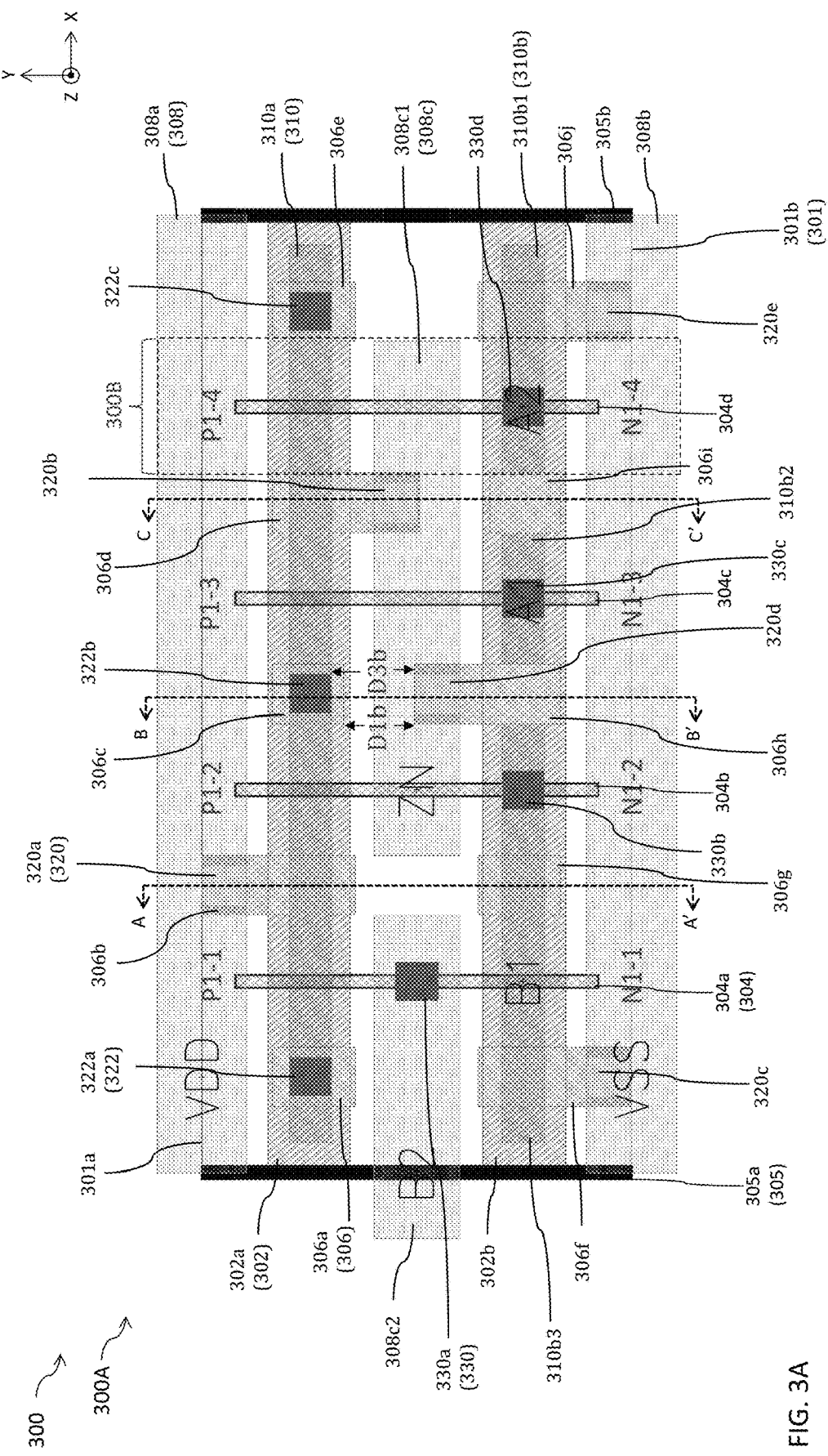

A drain terminal of PMOS transistor P1-4, a drain terminal of PMOS transistor P1-3, a drain terminal of NMOS transistor N1-2 and a drain terminal of NMOS transistor N1-3 are coupled to each other, and are configured as an output node ZN. As shown in FIG. 3A, the drain terminals of PMOS transistors P1-3 and P1-4, and the drain terminals of NMOS transistors N1-2 and N1-3 are electrically coupled together by at least a conductor 308c1 (described in FIGS. 3A & 3D-3F). In some embodiments, one or more of the drains or sources are flipped with the other.

Other configurations, arrangements or other circuits in integrated circuit 100 are within the scope of the present disclosure.

Figure 2A:
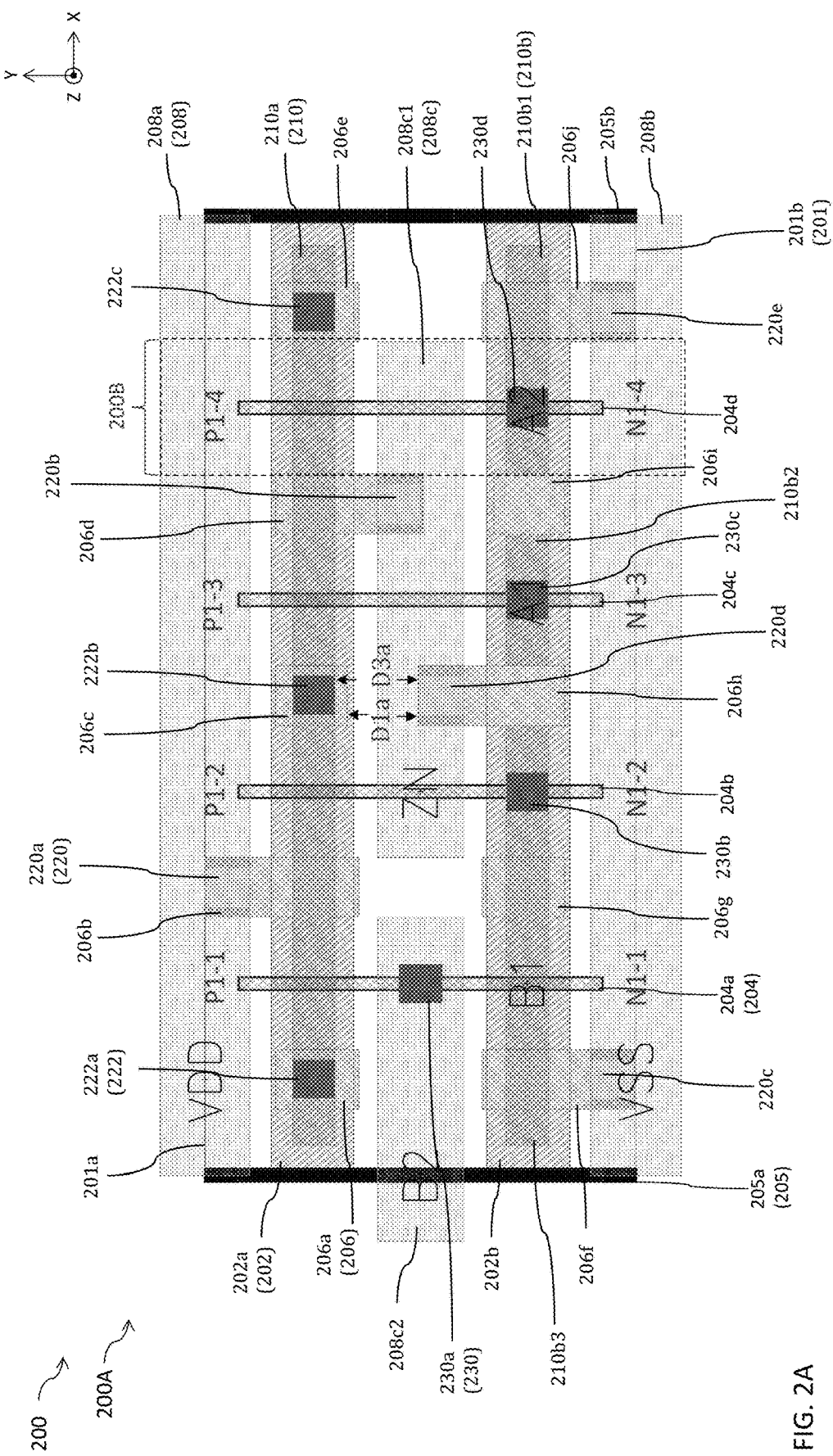
FIGS. 2A-2C are diagrams of a layout design of an integrated circuit, in accordance with some embodiments.
Figure 2B:
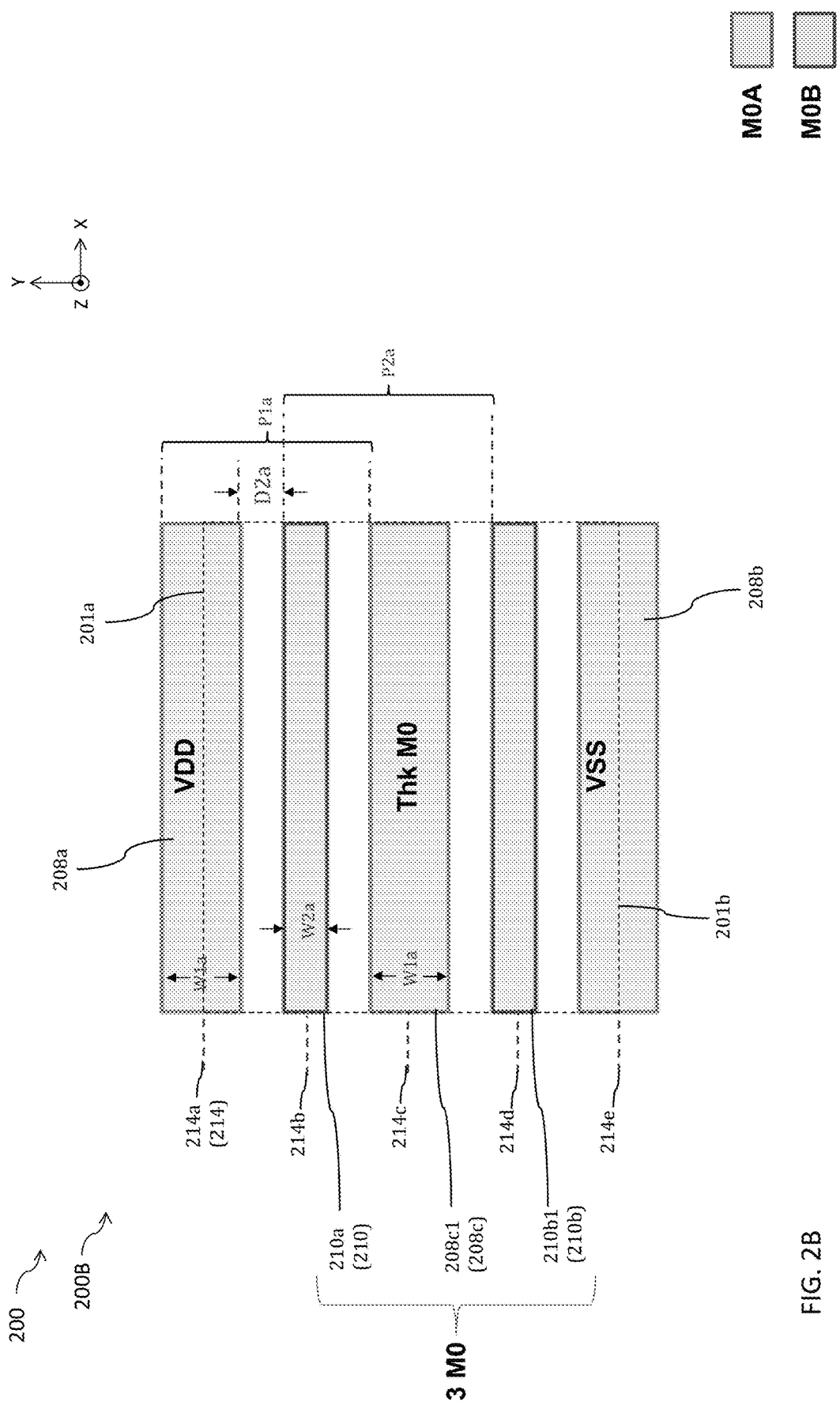
Figure 2C:
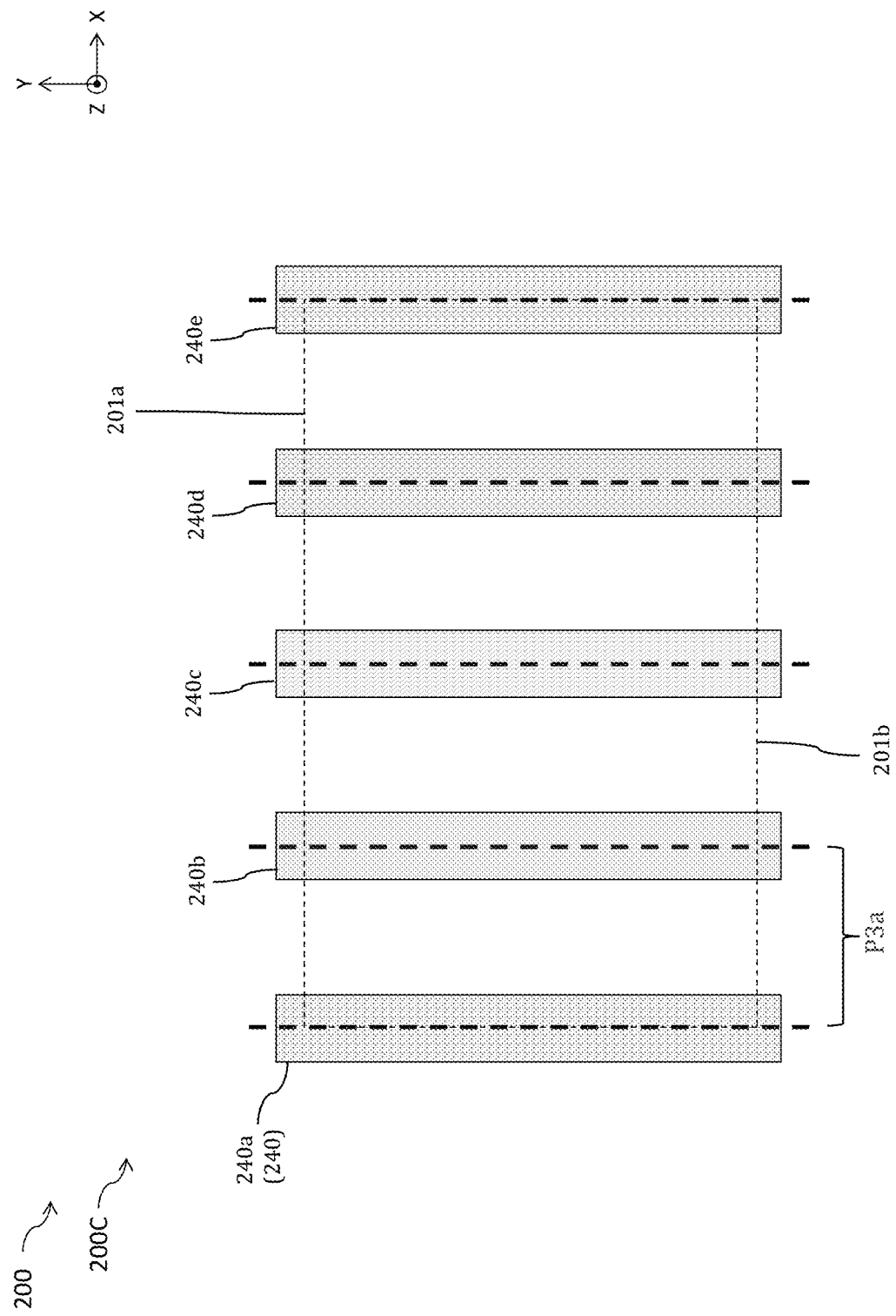

FIGS. 2A-2C are diagrams of a layout design 200 of an integrated circuit, in accordance with some embodiments. Layout design 200 is a layout diagram of integrated circuit 300 of FIGS. 3A-3F.

FIG. 2A is a diagram of a corresponding portion 200A of a layout design 200, simplified for ease of illustration.

FIG. 2B is a diagram of a corresponding portion 200B of a layout design 200, simplified for ease of illustration.

FIG. 2C is a diagram of a corresponding portion 200C of a layout design 200, simplified for ease of illustration.

For ease of illustration, some of the labeled elements of one or more of FIG. 2A-2C, 3A-3F, 4A-4C, 6, 8, 10, 12, 14 or 16 are not labelled in one or more of FIG. 2A-2C, 3A-3F, 4A-4C, 6, 8, 10, 12, 14 or 16. In some embodiments, layout design 200 includes additional elements not shown in FIGS. 2A-2C.

Portion 200A includes one or more features of layout design 200 of a oxide diffusion (OD) level or the active level, a gate (POLY) level, a metal over diffusion (MD) level, a metal 0 (M0) level, a via over gate (VG) level, a via over diffusion (VD) level or a metal 1 (M1) level of layout design 200.

Portion 200B includes one or more features of layout design 200 of the M0 level of layout design 200. Portion 200C includes one or more features of layout design 200 of the M1 level of layout design 200.

Layout design 200 is usable to manufacture integrated circuit 100 of FIG. 1. Layout design 200 is usable to manufacture integrated circuit 300 of FIGS. 3A-3F.

Layout design 200 corresponds to a cell 201. Cell 201 includes a cell boundary 201a and a cell boundary 201b that extend in a first direction X. Cell 201 corresponds to a standard cell of integrated circuit 100 of FIG. 1. In some embodiments, layout design 200 abuts other cell layout designs (not shown) along cell boundaries 201a and 201b, and along cell boundaries (not labelled) that extend in a second direction Y. In some embodiments, the second direction Y is different from the first direction X. In some embodiments, layout design 200 is a single height standard cell.

Layout design 200 includes one or more active region layout patterns 202a or 202b (collectively referred to as a "set of active region patterns 202") extending in the first direction X.

Embodiments of the present disclosure use the term "layout pattern" which is hereinafter also referred to as "patterns" in the remainder of the present disclosure for brevity.

Active region patterns 202a, 202b of the set of active region patterns 202 are separated from one another in the second direction Y. The set of active region patterns 202 is usable to manufacture a corresponding set of active regions 302 or 1602 of integrated circuit 300, 600, 800, 1000, 1200, 1400, 1600 (FIG. 3A-3F, 6, 8, 10, 12, 14 or 16).

In some embodiments, the set of active regions 302 are located on a front-side of integrated circuit 300, 600, 800, 1000, 1200, 1400, or 1600. In some embodiments, active region patterns 202a, 202b of the set of active region patterns 202 are usable to manufacture corresponding active regions 302a, 302b of the set of active regions 302 of integrated circuit 300, 600, 800, 1000, 1200, 1400 or 1600. In some embodiments, active region patterns 202a, 202b of the set of active region patterns 202 are usable to manufacture corresponding active regions 1602a, 1602b of the set of active regions 1602 of integrated circuit 1600.

In some embodiments, the set of active region patterns 202 is referred to as an oxide diffusion (OD) region which defines the source or drain diffusion regions of at least integrated circuit 300, 600, 800, 1000, 1200, 1400 or 1600.

In some embodiments, active region pattern 202a of the set of active region patterns 202 is usable to manufacture source and drain regions of p-type metal oxide semiconductor (PMOS) transistors of integrated circuits 300, 600, 800, 1000, 1200, 1400 or 1600, and active region pattern 202b of the set of active region patterns 202 is usable to manufacture source and drain regions of n-type metal oxide semiconductor (NMOS) transistors of integrated circuits 300, 600, 800, 1000, 1200, 1400 or 1600. In some embodiments, and active region pattern 202b of the set of active region patterns 202 is usable to manufacture source and drain regions of PMOS transistors of integrated circuits 300, 600, 800, 1000, 1200, 1400 or 1600, and active region pattern 202a of the set of active region patterns 202 is usable to manufacture source and drain regions of NMOS transistors of integrated circuits 300, 600, 800, 1000, 1200, 1400 or 1600.

In some embodiments, the set of active region patterns 202 is located on a first layout level. In some embodiments, the first layout level corresponds to an active level or an OD level of one or more of layout design 200 or integrated circuits 300, 600, 800, 1000, 1200, 1400 or 1600.

In some embodiments, active region pattern 202a is usable to manufacture source and drain regions of one or more p-type finFETs, p-type nanosheet transistors or p-type nanowire transistors, and active region layout pattern 202b is usable to manufacture source and drain regions of one or more n-type finFETs, n-type nanosheet transistors or n-type nanowire transistors.

In some embodiments, active region pattern 202a is usable to manufacture source and drain regions of one or more n-type finFETs, n-type nanosheet transistors or n-type nanowire transistors, and active region layout pattern 202b is usable to manufacture source and drain regions of one or more p-type finFETs, p-type nanosheet transistors or p-type nanowire transistors.

Other widths for the set of active region patterns 202 or other numbers of active region patterns in the set of active region patterns 202 are within the scope of the present disclosure.

Other configurations, arrangements on other layout levels or quantities of patterns in the set of active region patterns 202 are within the scope of the present disclosure.

Layout design 200 further includes one or more gate patterns 204a, 204b, 204c or 204d (collectively referred to as a "set of gate patterns 204") extending in the second direction Y. Each of the gate patterns of the set of gate patterns 204 is separated from an adjacent gate pattern of the set of gate patterns 204 in the first direction X by a pitch (not labelled).

The set of gate patterns 204 is usable to manufacture a corresponding set of gates 304 of integrated circuit 300, 600, 800, 1000, 1200, 1400 or 1600.

In some embodiments, gate patterns 204a, 204b, 204c, 204d of the set of gate patterns 204 is usable to manufacture corresponding gates 304a, 304b, 304c, 304d of the set of gates 304 of integrated circuit 300, 600, 800, 1000, 1200, 1400 or 1600.

In some embodiments, each of the gate patterns in the set of gate patterns 204 is shown in FIGS. 2A-2C with labels "P1-1 through P1-4 and N1-1 through N1-4" that identify corresponding transistors of FIGS. 1 and 3A-3F manufactured by the corresponding gate pattern in FIG. 2A, and are omitted for brevity.

In some embodiments, at least a portion of gate pattern 204a, 204b, 204c or 204d of the set of gate patterns 204 is usable to manufacture gates of NMOS transistors of integrated circuit 300, 600, 800, 1000, 1200, 1400 or 1600, and at least a portion of gate pattern 204a, 204b, 204c or 204d of the set of gate patterns 204 is usable to manufacture gates of PMOS transistors of integrated circuit 300, 600, 800, 1000, 1200, 1400 or 1600.

The set of gate patterns 204 is above the set of active region patterns 202. The set of gate patterns 204 is positioned on a second layout level different from the first layout level. In some embodiments, the second layout level is different from the first layout level. In some embodiments, the second layout level corresponds to the POLY level of one or more of layout design 200 or integrated circuit 300, 600, 800, 1000, 1200, 1400 or 1600. In some embodiments, the POLY level is above the OD level.

Other configurations, arrangements on other layout levels or quantities of patterns in the set of gate patterns 204 are within the scope of the present disclosure.

Layout design 200 further includes one or more gate patterns 205a or 205b (collectively referred to as a "set of dummy gate patterns 205") extending in the second direction Y.

The set of dummy gate patterns 205 is usable to manufacture a corresponding set of dummy gates 305 of integrated circuit 300, 600, 800, 1000, 1200, 1400 or 1600. In some embodiments, dummy gate patterns 205a, 205b are usable to manufacture corresponding dummy gates 305a, 305b of the set of dummy gates 305 of integrated circuit 300, 600, 800, 1000, 1200, 1400 or 1600. In some embodiments, a dummy gate is a gate of a non-functional transistor.

The set of dummy gate patterns 205 is positioned on the second layout level. Other configurations, arrangements on other layout levels or quantities of patterns in the set of dummy gate patterns 205 are within the scope of the present disclosure.

Layout design 200 further includes one or more contact patterns 206a, 206b, 206c, . . . , 206j (collectively referred to as a "set of contact patterns 206") extending in the second direction Y.

Each of the contact patterns of the set of contact patterns 206 is separated from an adjacent contact pattern of the set of contact patterns 206 in at least the first direction X or the second direction Y. Contact pattern 206c and 206h are separated from each other by a distance D1a.

The set of contact patterns 206 is usable to manufacture a corresponding set of contacts 306 of integrated circuit 300, 600, 800, 1000, 1200, 1400 or 1600. In some embodiments, contact pattern 206a, 206b, 206c, . . . , 206j of the set of contact patterns 206 is usable to manufacture corresponding contact 306a, 306b, 306c, . . . , 306j of the set of contacts 306. In some embodiments, the set of contact patterns 206 is also referred to as a set of metal over diffusion (MD) patterns.

In some embodiments, at least one of contact pattern 206a, 206b, 206c, . . . , 206j of the set of contact patterns 206 is usable to manufacture source or drain terminals of one of the NMOS or PMOS transistors of integrated circuit 100, 300, 600, 800, 1000, 1200, 1400 or 1600.

In some embodiments, the set of contact patterns 206 overlap the set of active region patterns 202. The set of contact patterns is located on a third layout level. In some embodiments, the third layout level corresponds to the contact level or an MD level of one or more of layout design 200 or integrated circuit 100, 300, 600, 800, 1000, 1200, 1400 or 1600. In some embodiments, the third layout level is the same as the second layout level. In some embodiments, the third layout level is different from the first layout level.

Other configurations, arrangements on other layout levels or quantities of patterns in the set of contact patterns 206 are within the scope of the present disclosure.

Layout design 200 further includes one or more conductive feature patterns 208a, 208b or 208c (collectively referred to as a "set of conductive feature patterns 208") extending in at least the second direction Y or the first direction X.

Each of conductive feature patterns 208a, 208b and 208c of the set of conductive feature patterns 208 are separated from each other in at least the second direction Y or the first direction X.

Conductive feature patterns 208c includes conductive feature patterns 208c1 and 208c2. While conductive feature patterns 208c is shown as discontinuous patterns, in some embodiments, portions of conductive feature pattern 208c are combined to form continuous patterns.

In some embodiments, conductive feature patterns 208a and 208b are referred to as a "set of power rail patterns 208." In some embodiments, conductive feature pattern 208a or 208b are referred to as corresponding power rail pattern 208a or 208b.

The set of conductive feature patterns 208 is usable to manufacture a corresponding set of conductors 308 of integrated circuit 300, 600, 800, 1000, 1200, 1400 or 1600. In some embodiments, conductors 308a and 308b are referred to as a "set of power rails 308." In some embodiments, conductive feature pattern 208a, 208b or 208c is usable to manufacture corresponding conductor 308a, 308b or 308c of the set of conductors 308 of integrated circuit 300, 600, 800, 1000, 1200, 1400 or 1600. In some embodiments, conductors 308a or 308b are referred to as corresponding power rails 308a or 308b. In some embodiments, the set of conductors 308 are located on the front-side (not labelled) of integrated circuit 300.

The set of conductive feature patterns 208 overlap the set of gate patterns 204 and the set of active region patterns 202. In some embodiments, the set of conductive feature patterns 208 is on a fourth layout level. In some embodiments, the fourth layout level is different from the first layout level, the second layout level and the third layout level. In some embodiments, the fourth layout level corresponds to the M0 level of one or more of layout design 200 or integrated circuit 300, 600, 800, 1000, 1200, 1400 or 1600. In some embodiments, the M0 level is above the OD level, the POLY level, the MD level, the VG level and the VD level.

Other configurations, arrangements on other layout levels or quantities of patterns in the set of conductive feature patterns 208 are within the scope of the present disclosure.

Layout design 200 further includes one or more conductive feature patterns 210a or 210b (collectively referred to as a "set of conductive feature patterns 210") extending in the first direction X, and being located on the fourth layout level.

The set of conductive feature patterns 210 is usable to manufacture a corresponding set of conductors 310 (FIGS. 3A-3F) of integrated circuit 200. Conductive feature patterns 210a, 210b are usable to manufacture corresponding conductors 310a, 310b.

Conductive feature patterns 210c includes conductive feature patterns 210c1, 210c2 and 210c3.

While conductive feature pattern 210a is shown as one continuous pattern, in some embodiments, conductive feature pattern 210a is divided into two or more discontinuous patterns.

While conductive feature patterns 210c are shown as discontinuous patterns, in some embodiments, portions of conductive feature pattern 210c are combined to form continuous patterns.

The set of conductive feature patterns 210 overlaps at least the set of gate patterns 204, the set of active region patterns 202 and the set of contact patterns 206. In some embodiments, the set of conductive feature patterns 210 overlaps other underlying patterns (not shown for ease of illustration) of other layout levels of layout design 200.

Each conductive feature pattern in the set of conductive feature patterns 208 is separated from an adjacent conductive feature pattern in the set of conductive feature patterns 208 in the second direction Y by a pitch P1a.

Each conductive feature pattern in the set of conductive feature patterns 210 is separated from an adjacent conductive feature pattern in the set of conductive feature patterns 210 in the second direction Y by a pitch P2a. In some embodiments, pitch Pa1 is equal to pitch P2a. In some embodiments, pitch Pa1 is different from pitch P2a.

As shown in FIG. 2B, in some embodiments, the set of conductive feature patterns 208 and 210 have a corresponding color A or B. The color A or B indicates that conductive feature patterns 208 with a same color are to be formed on a same mask of a multiple mask set, and conductive feature patterns 210 with a different color B are to be formed on a different mask of the multiple mask set. Two colors A and B are depicted in FIG. 2B as an example. In some embodiments, there are more or less than two colors in layout design 200.

Each conductive feature pattern in the set of conductive feature patterns 208 is separated from an adjacent conductive feature pattern in the set of conductive feature patterns 210 in the second direction Y by a distance D2a. In some embodiments, distance D2a is greater than or equal to width W2a/2 (described below). Other values for distance D2a are within the scope of the present disclosure.

In some embodiments, if distance D2a is not at least greater than or equal to width W2a/2, then conductive structures in the set of conductive feature patterns 208 are not sufficiently separated from conductive structures in the set of conductive feature patterns 210 in the second direction Y to ensure a consistent manufactured yield.

At least conductive feature pattern 208a, 208b or 208c has a width W1a in the second direction Y. In some embodiments, at least one of conductive feature pattern 208a, 208b or 208c has a width in the second direction Y that is different from a width of another of conductive feature pattern 208a, 208b or 208c.

At least conductive feature patterns 210a and 210b have a width W2a in the second direction Y.

In some embodiments, width W1a is greater than width W2a. In some embodiments, width W1a is at least 1.5 times greater than width W2a. In some embodiments, width W1a is greater than width W2a by a factor of 3. In some embodiments, if width W1a is not at least 1.5 times greater than width W2a in the second direction Y, then resistance in the set of conductive feature patterns 208 increases thereby affecting performance of the layout design 200.

In some embodiments, conductive feature pattern 208c is referred to as a thick M0 pattern as the width W1a in the second direction Y is greater than the width W2a of the set of conductive feature patterns 210 (referred to as a thin M0 pattern). In some embodiments, by increasing the width of conductive feature pattern 208c, conductive feature pattern 208c overlaps more regions of the underlying set of contact patterns 206, thereby increasing via pattern landing spots between conductive feature pattern 208c and the set of contact pattern 206, thus increasing routing resources in at least the M0 layer. In some embodiments, by increasing routing resources in at least the M0 layer, routing resources in upper metal layers (e.g., M1 or the like) are increased thereby reducing cell area of layout design 200 compared to other approaches.

In some embodiments, widths of corresponding conductive feature patterns 208a, 210a, 208c, 210b, 208b alternate with each other in thickness in the second direction Y. For example, as shown in FIG. 2B, conductive feature pattern 210a is positioned between conductive feature patterns 208a and 208c, and the width W1a of conductive feature pattern 208a alternates between thick (e.g., width W1a) and thin (e.g., W2a) in the second direction Y. For example, as shown in FIG. 2B, widths of corresponding conductive feature patterns 208a, 208c and 208b have a thick width (e.g., width W1a) that alternates with widths of corresponding conductive feature patterns 210a and 210b have a thin width (e.g., width W2a).

In some embodiments, by utilizing conductive feature pattern 208c to have width W1a equal to the width of conductive feature patterns 208a and 208b, the pitch P1a and the pitch P2a are equal to each other, and thus the set of conductive feature patterns 208 and 210 are uniform in the second direction Y, thereby resulting in a layout design 200 that is more consistent or regular than other approaches.

Other widths for the set of conductive feature patterns 208 and 210 are within the scope of the present disclosure.

In some embodiments, conductive feature patterns 210a, 208c, 210c correspond to 3 M0 routing tracks in layout design 200. Other numbers of M0 routing tracks are within the scope of the present disclosure.

Other configurations, arrangements on other layout levels or quantities of patterns in the set of conductive feature patterns 208 or 210 are within the scope of the present disclosure.

Layout design 200 further includes a set of gridlines 214. The set of gridlines 214 extends in the first direction X. The set of gridlines 214 includes at least gridline 214a, gridline 214b, gridline 214c, gridline 214d or gridline 214e. Each gridline of the set of gridlines 214 is separated from an adjacent gridline of the set of gridlines 214 in the second direction Y by a pitch (e.g., P1a/2 or P2a/2).

In some embodiments, each gridline 214a, 214b, 214c, 214d, 214e of the set of gridlines 214 defines regions where corresponding conductive feature patterns 208a, 210a, 208c, 210b, 208b are positioned. In some embodiments, gridline 214a or 214e is aligned with corresponding cell boundary 201a or 201b. In some embodiments, the set of gridlines 214 are also referred to as a set of M0 routing tracks.

Layout design 200 further includes one or more via patterns 220a, 220b, . . . 220e (collectively referred to as a "set of via patterns 220") or one or more via patterns 222a, 222b, 222c (collectively referred to as a "set of via patterns 222").

The set of via patterns 220 is usable to manufacture a corresponding set of vias 320 of integrated circuit 300, 600, 800, 1000, 1200, 1400 or 1600. The set of via patterns 222 is usable to manufacture a corresponding set of vias 322 of integrated circuit 300, 600, 800, 1000, 1200, 1400 or 1600.

In some embodiments, via patterns 220a, 220b, . . . 220e of the set of via patterns 220 are usable to manufacture corresponding vias 320a, 320b, . . . 320e of the set of vias 320 of integrated circuit 300, 600, 800, 1000, 1200, 1400 or 1600.

In some embodiments, via patterns 222a, 222b, 222c of the set of via patterns 222 are usable to manufacture corresponding vias 322a, 322b, 322c of the set of vias 322 of integrated circuit 300, 600, 800, 1000, 1200, 1400 or 1600.

The set of via patterns 220 or 222 is positioned at a via over diffusion (VD) level of one or more of layout design 200 or integrated circuit 300, 600, 800, 1000, 1200, 1400 or 1600. In some embodiments, the VD level is above the MD and the OD level. In some embodiments, the VD level is between the MD level and the M0 level. In some embodiments, the VD level is between the third layout level and the fourth layout level. Other layout levels are within the scope of the present disclosure.

In some embodiments, the set of via patterns 220 is between the set of contact patterns 206 and the set of conductive feature patterns 208. In some embodiments, the set of via patterns 222 is between the set of contact patterns 206 and the set of conductive feature patterns 210.

As shown in FIG. 2A, in some embodiments, the set of via patterns 220 and 222 have the corresponding color VD2 or VD1. The color VD2 indicates that via patterns in the set of via patterns 220 with a same color are to be formed on a same mask of a multiple mask set, and via patterns in the set of via patterns 222 with a different color VD1 are to be formed on a different mask of the multiple mask set. Two colors VD1 and VD2 are depicted in FIG. 2B as an example. In some embodiments, there are more or less than two colors for coloring via patterns in layout design 200.

In some embodiments, each of the via patterns on the VD level in layout design 200 that are below conductive feature pattern 208c (e.g., thick M0) are part of the set of via patterns 220 and have color VD2. For example, via patterns 220b and 220d are below conductive feature pattern 208c (e.g., thick M0), and are therefore part of the set of via patterns 220 and have color VD2.

In some embodiments, each of the via patterns on the VD level in layout design 200 that are below conductive feature pattern 210a or 210b (e.g., thin M0) are part of the set of via patterns 222 that have color VD1.

In some embodiments, the set of via patterns 220 and 222 are formed using different masks to ensure that consistent manufacturing yield is achieved as the distance or spacing separating one or more via patterns in the set of via patterns 220 and adjacent via patterns in the set of via patterns 222 may violate design rules. In some embodiments, adjacent elements includes elements that are directly next to each other. For example, as shown in FIG. 2A, via pattern 222b and via pattern 220d are located below adjacent M0 tracks, and are separated by distance D3a. In some embodiments, the distance D3a does not satisfy minimum spacing design rules, therefore via patterns 222b and 220d are formed using different masks. In some embodiments, using via patterns 220b and 220d does not result in an increase in the number of masks as via patterns in the set of via patterns 220 below power rail patterns are formed using a mask different from the mask to form the set of via patterns 220. Therefore, by utilizing the features of the present disclosure, the number of VD masks to form integrated circuit 300, 600, 800, 1000, 1200, 1400 or 1600 is not increased even though additional routing resources are achieved compared with other approaches.

In some embodiments, the size of one or more via patterns in the set of vias patterns 220 can be increased thereby reducing resistance compared to other approaches.

Other configurations, arrangements on other layout levels or quantities of patterns in at least set of via patterns 220 or 222 are within the scope of the present disclosure.

Layout design 200 further includes one or more via patterns 230a, 230b, . . . 230d (collectively referred to as a "set of via patterns 230").

The set of via patterns 230 is usable to manufacture a corresponding set of vias 330 of integrated circuit 300, 600, 800, 1000, 1200, 1400 or 1600.

In some embodiments, via patterns 230a, 230b, . . . 230d of the set of via patterns 230 are usable to manufacture corresponding vias 330a, 330b, . . . 330d of the set of vias 330 of integrated circuit 300, 600, 800, 1000, 1200, 1400 or 1600.

In some embodiments, the set of via patterns 230 are between the set of gate patterns 204 and the set of conductive feature patterns 208 or 210.

The set of via patterns 230 is positioned at a via over gate (VG) level of one or more of layout design 200 or integrated circuit 300, 600, 800, 1000, 1200, 1400 or 1600. In some embodiments, the VG level is above the OD level, the MD level and the POLY level. In some embodiments, the VG level is between the POLY level and the M0 level. In some embodiments, the VG level is between the second layout level and the fourth layout level. Other layout levels are within the scope of the present disclosure.

Other configurations, arrangements on other layout levels or quantities of patterns in at least set of via patterns 230 are within the scope of the present disclosure.

Layout design 200 further includes one or more conductive feature patterns 240a, 240b, . . . 240e (collectively referred to as a "set of conductive feature patterns 240") extending in the second direction Y.

The set of conductive feature patterns 240 is usable to manufacture a corresponding set of conductors 340 of integrated circuit 300, 600, 800, 1000, 1200, 1400 or 1600. Conductive feature patterns 240a, 240b, . . . 240e are usable to manufacture corresponding conductors 340a, 340b, . . . 340e of integrated circuit 300, 600, 800, 1000, 1200, 1400 or 1600.

In some embodiments, the set of conductive feature patterns 240 overlap the set of conductive feature patterns 208 and 210. In some embodiments, the set of conductive feature patterns 240 are located on a fifth layout level. In some embodiments, the fifth layout level is different from the first layout level, the second layout level, the third layout level and the fourth layout level. In some embodiments, the fifth layout level corresponds to the M1 level of one or more of layout design 200 or integrated circuit 300, 600, 800, 1000, 1200, 1400 or 1600. In some embodiments, the M1 level is above the M0 level, the OD level, the MD level and the POLY level.

Other configurations, arrangements on other layout levels or quantities of patterns in the set of conductive feature patterns 240 are within the scope of the present disclosure.

Layout design 200 further includes one or more via patterns of set of via patterns (not shown in FIG. 2A) that is on the via over M0 (V0) level of one or more of layout design 200 or integrated circuit 300, 600, 800, 1000, 1200, 1400 or 1600. In some embodiments, the V0 level is above the OD level, the MD level, the POLY level and the M0 level. In some embodiments, the V0 level is below the M1 level. In some embodiments, the V0 level is between the fourth layout level and the fifth layout level. Other layout levels are within the scope of the present disclosure.

The set of via patterns that is on the V0 level is usable to manufacture a corresponding set of vias 410, 412, 430, 432, 440 or 1630 of integrated circuit 400A-400C or 1600.

Other configurations, arrangements on other layout levels or quantities of patterns in at least set of via patterns that is on the V0 level are within the scope of the present disclosure.

FIGS. 3A-3F are diagrams of an integrated circuit 300, in accordance with some embodiments.

Figure 3B:
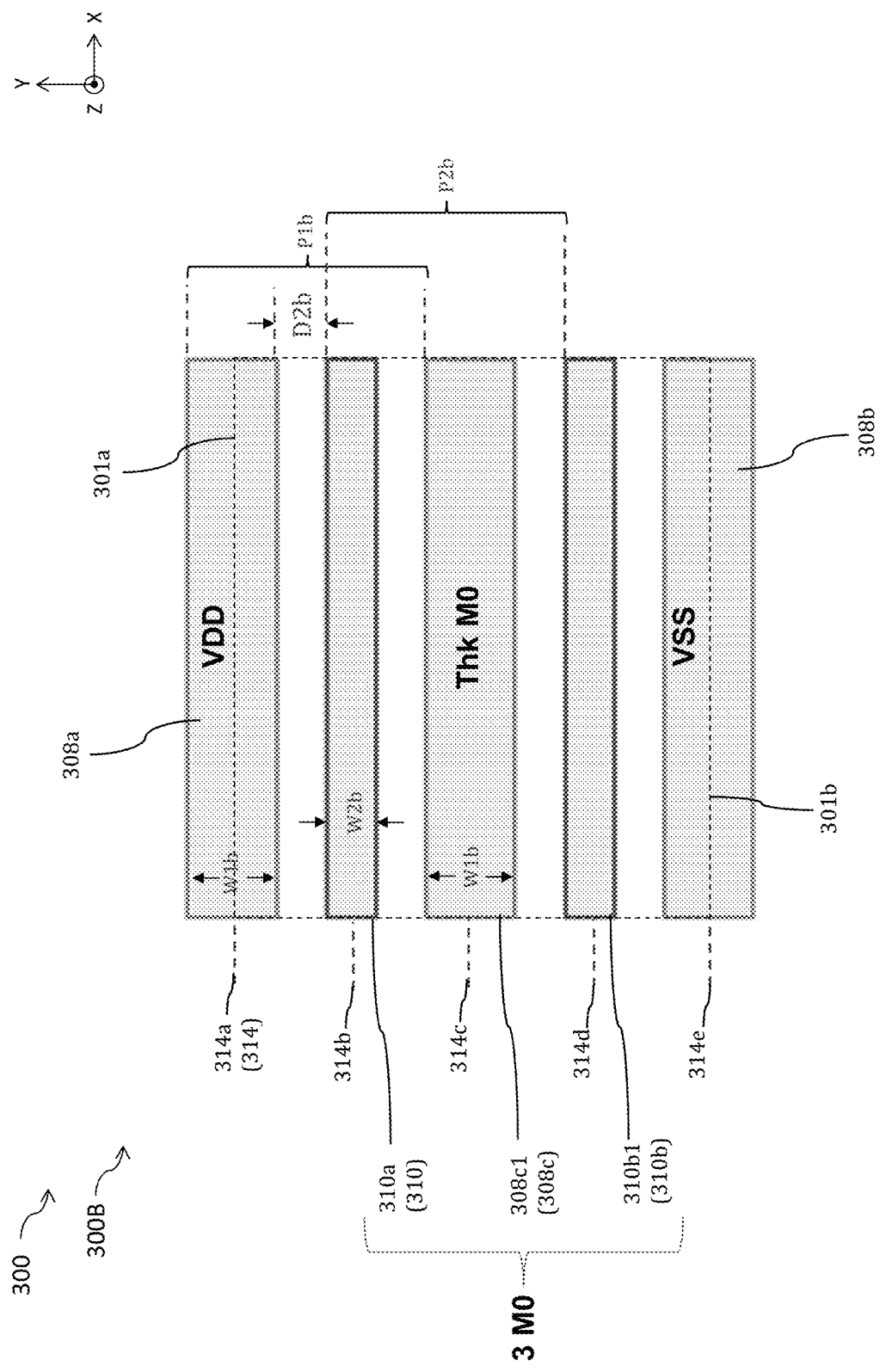
Figure 3C:
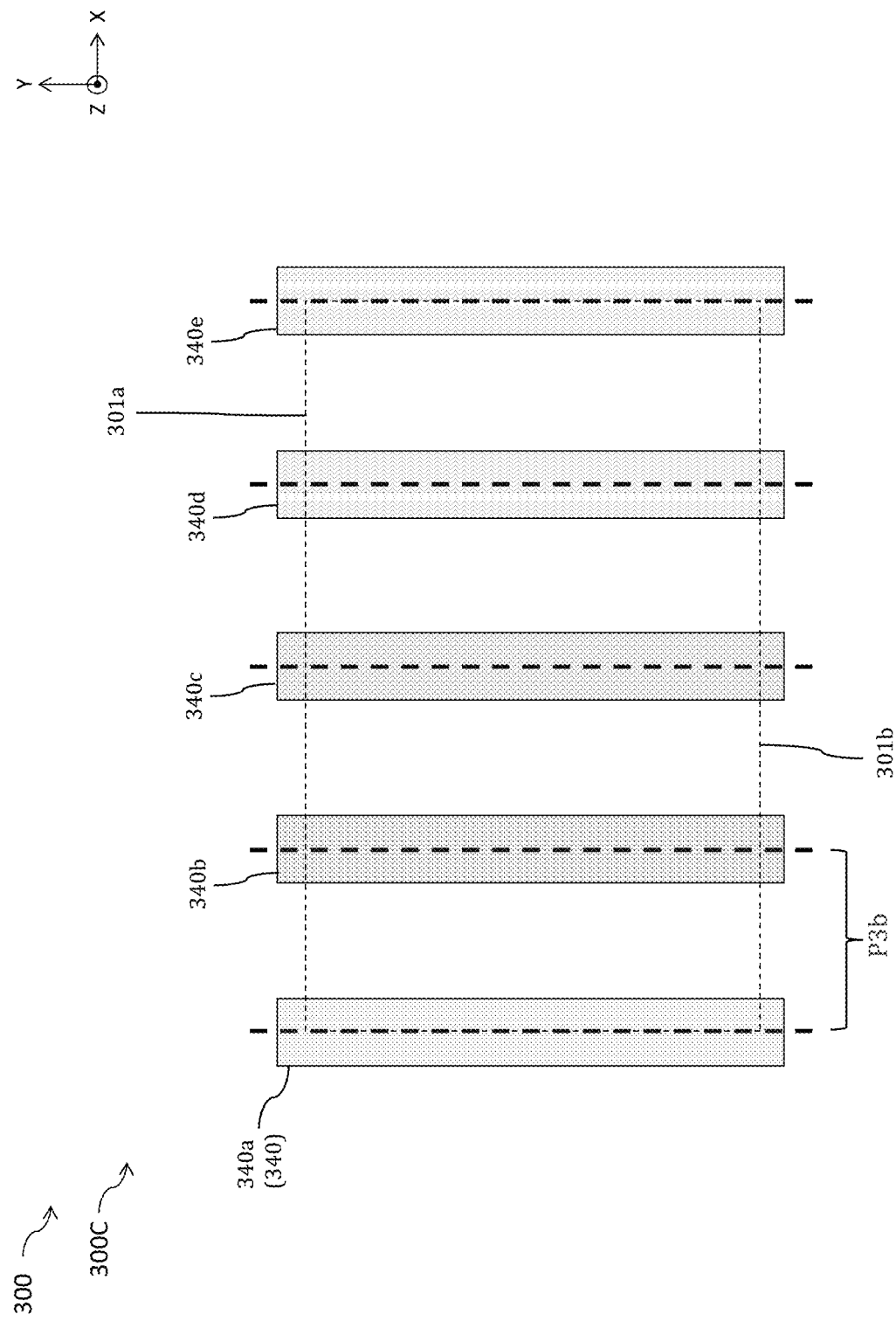

FIG. 3A is a diagram of a corresponding portion 300A of integrated circuit 300, simplified for ease of illustration. FIG. 3B is a diagram of a corresponding portion 300B of integrated circuit 300, simplified for ease of illustration. FIG. 3C is a diagram of a corresponding portion 300C of integrated circuit 300, simplified for ease of illustration.

Figure 3F:
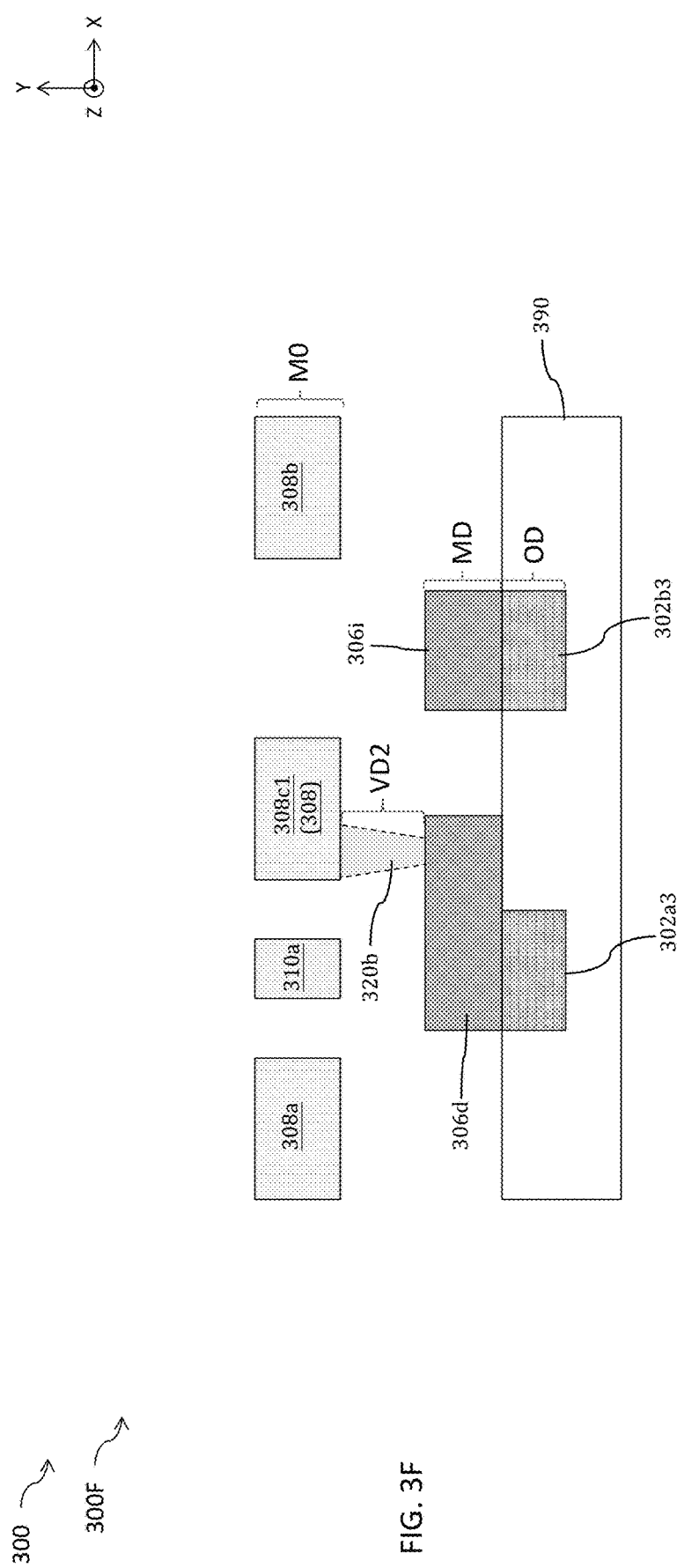

FIGS. 3D-3F are corresponding cross-sectional views of integrated circuit 300, in accordance with some embodiments. FIG. 3D is a cross-sectional view of integrated circuit 300 as intersected by plane A-A', in accordance with some embodiments. FIG. 3E is a cross-sectional view of integrated circuit 300 as intersected by plane B-B', in accordance with some embodiments. FIG. 3F is a cross-sectional view of integrated circuit 300 as intersected by plane C-C', in accordance with some embodiments.

Components that are the same or similar to those in one or more of FIGS. 1, 2A-2C, 3A-3F, 4A-4C and 5-16 (shown below) are given the same reference numbers, and detailed description thereof is thus omitted.

Integrated circuit 300 is an embodiment of integrated circuit 100 of FIG. 1. Integrated circuit 300 is manufactured by layout design 200. Structural relationships including alignment, distances, lengths and widths, as well as configurations and layers of integrated circuit 300 are similar to the structural relationships and configurations and layers of layout design 200 of FIGS. 2A-2C, and similar detailed description will not be described in at least FIGS. 3A-3F, for brevity.

For example, in some embodiments, at least width W1a, W2a or distance D1a, D2a, D3a or pitch P1a, P2a of layout design 200 is similar to corresponding width W1b, W2b or corresponding distance D1b, D2b, D3b or corresponding pitch P1b, P2b of integrated circuit 300, and similar detailed description is omitted for brevity. For example, in some embodiments, at least one or more widths, lengths or pitches of layout design 200 is similar to corresponding widths, lengths or pitches of integrated circuit 300, and similar detailed description is omitted for brevity. For example, in some embodiments, at least cell boundary 201a or 201b of layout design 200 is similar to at least corresponding cell boundary 301a or 301b of integrated circuit 300, and similar detailed description is omitted for brevity.

Integrated circuit 300 includes at least the set of active regions 302, the set of gates 304, an insulating region 303, the set of dummy gates 305, the set of contacts 306, set of conductors 308, set of conductors 310, set of vias 320, set of vias 322, set of vias 330 or set of conductors 340.

The set of active regions 302 includes one or more of active regions 302a or 302b embedded in a substrate 390.

Substrate has a front-side and a back-side (not labelled) opposite from the front-side. In some embodiments, at least the set of active regions 302, the set of gates 304, the set of contacts 306, the set of conductors 308 or the set of conductors 310 are formed in the front-side of substrate 290.

In some embodiments, the set of active regions 302 corresponds to nanosheet structures (not labelled) of nanosheet transistors. In some embodiments, the set of active regions 302 include drain regions and source regions grown by an epitaxial growth process. In some embodiments, the set of active regions 302 include drain regions and source regions that are grown with an epitaxial material at the corresponding drain regions and source regions.

Other transistor types are within the scope of the present disclosure. For example, in some embodiments, the set of active regions 302 corresponds to nanowire structures (not shown) of nanowire transistors. In some embodiments, the set of active regions 302 corresponds to planar structures (not shown) of planar transistors. In some embodiments, the set of active regions 302 corresponds to fin structures (not shown) of finFETs. In some embodiments, the set of active regions 302 corresponds to structures (not shown) of complementary FETs (CFETs).

In some embodiments, active region 302a corresponds to source and drain regions of PMOS transistors of integrated circuit 300, 600, 800, 1000, 1200, 1400 or 1600, and active region 302b corresponds to source and drain regions of NMOS transistors of integrated circuit 300, 600, 800, 1000, 1200, 1400 or 1600.

In some embodiments, active region 302a corresponds to source and drain regions of NMOS transistors of integrated circuit 300, 600, 800, 1000, 1200, 1400 or 1600, and active region 302b corresponds to source and drain regions of PMOS transistors of integrated circuit 300, 600, 800, 1000, 1200, 1400 or 1600.

In some embodiments, at least active region 302a is a P-type doped S/D region, and active region 302b is an N-type doped S/D region embedded in a dielectric material of substrate 290. In some embodiments, at least active region 302a is an N-type doped S/D region, and active region 302b is a P-type doped S/D region embedded in a dielectric material of substrate 290.

Active region 302a corresponds to source and drain regions of PMOS transistors P1-1 through P1-4 of FIG. 1, and active region 302b corresponds to source and drain regions of NMOS transistors N1-1 through N1-4 of FIG. 1.

Other configurations, arrangements on other layout levels or quantities of structures in the set of active regions 302 are within the scope of the present disclosure.

The set of gates 304 include one or more of gates 304a, 304b, 304c or 304d. In some embodiments, at least a portion of gate 304a, 304b, 304c or 304d is a gate of NMOS transistors of integrated circuits 300, 600, 800, 1000, 1200, 1400 or 1600, and at least a portion of gate 304a, 304b, 304c or 304d is a gate of PMOS transistors of integrated circuits 300, 600, 800, 1000, 1200, 1400 or Gate 304a corresponds to the gates of PMOS transistor P1-1 and NMOS transistor N1-1.

Gate 304b corresponds to the gates of PMOS transistor P1-2 and NMOS transistor N1-2.

Gate 304c corresponds to the gates of PMOS transistor P1-3 and NMOS transistor N1-3.

Gate 304d corresponds to the gates of PMOS transistor P1-4 and NMOS transistor N1-4.

The set of gates 305 include one or more of gates 305a or 305b. In some embodiments, at least gate 305a or 305b corresponds to a dummy gate. In some embodiments, a dummy gate is a gate of a non-functional transistor. In some embodiments, at least gate 305a or 305b corresponds to a continuous poly on OD edge (CPODE) region or a poly on OD edge (PODE) region.

Other configurations, arrangements on other layout levels or quantities of gates in the set of gates 304 or 305 are within the scope of the present disclosure.

Insulating region 303 is configured to electrically isolate one or more elements of the set of active regions 302, the set of gates 304, the set of dummy gates 305, the set of contacts 306, set of conductors 308, set of conductors 310, set of vias 320, set of vias 322, set of vias 330 or set of conductors 340 from one another.

Figure 17:
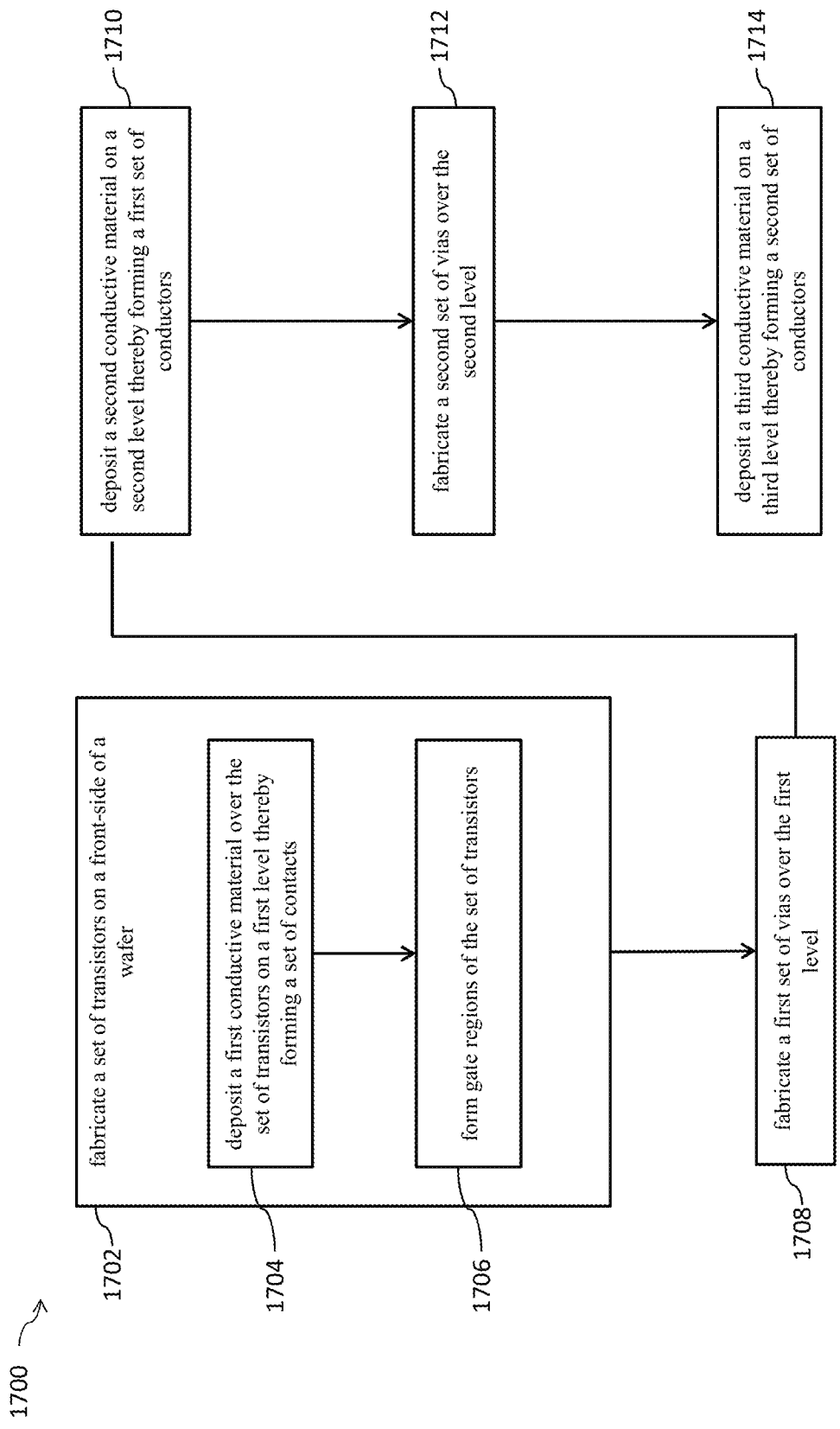
FIG. 17 is a flow chart of a method of forming or manufacturing an integrated circuit in accordance with some embodiments.

In some embodiments, insulating region 303 includes multiple insulating regions deposited at different times from each other during method 1700 (FIG. 17). In some embodiments, insulating region is a dielectric material. In some embodiments, the dielectric material includes silicon dioxide, silicon oxy-nitride, or the like.

Other configurations, arrangements on other layout levels or other numbers of portions in insulating region 303 are within the scope of the present disclosure.

The set of contacts include at least contact 306a, . . . , 306i or 306j.

Each contact of the set of contacts 306 corresponds to one or more drain or source terminals of transistors P1-1 through P1-4 or N1-1 through N1-4 of integrated circuit 100.

In some embodiments, one or more contacts of the set of contacts 306 overlaps a pair of active regions of the set of active regions 302, thereby electrically coupling the pair of active regions of the set of active regions 302 and the source or drain of the corresponding transistors.

Contact 306a corresponds to the drain terminal of PMOS transistor P1-1.

Contact 306b corresponds to the source terminals of PMOS transistors P1-1 and P1-2, and electrically couples the source of PMOS transistors P1-1 and P1-2 together.

Contact 306c corresponds to the drain terminal of PMOS transistor P1-2 and the source terminal of PMOS transistor P1-3, and electrically couples the drain of PMOS transistor P1-2 and the source of PMOS transistor P1-3 together.

Contact 306d corresponds to the drain terminals of PMOS transistors P1-3 and P1-4, and electrically couples the drains of PMOS transistors P1-3 and P1-4 together.

Contact 306e corresponds to the source terminal of PMOS transistor P1-4.

Contact 306f corresponds to the source terminal of NMOS transistor N1-1.

Contact 306g corresponds to the drain terminal of NMOS transistor N1-1 and the source terminal of NMOS transistor N1-2, and electrically couples the drain of NMOS transistor N1-1 and the source of NMOS transistor N1-2 together.

Contact 306h corresponds to the drain terminals of NMOS transistors N1-2 and N1-3, and electrically couples the drains of NMOS transistors N1-2 and N1-3 together.

Contact 306i corresponds to the drain terminal of NMOS transistor N1-4 and the source terminal of NMOS transistor N1-3, and electrically couples the drain of NMOS transistor N1-4 and the source of NMOS transistor N1-3 together.

Contact 306j corresponds to the source terminal of NMOS transistor N1-4.

Other lengths or widths for the set of contacts 306 are within the scope of the present disclosure. Other configurations, arrangements on other layout levels or quantities of contacts in the set of contacts 306 are within the scope of the present disclosure.

The set of conductors 308 include one or more of conductor 308a, 308b or 308c.

Conductor 308c includes conductors 308c1 and 308c2.

The set of conductors 310 include one or more of conductor 310a or 310b.

Conductor 310b includes conductors 310b1, 310b2 and 310b3.

Other lengths or widths for the set of conductors 308 or 310 are within the scope of the present disclosure. Other configurations, arrangements on other layout levels or quantities of conductors in the set of conductors 308 or 310 are within the scope of the present disclosure.

The set of vias 320 include one or more of vias 320a, 320b, 320c, 320d or 320e. In some embodiments, the set of vias 320 are between the set of contacts 306 and the set of conductors 308. The set of vias 320 is embedded in insulating region 303. The set of vias 320 is located where the set of contacts 306 are overlapped by the set of conductors 308.

In some embodiments, the set of vias 320 are configured to electrically couple a corresponding contact of the set of contacts 306 to the set of conductors 308.

The set of vias 322 include one or more of vias 322a, 322b or 322c. In some embodiments, the set of vias 322 are between the set of contacts 306 and the set of conductors 310. The set of vias 322 is embedded in insulating region 303. The set of vias 322 is located where the set of contacts 306 are overlapped by the set of conductors 310.

In some embodiments, the set of vias 322 are configured to electrically couple a corresponding contact of the set of contacts 306 to the set of conductors 310.

The set of vias 330 include one or more of vias 330a, 330b, 330c or 330d. In some embodiments, the set of vias 330 are between the set of gates 304 and the set of conductors 308 or 310. The set of vias 330 is embedded in insulating region 303. The set of vias 330 is located where the set of gates 304 are overlapped by the set of conductors 308 or 310.

In some embodiments, the set of vias 330 are configured to electrically couple a corresponding gate of the set of gates 304 to the set of conductors 308 or 310.

In some embodiments, one or more vias of set of vias 320, 322 or 330 have a square shape, a rectangular shape, a circular shape or a polygonal shape. Other lengths, widths and shapes for one or more vias of set of vias 320, 322 or 330 are in the scope of the present disclosure.

Other configurations, arrangements on other layout levels or quantities of vias in the set of vias 320, 322 or 330 are within the scope of the present disclosure.

The set of conductors 340 includes one or more of conductors 340a, 340b, 340c, 340d or 340e. The set of conductors 340 overlap at least one gate of the set of gates 304 or 305.

Other configurations, arrangements on other layout levels or quantities of conductive features in the set of conductors 340 are within the scope of the present disclosure.

In some embodiments, at least one gate region of the set of gates 304 or 305 is formed using a doped or non-doped polycrystalline silicon (or polysilicon). In some embodiments, at least one gate region of the set of gates 304 or 305 include a metal, such as Al, Cu, W, Ti, Ta, TiN, TaN, NiSi, CoSi, other suitable conductive materials, or combinations thereof.

In some embodiments, at least one contact of the set of contacts 306, at least one conductor of the set of conductors 308 or 310, at least one conductor of the set of conductors 340, at least one via of the set of vias 320, at least one via of the set of vias 322, at least one via of the set of vias 330, or at least one via in the V0 layer (shown in FIGS. 4A-4C and 16) includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Conductors 308a and 308b (also referred to as "power rails") are configured to provide power to the set of active regions 302 from the front-side of integrated circuit 300.

In some embodiments, conductor 308a is configured to supply a first supply voltage of a voltage supply VDD, and conductor 308b is configured to supply a second supply voltage of a reference voltage supply VSS to integrated circuit 300. In some embodiments, the first supply voltage is different from the second supply voltage.

In some embodiments, conductor 308a is configured to supply the second supply voltage of reference voltage supply VSS, and conductor 308b is configured to supply the first supply voltage of a voltage supply VDD to integrated circuit 300.

Via 330a, 330b, 330c, 330d is between corresponding conductor 308c2, 310b3, 310b2, 310b1 and corresponding gate 304a, 304b, 304c, 304d. Via 330a, 330b, 330c, 330d is configured to electrically couple corresponding conductor 308c2, 310b3, 310b2, 310b1 and corresponding gate 304a, 304b, 304c, 304d together.

Via 320a is between and configured to electrically couple conductor 308a and contact 306b together.

Vias 320c, 320e are between and configured to electrically couple conductor 308b and corresponding contacts 306f, 306j together.

Vias 320b, 320d are between conductor 308c1 and corresponding contacts 306d, 306h. Vias 320b, 320d are configured to electrically couple conductor 308c1 and corresponding contacts 306d, 306h together. Stated differently, conductor 308c1 is electrically coupled to contacts 306d and 306h by corresponding vias 320b, 320d. Thus, conductor 308c1 electrically couples the drain regions 302a3 of PMOS transistors P1-3 and P1-4 to the source regions 302b2 of NMOS transistors N1-3 and N1-2 by corresponding contacts 306d and 306h and corresponding vias 320b and 320d, thereby forming an output node (e.g., labelled as ZN in FIGS. 1 & 3A) of integrated circuit 100 or 300. Therefore, even though contacts 306d and 306h are not aligned in the second direction Y, by increasing the width W1b of conductor 308c1 results in conductor 308c1 overlapping contacts 306d and 306h, thereby causing more via landing spots between conductor 308c1 and contacts 306d and 306h. In some embodiments, by having more via landing spots between conductor 308c1 and contacts 306d and 306h, vias 320b and 320d are positioned between conductor 308c1 and corresponding contacts 306d and 306h, thereby resulting in an electrical connection between conductor 308c1 and corresponding contacts 306d and 306h. In some embodiments, by having an electrical connection between conductor 308c1 and contacts 306d and 306h, other M0 resources and M1 resources on the front-side of integrated circuit 300 are freed up resulting in more routing flexibility and additional routing resources compared to other approaches.

In some embodiments, at least conductor 308c1 or 308c2 is configured to couple other regions of integrated circuit 100. For example, in some embodiments, at least conductor 308c1 or 308c2 is configured to couple the one or more gates of the set of gates 308 with one or more contacts in the set of contacts 306 of integrated circuit 100. For example, in some embodiments, if one or more gates of an NMOS transistor and a PMOS transistor in the set of gates 304a are not aligned with each other in the second direction Y, then at least conductor 308c1 or 308c2 is configured to couple the unaligned gates of the NMOS transistor and the PMOS transistor of integrated circuit 100.

Vias 322a, 322b, 322c are between conductor 310a and corresponding contacts 306a, 306c, 306e. Vias 322a, 322b, 322c are configured to electrically couple conductor 310a and corresponding contacts 306a, 306c, 306e together. Stated differently, conductor 310a is electrically coupled to contacts 306a, 306c, 306e by corresponding vias 322a, 322b, 322c. Thus, conductor 310a electrically couples the source region of PMOS transistor P1-4, the drain region of PMOS transistor P1-1, and the source region of PMOS transistor P1-3 and the drain region of PMOS transistor P1-2 together.

In some embodiments, conductor 308c is referred to as a thick M0 as the width W1b in the second direction Y is greater than the width W2b of the set of conductors 310 (referred to as a thin M0). In some embodiments, by increasing the width W1b of conductor 308c, conductor 308c overlaps more underlying regions in the set of contacts 306, thereby increasing via landing spots between conductor 308c and the set of contacts 306, thus increasing routing resources in at least the M0 layer. In some embodiments, by increasing routing resources in at least the M0 layer, routing resources in upper metal layers (e.g., M1 or the like) are increased thereby reducing cell area of integrated circuit 300 compared to other approaches.

Other configurations, arrangements on other layout levels or quantities of elements in integrated circuit 300 are within the scope of the present disclosure.

Figure 4A:
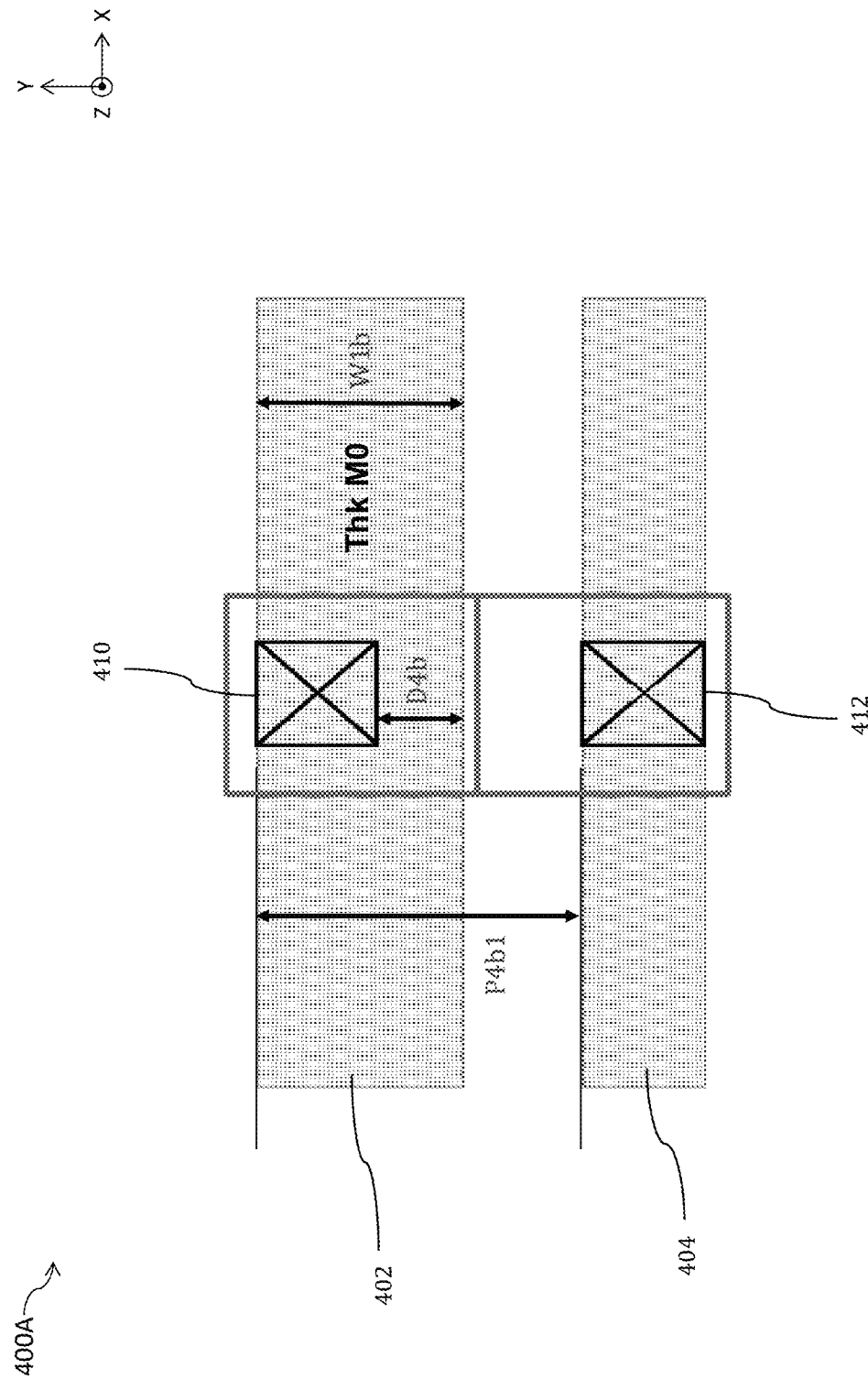
FIGS. 4A-4C are diagrams of corresponding integrated circuits, in accordance with some embodiments.
Figure 4B:
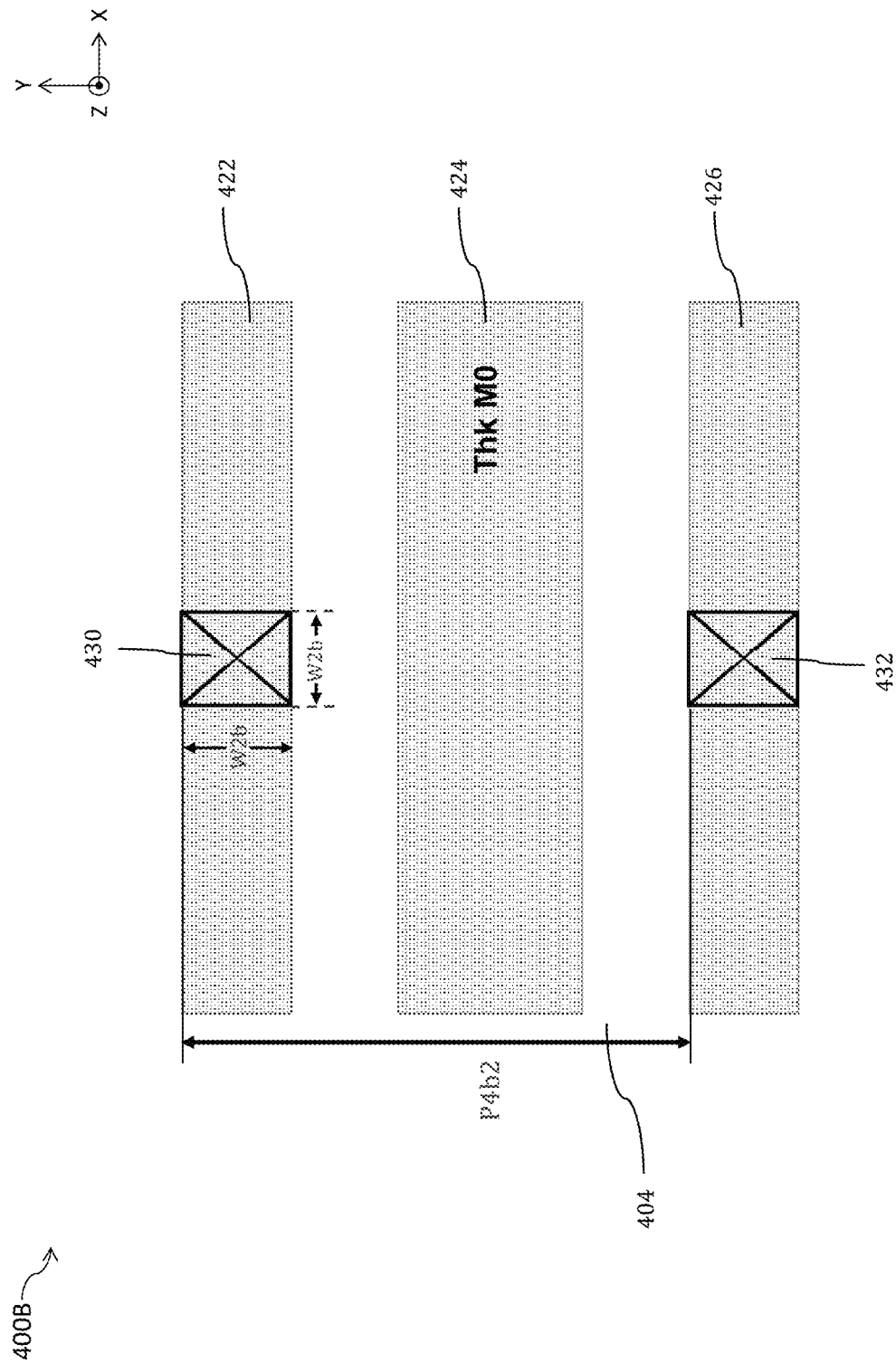
Figure 4C:
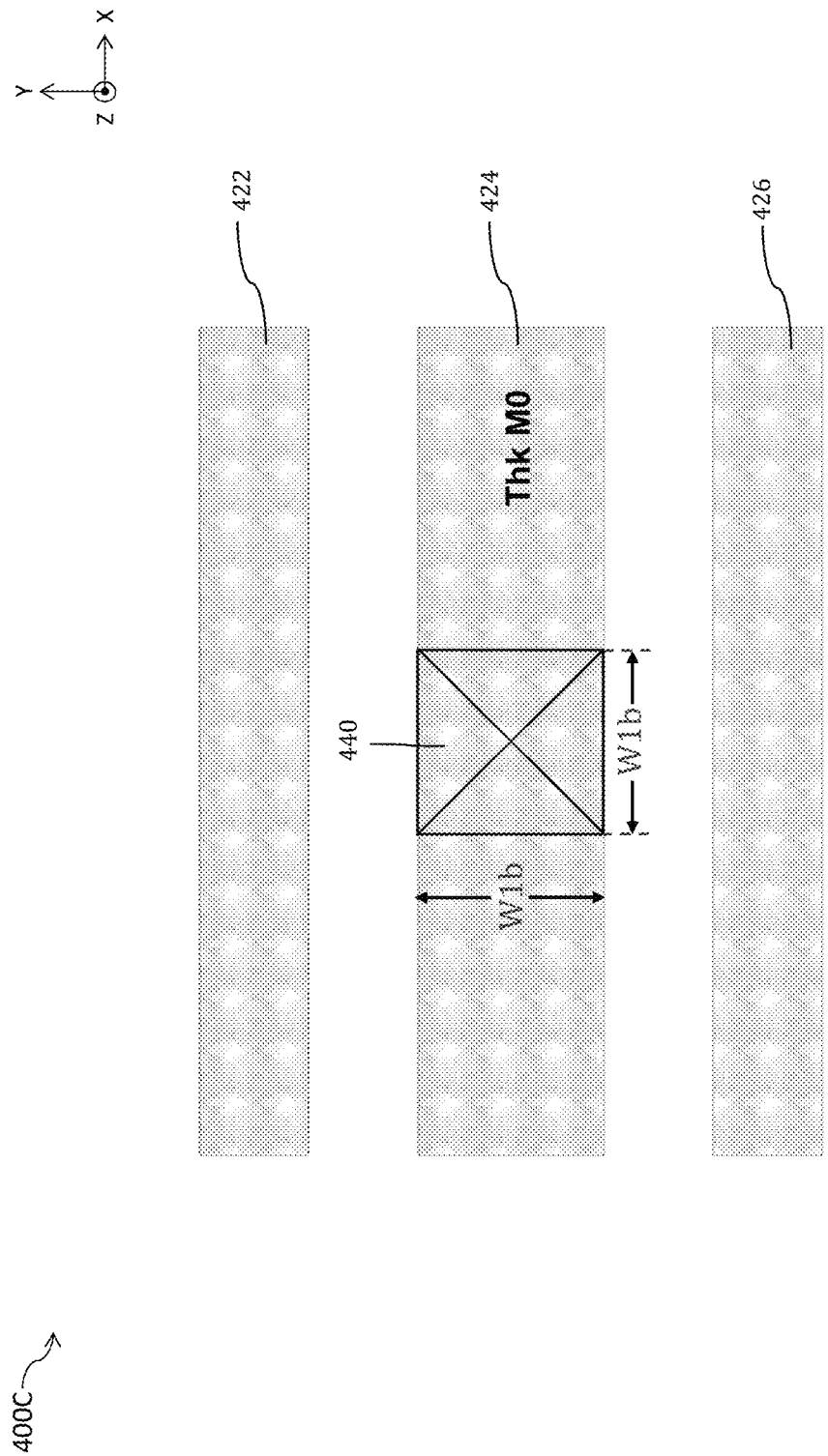

FIGS. 4A-4C are diagrams of corresponding integrated circuits 400A-400C, in accordance with some embodiments.

FIG. 4A is a diagram of integrated circuit 400A, simplified for ease of illustration.

Integrated circuit 400A includes portions of the M0 layer of integrated circuit 300 of FIGS. 3A-3E. For example, integrated circuit 400A includes conductors 402 and 404 that are similar to corresponding conductors 308c1 and 310b in FIG. 3A, and similar detailed description is therefore omitted.

Integrated circuit 400A includes conductors 402 and 404 and vias 410 and 412.

Vias 410 and 412 are on corresponding conductors 402 and 404. Vias 410 and 412 are on the V0 level of integrated circuit 400A-400C or 1600. While vias on the V0 layer are not shown in FIG. 3A-3E, 6, 8, 10, 12 or 14, it is understood that integrated circuit 300, 600, 800, 1000, 1200 or 1400 of FIG. 3A-3E, 6, 8, 10, 12 or 14 further includes one or more vias on the V0 layer.

Vias 410 and 412 are separated from each other by a V0 pitch P4b1. Via 410 is separated from an edge of conductor 402 by a distance D4b. In some embodiments, by increasing the width W1b of conductor 402, the pitch P4b1 of V0s is increased compared with other approaches thereby increasing the distance between vias 410 and 412, thereby allowing vias 410 and 412 to be formed with a single mask without violating one or more design rules, thus decreasing mask usage compared with other approaches.

FIG. 4B is a diagram of integrated circuit 400B, simplified for ease of illustration.

Integrated circuit 400B includes portions of the M0 layer of integrated circuit 300 of FIGS. 3A-3E. For example, integrated circuit 400B includes conductors 422, 424 and 426 that are similar to corresponding conductors 310a, 308c1 and 310b in FIG. 3A, and similar detailed description is therefore omitted.

Integrated circuit 400B includes conductors 422, 424 and 426 and vias 430 and 432.

Vias 430 and 432 are similar to vias 410 and 412, and similar detailed description is therefore omitted.

Vias 430 and 432 are on corresponding conductors 422 and 426. Vias 430 and 432 are separated from each other by a V0 pitch P4b2. In some embodiments, by increasing the width W1b of conductor 424, the pitch P4b2 of V0s is increased compared with other approaches thereby increasing the distance between vias 430 and 432, thereby allowing vias 430 and 432 to be formed with a single mask without violating one or more design rules, thus decreasing mask usage compared with other approaches.

FIG. 4C is a diagram of integrated circuit 400C, simplified for ease of illustration.

Integrated circuit 400C includes portions of the M0 layer of integrated circuit 300 of FIGS. 3A-3E. Integrated circuit 400C is a variation of integrated circuit 400B, and similar detailed description is therefore omitted. In comparison with integrated circuit 400B, via 440 replaces vias 430 and 432, and similar detailed description is therefore omitted.

Integrated circuit 400C includes conductors 422, 424 and 426 and via 440.

Via 440 is on conductor 424. Via 440 has a length and width equal to width W1b. In some embodiments, by increasing the width W1b of conductor 424, via 440 has increased length and width in the first direction X and the second direction Y, thereby causing a reduction in the resistance from via 440 or other vias in the V0 layer, thereby reducing cell delay compared with other approaches.

Figure 5:
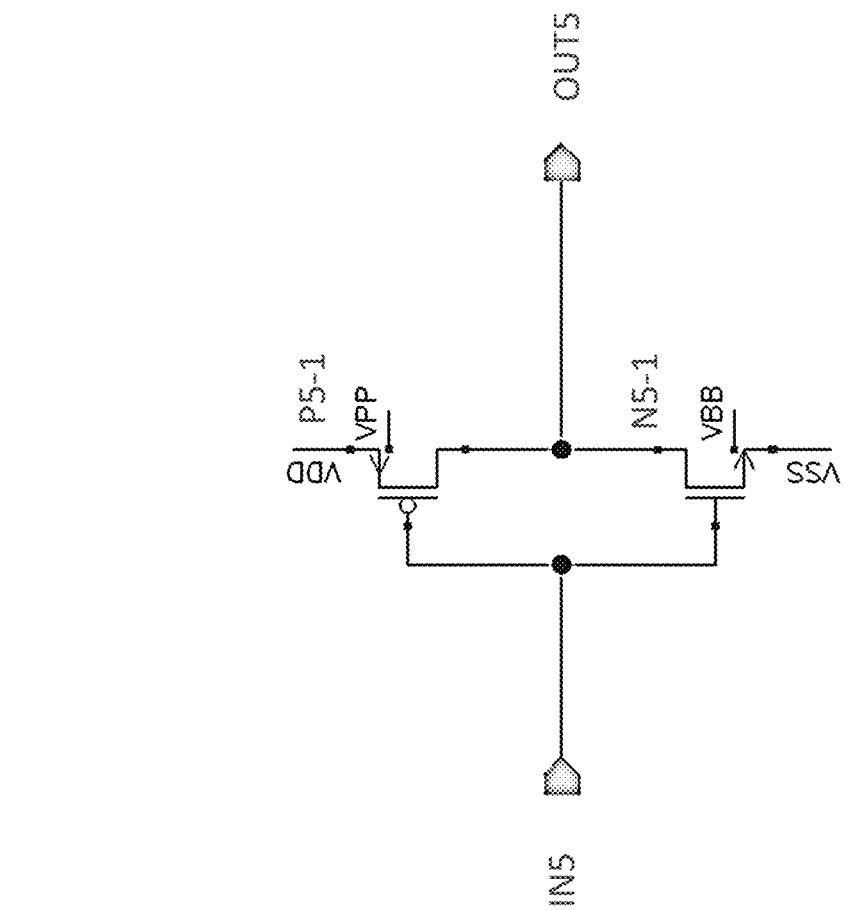
FIG. 5 is a circuit diagram of an integrated circuit, in accordance with some embodiments.

FIG. 5 is a circuit diagram of an integrated circuit 500, in accordance with some embodiments. In some embodiments, integrated circuit 500 is a complementary metal oxide semiconductor (CMOS) inverter circuit. A CMOS inverter circuit is used for illustration, other types of circuits are within the scope of the present disclosure.

Integrated circuit 500 includes a PMOS transistor P5-1 coupled to an NMOS transistor N5-1.

A gate terminal of PMOS transistor P5-1 and a gate terminal of NMOS transistor N5-1 are coupled together, and are configured as an input node IN5. A drain terminal of PMOS transistor P5-1 and a drain terminal of NMOS transistor N5-1 are coupled together, and are configured as an output node OUT5. A source terminal of PMOS transistor P5-1 is coupled to voltage supply VDD. A source terminal of NMOS transistor N5-1 is coupled to reference voltage supply VSS.

Figure 6:
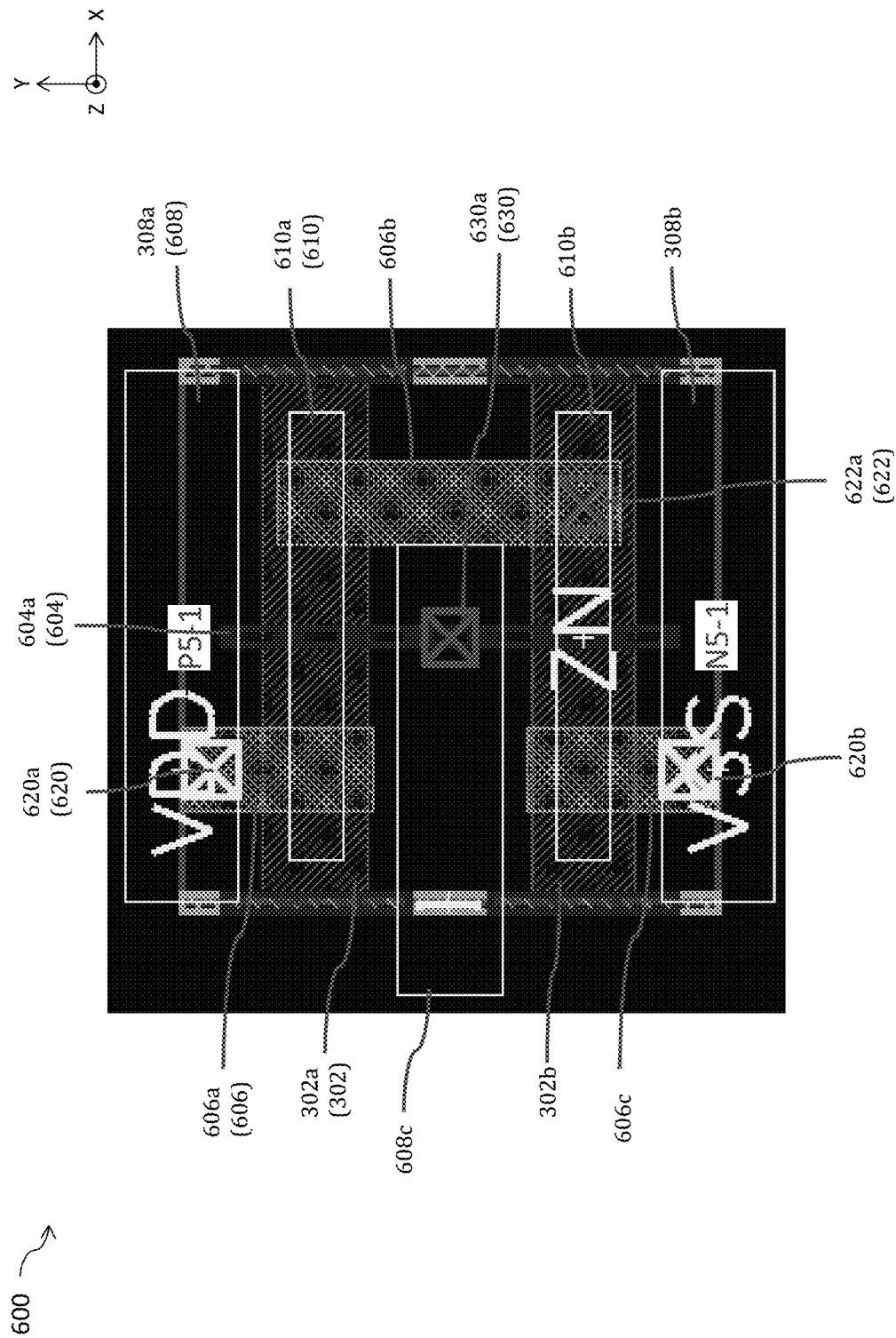
FIG. 6 is a top view of a diagram of an integrated circuit, in accordance with some embodiments.

FIG. 6 is a top view of a diagram of an integrated circuit 600, in accordance with some embodiments.

Integrated circuit 600 is an embodiment of integrated circuit 500 of FIG. 5. Integrated circuit 300 is manufactured by a corresponding layout design similar to integrated circuit 600. For brevity FIGS. 6, 8, 10, 12, 14 and 16 are described as a corresponding integrated circuit 600, 800, 1000, 1200, 1400 and 1600, but in some embodiments, FIGS. 6, 8, 10, 12, 14 and 16 also correspond to layout designs similar to layout design 200, structural elements of integrated circuit 600, 800, 1000, 1200, 1400 and 1600 also correspond to layout patterns, and structural relationships including alignment, lengths and widths, as well as configurations and layers of a corresponding layout design of integrated circuit 600, 800, 1000, 1200, 1400 and 1600 are similar to the structural relationships and configurations and layers of integrated circuit 600, 800, 1000, 1200, 1400 and 1600, and similar detailed description will not be described for brevity.

Integrated circuit 600 includes at least the set of active regions 302, the set of gates 604, insulating region 303, the set of dummy gates 305, a set of contacts 606, a set of conductors 608, a set of conductors 610, a set of vias 620, a set of vias 622, a set of vias 630.

Integrated circuit 600 is a variation of integrated circuit 300, and similar detailed description is therefore omitted.

The set of gates 604 replace the set of gates 304 of FIGS. 3A-3F, and similar detailed description is therefore omitted. The set of gates 604 include gate 604a.

Gate 604a corresponds to the gates of PMOS transistor P5-1 and NMOS transistor N5-1.

The set of contacts 606 replace the set of contacts 306 of FIGS. 3A-3F, and similar detailed description is therefore omitted. Set of contacts 606 include at least contact 606a, 606b or 606c.

Contact 606a corresponds to the source terminal of PMOS transistor P5-1.

Contact 606b corresponds to the drain terminals of PMOS transistor P5-1 and the drain terminal of NMOS transistor N5-1. Contact 606b electrically couples the drain terminal of PMOS transistor P5-1 and the drain terminal of NMOS transistor N5-1.

Contact 606c corresponds to the source terminal of NMOS transistor N5-1.

The set of conductors 608, 610 replace the corresponding set of conductors 308, 310 of FIGS. 3A-3F, and similar detailed description is therefore omitted.

The set of conductors 608 include one or more of conductor 308a, 308b or 608c.

The set of conductors 610 include one or more of conductor 610a or 610b.

The set of vias 620, 622, 630 replace the corresponding set of vias 320, 322, 330 of FIGS. 3A-3F, and similar detailed description is therefore omitted.

The set of vias 620 include at least via 620a or 620b.

The set of vias 622 include at least via 622a.

The set of vias 630 include at least via 630a.

Via 630a is between conductor 608c and gate 604a. Conductor 608c corresponds to the input node INS of integrated circuit 500 and 600. Conductor 608c has an increased width W1b (not labelled) in the second direction Y. In some embodiments, by integrated circuit 600 including at least conductor 608c with an increased width W1b, integrated circuit 600 achieves one or more of the benefits discussed above in FIGS. 1-4C.

Via 620a is between and configured to electrically couple conductor 308a and contact 606a together.

Via 620c is between and configured to electrically couple conductor 308b and contact 606c together.

Via 622a is between and configured to electrically couple conductor 610b and contact 606b together. Conductor 610b corresponds to the output node OUT5 of integrated circuit 500 and 600.

Other configurations, arrangements on other layout levels or quantities of elements in integrated circuit 600 are within the scope of the present disclosure.

Figure 7:
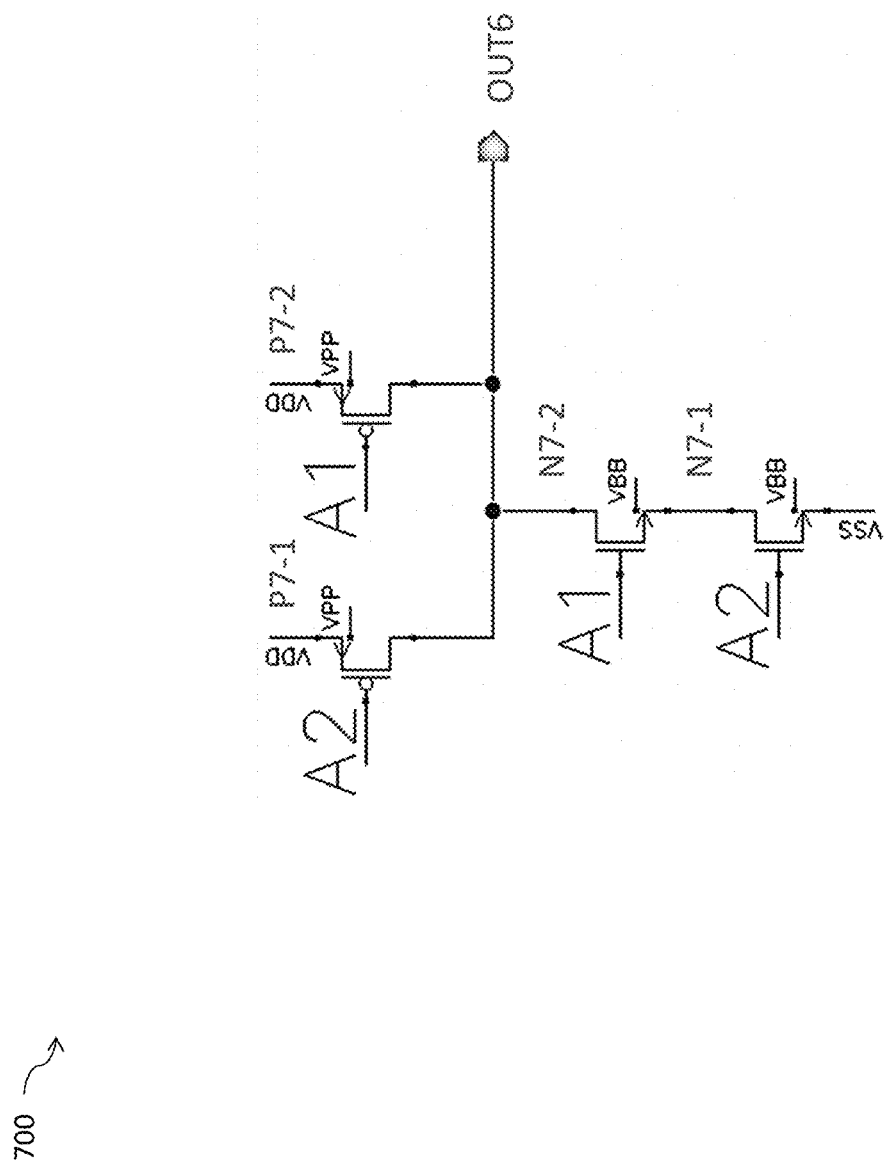
FIG. 7 is a circuit diagram of an integrated circuit, in accordance with some embodiments.

FIG. 7 is a circuit diagram of an integrated circuit 700, in accordance with some embodiments. In some embodiments, integrated circuit 700 is a NAND gate. A NAND gate is used for illustration, other types of circuits are within the scope of the present disclosure.

Integrated circuit 700 includes PMOS transistors P7-1 and P7-2 coupled to NMOS transistors N7-1 and N7-2.

A gate terminal of PMOS transistor P7-1 and NMOS transistor N7-1 are coupled together, and are configured as an input node A2. A gate terminal of PMOS transistor P7-2 and NMOS transistor N7-2 are coupled together, and are configured as an input node A1.

A source terminal of PMOS transistor P7-1 and a source terminal of PMOS transistor P7-2 are coupled to the voltage supply VDD. A source terminal of NMOS transistor N7-1 is coupled to the reference voltage supply VSS. A source terminal of NMOS transistor N7-2 and a drain terminal of NMOS transistor N7-1 are coupled to each other.

Figure 8:
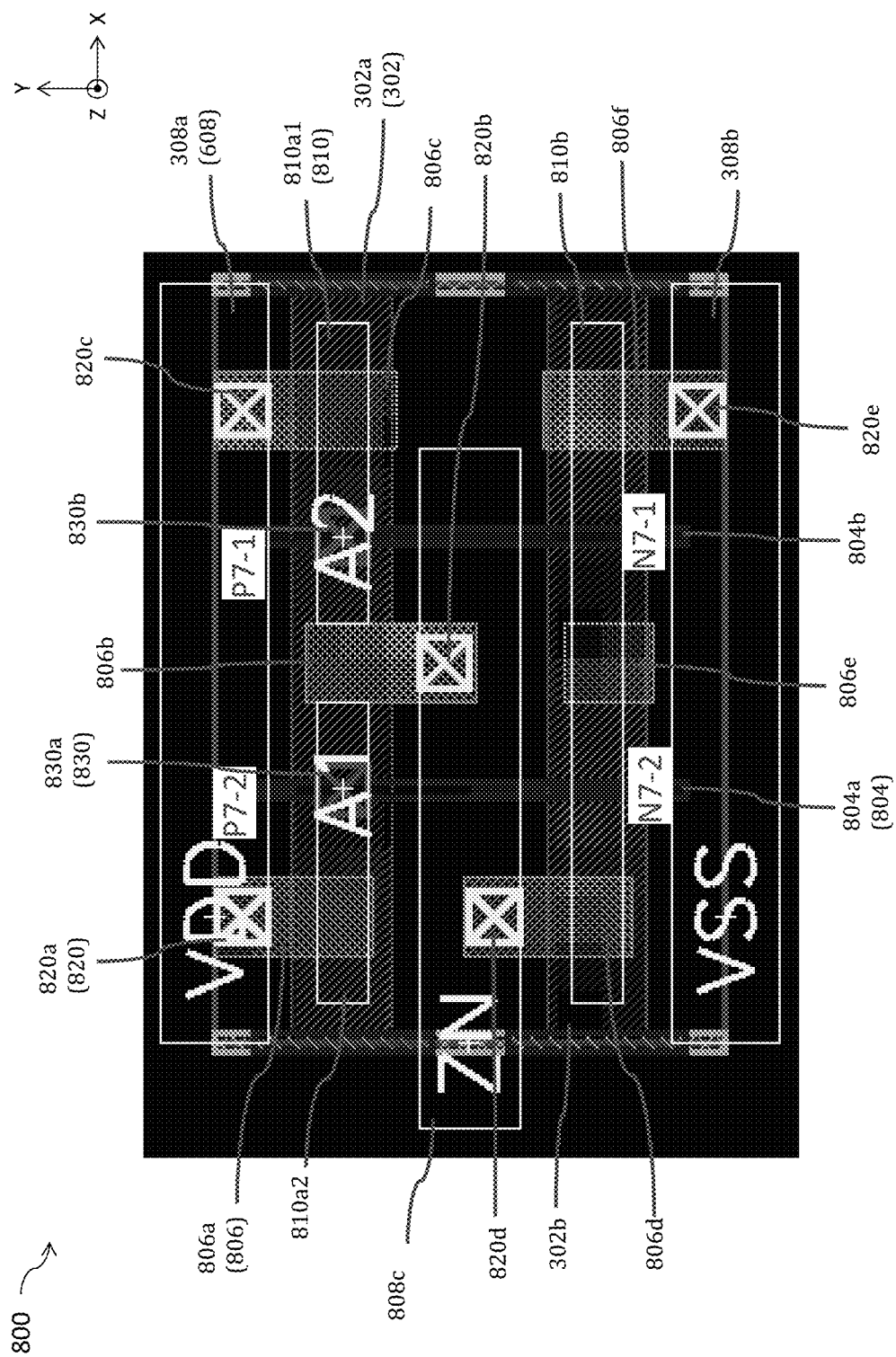
FIG. 8 is a top view of a diagram of an integrated circuit, in accordance with some embodiments.

A drain terminal of PMOS transistor P7-1, a drain terminal of PMOS transistor P7-2, and a drain terminal of NMOS transistor N7-2 are coupled to each other, and are configured as an output node OUT6. As shown in FIG. 8, the drain terminals of PMOS transistors P7-1 and P7-2 are electrically coupled to the drain terminal of NMOS transistor N7-2 by at least conductor 808c (described in FIG. 8). In some embodiments, one or more of the drains or sources are flipped with the other.

FIG. 8 is a top view of a diagram of an integrated circuit 800, in accordance with some embodiments.

Integrated circuit 800 is an embodiment of integrated circuit 700 of FIG. 7. Integrated circuit 800 is manufactured by a corresponding layout design similar to integrated circuit 800.

Integrated circuit 800 includes at least the set of active regions 302, the set of gates 804, insulating region 303, the set of dummy gates 305, a set of contacts 806, a set of conductors 808, a set of conductors 810, a set of vias 820 or a set of vias 830.

Integrated circuit 800 is a variation of integrated circuit 300, and similar detailed description is therefore omitted.

The set of gates 804 replace the set of gates 304 of FIGS. 3A-3F, and similar detailed description is therefore omitted. The set of gates 804 include at least gate 804a or 804b.

Gate 804a corresponds to the gates of PMOS transistor P7-2 and NMOS transistor N7-2.

Gate 804b corresponds to the gates of PMOS transistor P7-1 and NMOS transistor N7-1.

The set of contacts 806 replace the set of contacts 306 of FIGS. 3A-3F, and similar detailed description is therefore omitted. Set of contacts 806 include at least contact 806a, 806b, 806c, 806d, 806e or 806f.

Contact 806a corresponds to the source terminal of PMOS transistor P7-2.

Contact 806b corresponds to the drain terminals of PMOS transistors P7-1 and P7-2. Contact 806b electrically couples the drain terminals of PMOS transistors P7-1 and P7-2.

Contact 806c corresponds to the source terminal of PMOS transistor P7-1.

Contact 806d corresponds to the drain terminal of NMOS transistor N7-2.

Contact 806e corresponds to the drain terminal of NMOS transistor N7-1 and the source terminal of NMOS transistor N7-2. Contact 806e electrically couples the drain terminal of NMOS transistor N7-1 and the source terminal of NMOS transistor N7-2.

Contact 806f corresponds to the source terminal of NMOS transistor N7-1.

The set of conductors 808, 810 replace the corresponding set of conductors 308, 310 of FIGS. 3A-3F, and similar detailed description is therefore omitted.

The set of conductors 808 include one or more of conductor 308a, 308b or 808c.

The set of conductors 810 include one or more of conductor 810a or 810b. Conductor 810a includes conductors 810a1 and 810a2.

The set of vias 820, 830 replace the corresponding set of vias 320, 330 of FIGS. 3A-3F, and similar detailed description is therefore omitted.

The set of vias 820 include at least via 820a, 820b, 820c, 820d or 820e.

The set of vias 830 include at least via 830a or 830b.

Via 830a is between and configured to electrically couple conductor 810a2 and gate 804a. Conductor 810a2 is input node A1 of FIG. 7.

Via 830b is between and configured to electrically couple conductor 810a1 and gate 804b. Conductor 810a1 is input node A2 of FIG. 7.

Via 820a is between and configured to electrically couple conductor 308a and contact 806a together.

Via 820b is between conductor 808c and contact 806b. Via 820b is configured to electrically couple conductor 808c and contact 806b together.

Via 820c is between and configured to electrically couple conductor 308a and contact 806c together.

Via 820d is between conductor 808c and contact 806d. Via 820d is configured to electrically couple conductor 808c and contact 806d together.

Via 820e is between and configured to electrically couple conductor 308b and contact 806f together.

Conductor 808c is electrically coupled to contacts 806b and 806d by corresponding vias 820b, 820d. Thus, conductor 808c electrically couples the drain regions of PMOS transistors P7-1 and P7-2 to the drain region of NMOS transistor N7-2 by corresponding contacts 806b and 806d and corresponding vias 820b and 820d, thereby forming output node OUT6 of integrated circuit 700 and 800.

Conductor 808c has an increased width W1b (not labelled) in the second direction Y. In some embodiments, by integrated circuit 800 including at least conductor 808c with an increased width W1b, integrated circuit 800 achieves one or more of the benefits discussed above in FIGS. 1-4C.

In some embodiments, at least conductor 808c is configured to couple other regions of integrated circuit 800 together.

Other configurations, arrangements on other layout levels or quantities of elements in integrated circuit 800 are within the scope of the present disclosure.

Figure 9:
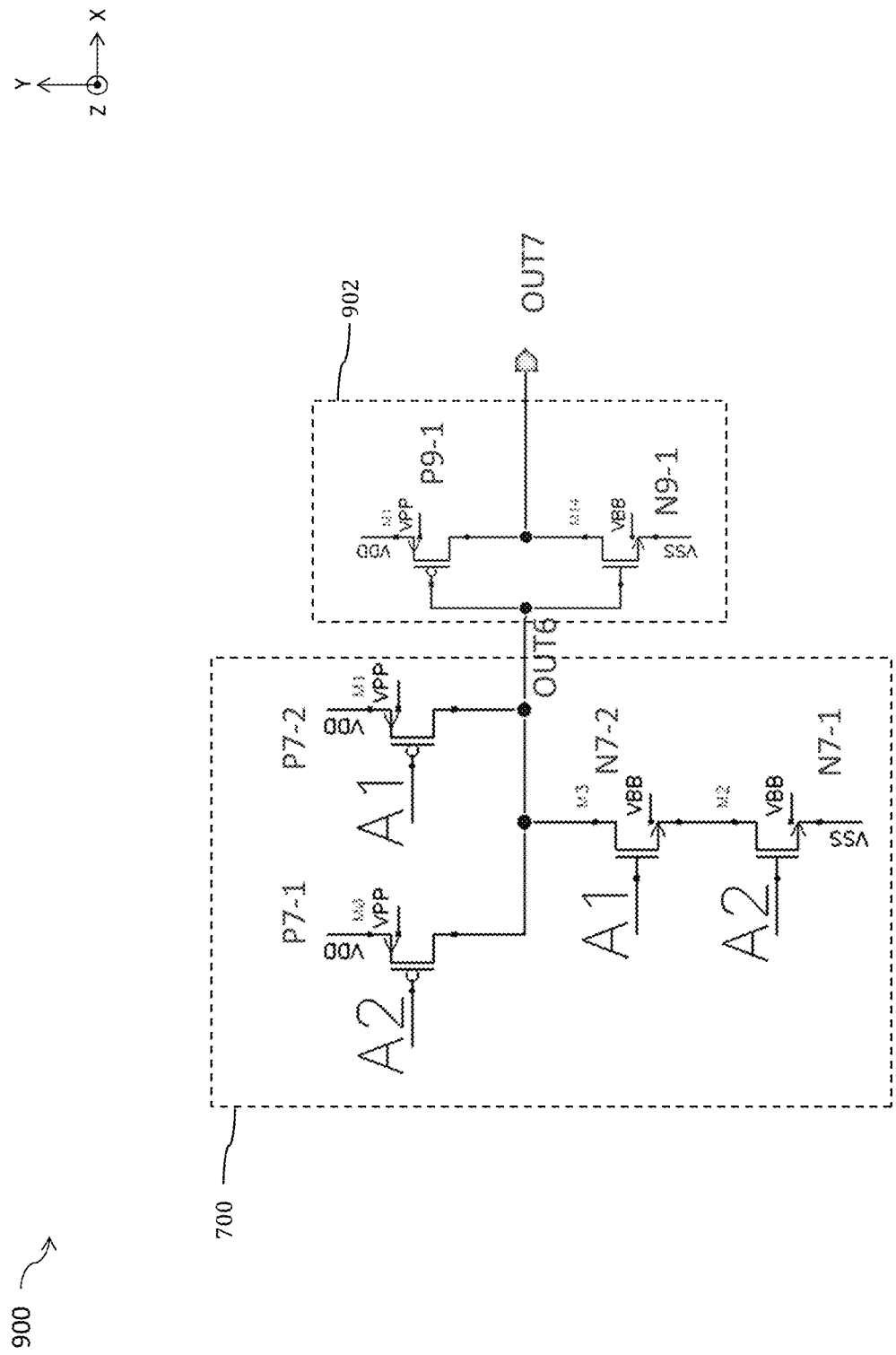
FIG. 9 is a circuit diagram of an integrated circuit, in accordance with some embodiments.

FIG. 9 is a circuit diagram of an integrated circuit 900, in accordance with some embodiments. In some embodiments, integrated circuit 900 is a AND gate. An AND gate is used for illustration, other types of circuits are within the scope of the present disclosure.

Integrated circuit 900 includes PMOS transistors P7-1, P7-2 and P9-1 coupled to NMOS transistors N7-1, N7-2 and N9-1.

Integrated circuit 900 is a variation of integrated circuit 700 of FIG. 7, and similar detailed description is therefore omitted. In comparison with integrated circuit 700 of FIG. 7, integrated circuit 900 further includes PMOS transistor P9-1 and NMOS transistor N9-1 coupled to output node OUT6. PMOS transistor P9-1 and NMOS transistor N9-1 is an inverter 902.

A gate terminal of PMOS transistor P9-1 and a gate terminal of NMOS transistor N9-1 are coupled together, and are configured as an input node (labelled as OUT6). A drain terminal of PMOS transistor P9-1 and a drain terminal of NMOS transistor N9-1 are coupled together, and are configured as an output node OUT7. A source terminal of PMOS transistor P9-1 is coupled to voltage supply VDD. A source terminal of NMOS transistor N9-1 is coupled to reference voltage supply VSS.

Figure 10:
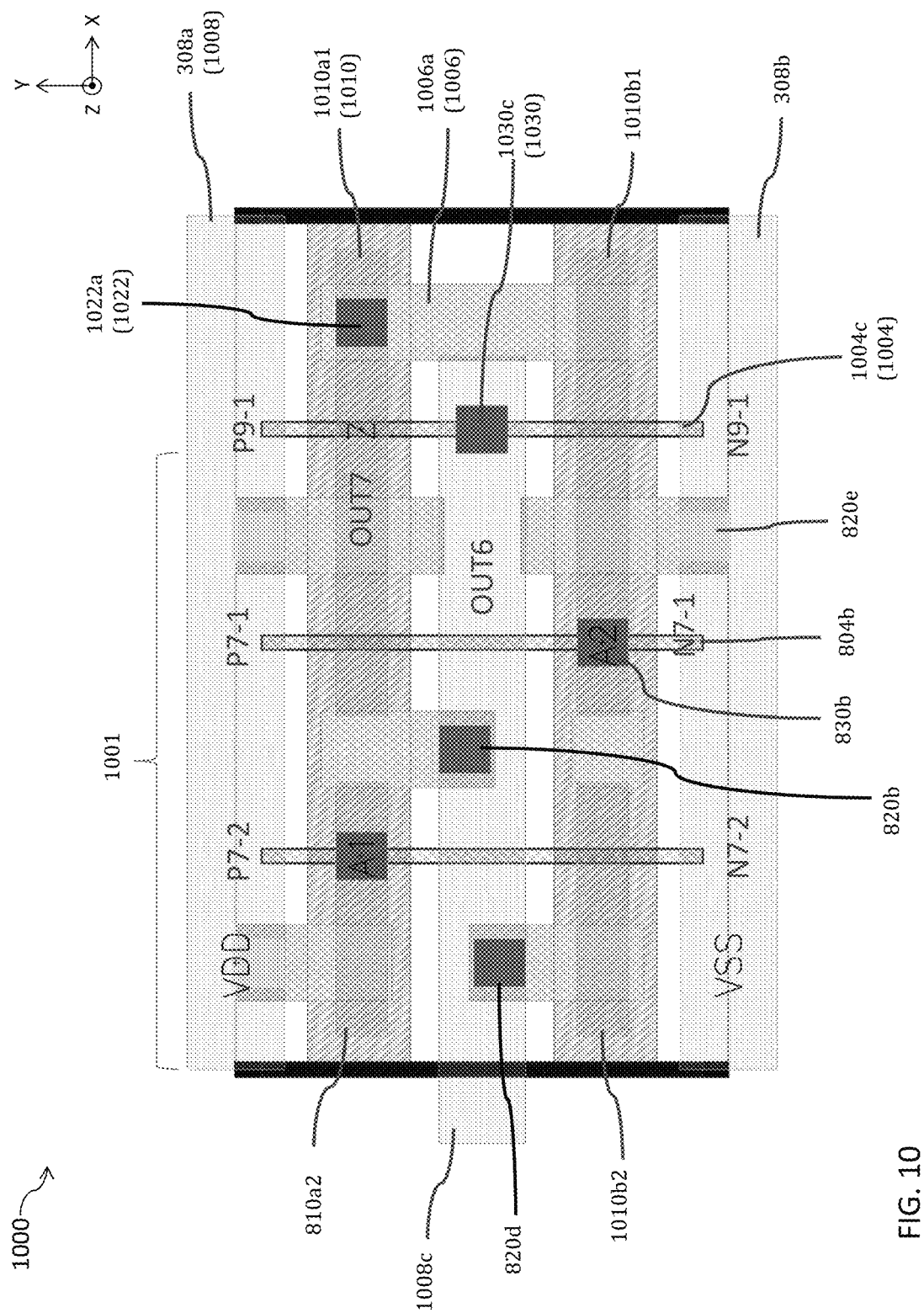
FIG. 10 is a top view of a diagram of an integrated circuit, in accordance with some embodiments.

FIG. 10 is a top view of a diagram of an integrated circuit 1000, in accordance with some embodiments.

Integrated circuit 1000 is an embodiment of integrated circuit 900 of FIG. 9. Integrated circuit 1000 is manufactured by a corresponding layout design similar to integrated circuit 1000.

Integrated circuit 1000 includes at least the set of active regions 302, the set of gates 1004, insulating region 303, the set of dummy gates 305, a set of contacts 1006, a set of conductors 1008, a set of conductors 1010, set of vias 820, a set of vias 1022 or a set of vias 1030.

Integrated circuit 1000 is a variation of integrated circuit 300 or 800, and similar detailed description is therefore omitted. For example, region 1001 of integrated circuit 1000 is similar to integrated circuit 800, and similar detailed description is therefore omitted.

The set of gates 1004 replaces the set of gates 804 of FIG. 8, and similar detailed description is therefore omitted. The set of gates 1004 include at least gate 804a, 804b or 1004c.

Gate 1004c corresponds to the gates of PMOS transistor P9-1 and NMOS transistor N9-1.

The set of contacts 1006 replaces the set of contacts 806 of FIG. 8, and similar detailed description is therefore omitted. Set of contacts 1006 include at least contact 806a, 806b, 806c, 806d, 806e, 806f or 1006a.

Contact 1006a corresponds to the drain terminal of PMOS transistor P9-1 and the drain terminal of NMOS transistor N9-1. Contact 1006a electrically couples the drain terminal of PMOS transistor P9-1 and the drain terminal of NMOS transistor N9-1 together.

Contact 806c in FIG. 10 corresponds to the source terminals of PMOS transistors P7-1 and P9-1. Contact 806c in FIG. 10 electrically couples the source terminals of PMOS transistors P7-1 and P9-1 together.

Contact 806f in FIG. 10 corresponds to the source terminals of NMOS transistors N7-1 and N9-1. Contact 806f in FIG. 10 electrically couples the source terminals of NMOS transistors N7-1 and N9-1 together.

The set of conductors 1008, 1010 replace the corresponding set of conductors 808, 810 of FIG. 8, and similar detailed description is therefore omitted.

The set of conductors 1008 includes one or more of conductor 308a, 308b or 1008c.

The set of conductors 1010 includes one or more of conductor 1010a or 1010b. Conductor 1010a includes conductors 1010a1 and 810a2.

Conductor 1010b of FIG. 10 replaces conductor 810b of FIG. 8, and similar detailed description is therefore omitted. In comparison with conductor 810b of FIG. 8, conductor 1010b includes conductors 1010b1 and 1010b2, and similar detailed description is therefore omitted.

The set of vias 1030 replaces the set of vias 830 of FIG. 8, and similar detailed description is therefore omitted.

The set of vias 1030 includes at least via 830a, 830b or 1030c.

In comparison with integrated circuit 800 of FIG. 8, integrated circuit 1000 further includes a set of vias 1022. The set of vias 1022 include at least via 1022a.

Via 830b in FIG. 10 is between and configured to electrically couple conductor 1010b1 and gate 804b. Conductor 1010b1 is input node A2 of FIG. 9.

Via 1030c is between and configured to electrically couple conductor 1008c and gate 1004c. Conductor 1008c is input node OUT6 of FIG. 9.

Via 1022a is between conductor 1010a1 and contact 1006a. Via 1022a is configured to electrically couple conductor 1010a1 and contact 1006a together. Conductor 1010a1 is output node OUT7.

Conductor 1008c is electrically coupled to contacts 806b and 806d by corresponding vias 820b, 820d, and electrically coupled to gate 1004c by via 1030c. Thus, conductor 1008c electrically couples the drain regions of PMOS transistors P7-1 and P7-2, the drain region of NMOS transistor N7-2 and the gates of PMOS transistor P9-1 and NMOS transistor N9-1 together, thereby forming output node OUT7 of integrated circuit 900 and 1000.

Conductor 1008c has an increased width W1b (not labelled) in the second direction Y. In some embodiments, by integrated circuit 1000 including at least conductor 1008c with an increased width W1b, integrated circuit 1000 achieves one or more of the benefits discussed above in FIGS. 1-4C.

In some embodiments, at least conductor 1008c is configured to couple other regions of integrated circuit 1000 together.

Other configurations, arrangements on other layout levels or quantities of elements in integrated circuit 1000 are within the scope of the present disclosure.

Figure 11:
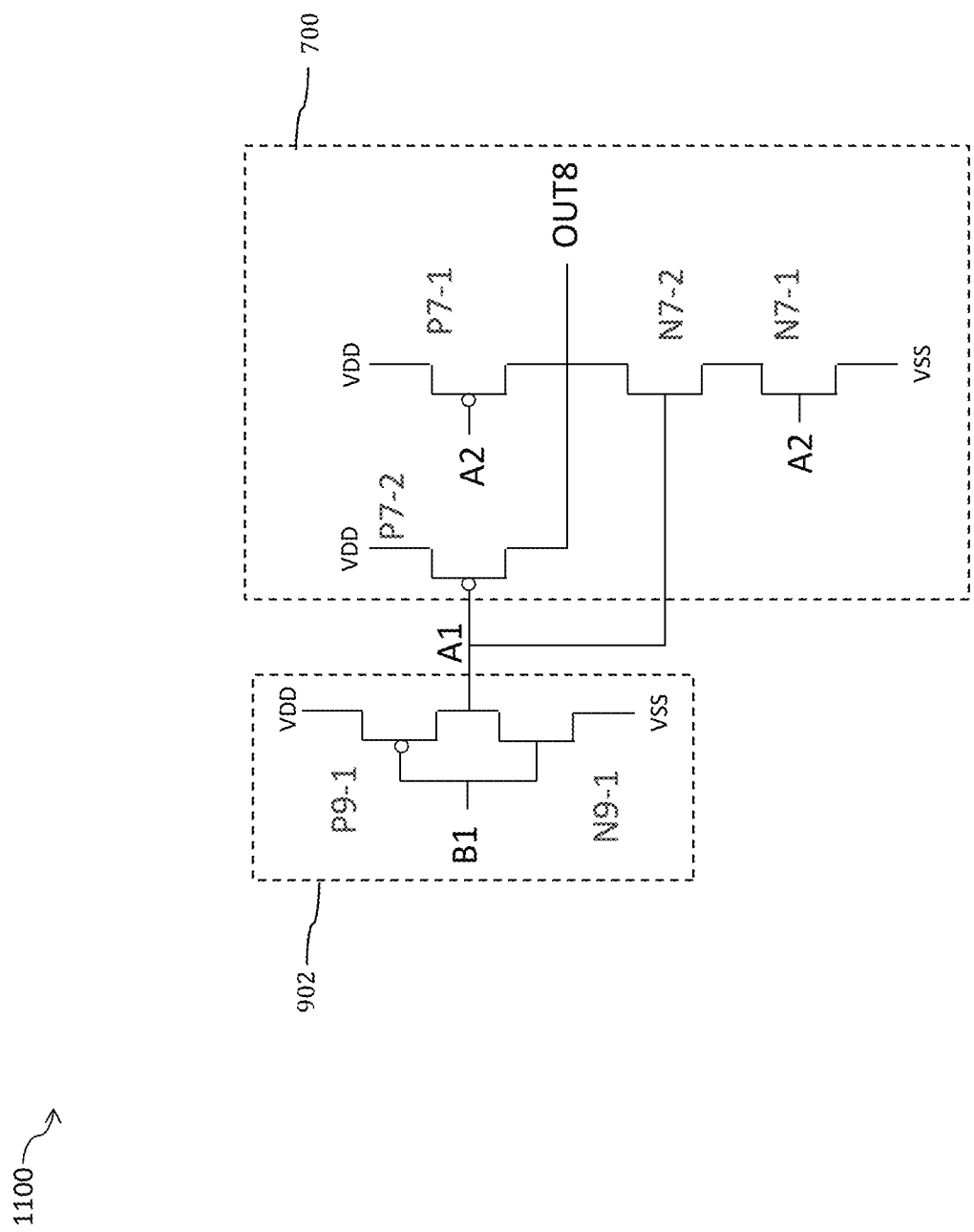
FIG. 11 is a circuit diagram of an integrated circuit, in accordance with some embodiments.

FIG. 11 is a circuit diagram of an integrated circuit 1100, in accordance with some embodiments. In some embodiments, integrated circuit 1100 is configured to implement the logic function NAND(not(B1),A2). Other types of circuits are within the scope of the present disclosure.

Integrated circuit 1100 includes PMOS transistors P7-1, P7-2 and P9-1 coupled to NMOS transistors N7-1, N7-2 and N9-1.

Integrated circuit 1100 is a variation of integrated circuit 900 of FIG. 9, and similar detailed description is therefore omitted.

In comparison with integrated circuit 900 of FIG. 9, inverter 902 is coupled to the input of integrated circuit 700. Stated differently, PMOS transistor P9-1 and NMOS transistor N9-1 are coupled to the input of integrated circuit 700.

In comparison with integrated circuit 900 of FIG. 9, each of the gate terminal of PMOS transistor P7-2, the gate terminal of NMOS transistor N7-2, the drain terminal of PMOS transistor P9-1 and the drain terminal of NMOS transistor N9-1 are coupled together, and are configured as node A1.

Integrated circuit 1100 has an output node OUT8. The drain terminal of PMOS transistor P7-1, the drain terminal of PMOS transistor P7-2, and the drain terminal of NMOS transistor N7-2 are coupled to each other, and are configured as output node OUT8.

Figure 12:
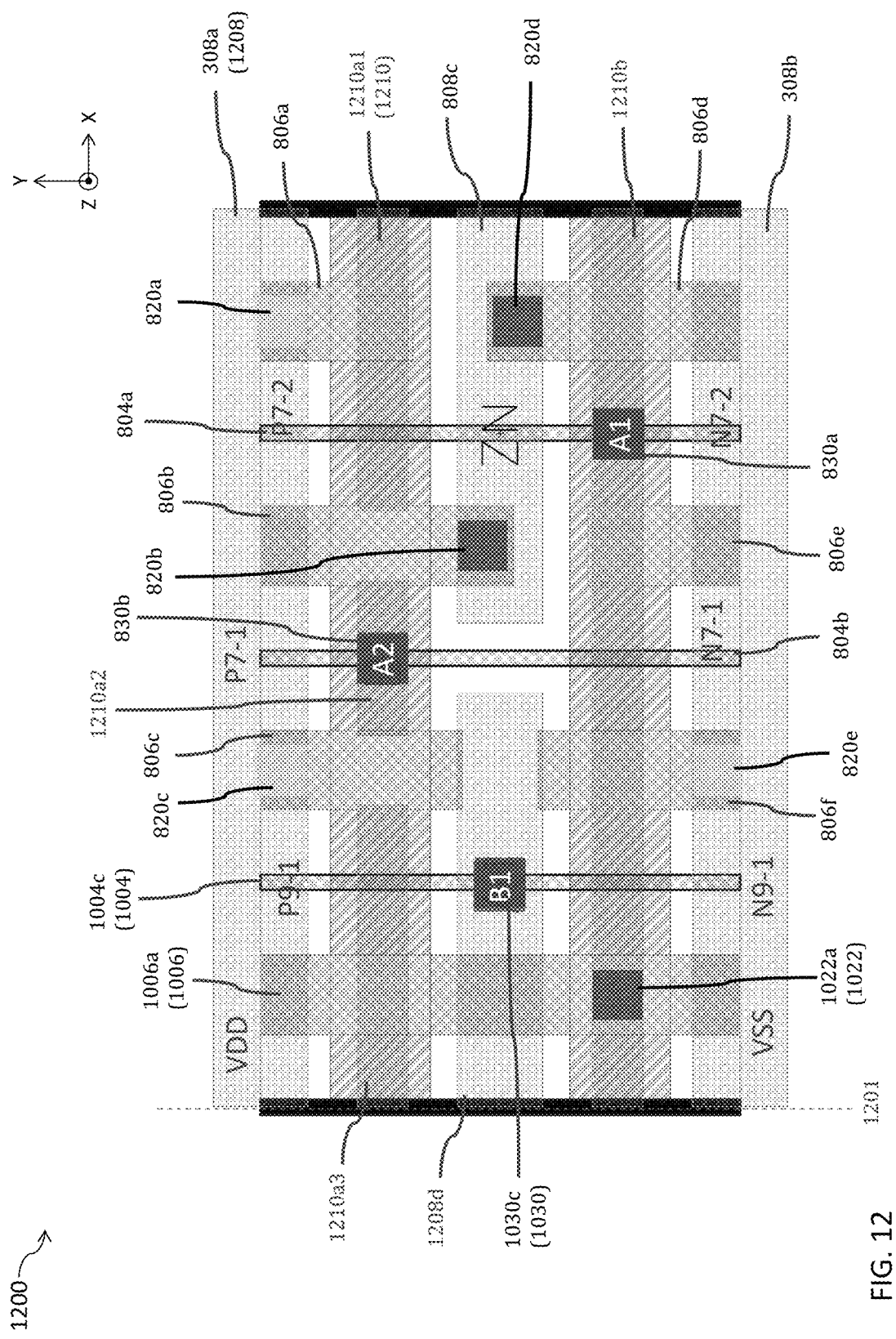
FIG. 12 is a top view of a diagram of an integrated circuit, in accordance with some embodiments.

As shown in FIG. 12, the drain terminals of PMOS transistors P7-1 and P7-2 are electrically coupled to the drain terminal of NMOS transistor N7-2 by at least conductor 808*c* (described in FIG. 12). In some embodiments, one or more of the drains or sources are flipped with the other.

FIG. 12 is a top view of a diagram of an integrated circuit 1200, in accordance with some embodiments.

Integrated circuit 1200 is an embodiment of integrated circuit 1100 of FIG. 11. Integrated circuit 1200 is manufactured by a corresponding layout design similar to integrated circuit 1200.

Integrated circuit 1200 includes at least the set of active regions 302, the set of gates 1004, insulating region 303, the set of dummy gates 305, set of contacts 1006, a set of conductors 1208, a set of conductors 1210, set of vias 820, set of vias 1022 or set of vias 1030.

Integrated circuit 1200 is a variation of integrated circuit 1000, and similar detailed description is therefore omitted. For example, in comparison with integrated circuit 1000 of FIG. 10, integrated circuit 1200 is a mirror image of integrated circuit 1000 with respect to line 1201 along the Y-axis, and similar detailed description is therefore omitted.

In comparison with integrated circuit 1000 of FIG. 10, the set of conductors 1208, 1210 of FIG. 12 replace the corresponding set of conductors 1008, 1010 of FIG. 10, and similar detailed description is therefore omitted.

The set of conductors 1208 includes one or more of conductor 308*a*, 308*b*, 808*c* or 1208*d*.

The set of conductors 1210 includes one or more of conductor 1210*a* or 1210*b*.

Conductor 1210*a* of FIG. 12 replaces conductor 1010*a* of FIG. 10, and similar detailed description is therefore omitted. Conductor 1210*a* includes conductors 1210*a*1, 1210*a*2 and 1210*a*3.

Conductor 1210*b* of FIG. 12 replaces conductor 1010*b* of FIG. 10, and similar detailed description is therefore omitted.

Via 830*a* in FIG. 12 is between and configured to electrically couple conductor 1210*b* and gate 804*a*. Conductor 1210*b* is input node A1 of FIG. 11.

Via 830*b* in FIG. 12 is between and configured to electrically couple conductor 1210*a*2 and gate 804*b*. Conductor 1210*a*2 is input node A2 of FIG. 11.

Via 1030*c* in FIG. 12 is between and configured to electrically couple conductor 1208*d* and gate 1004*c*. Conductor 1208*d* is input node B1 of FIG. 11. Conductor 1208*d* is electrically coupled to gate 1004*c* by via 1030*c*.

Via 1022*a* in FIG. 12 is between conductor 1210*b* and contact 1006*a*. Via 1022*a* is configured to electrically couple conductor 1210*b* and contact 1006*a* together. Conductor 1210*b* is electrically coupled to contact 1006*a* by via 1022*a* and to gate 804*a* by via 830*a*. Thus, conductor 1210*b* electrically couples the gates of PMOS transistor P7-2 and NMOS transistor N7-2 with the drain regions of PMOS transistor P9-1 and NMOS transistor N9-1 together.

Conductor 808*c* is electrically coupled to contacts 806*b* and 806*d* by corresponding vias 820*b*, 820*d*. Thus, conductor 808*c* electrically couples the drain regions of PMOS transistors P7-1 and P7-2 to the drain region of NMOS transistor N7-2 by corresponding contacts 806*b* and 806*d* and corresponding vias 820*b* and 820*d*, thereby forming output node OUT8 of integrated circuit 1100 and 1200.

Conductor 808*c* has an increased width W1*b* (not labelled) in the second direction Y. In some embodiments, by integrated circuit 1200 including at least conductor 808*c* with an increased width W1*b*, integrated circuit 1200 achieves one or more of the benefits discussed above in FIGS. 1-4C.

In some embodiments, at least conductor 808*c* or 1008*c* is configured to couple other regions of integrated circuit 1200 together.

Other configurations, arrangements on other layout levels or quantities of elements in integrated circuit 1200 are within the scope of the present disclosure.

Figure 13:
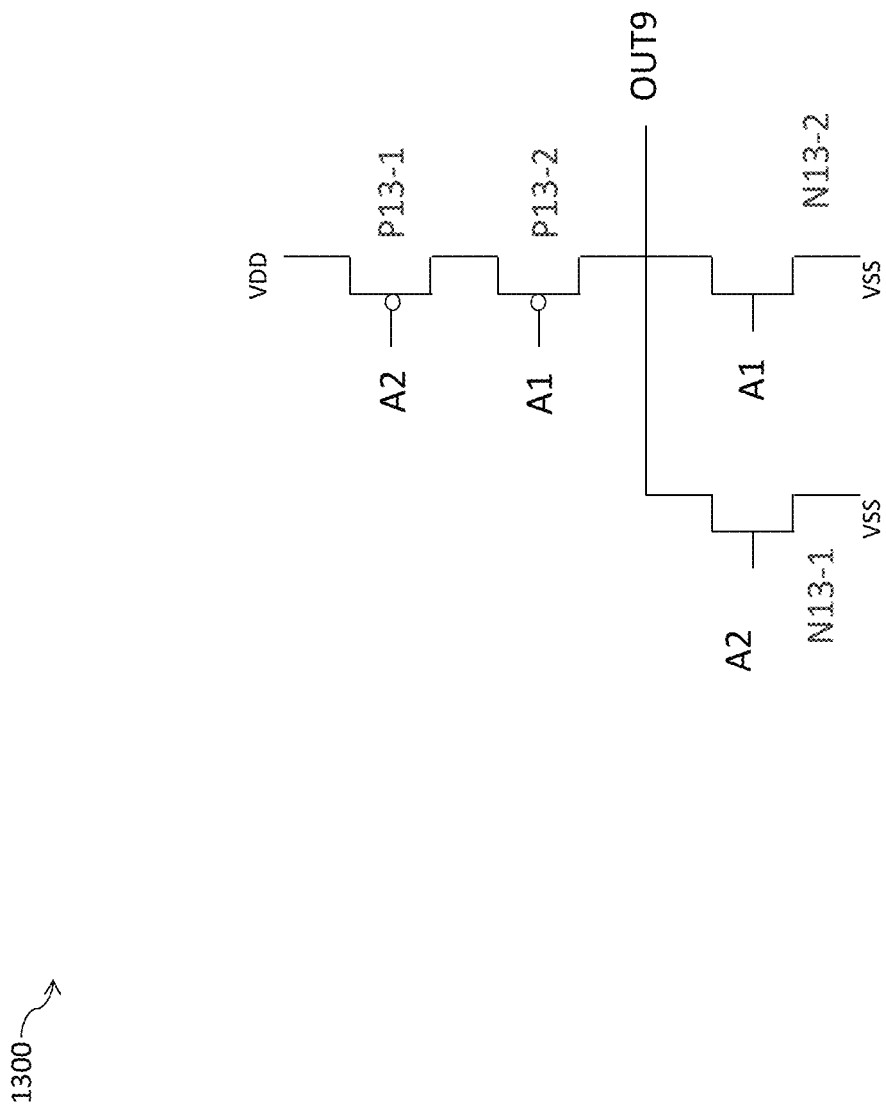
FIG. 13 is a circuit diagram of an integrated circuit, in accordance with some embodiments.

FIG. 13 is a circuit diagram of an integrated circuit 1300, in accordance with some embodiments. In some embodiments, integrated circuit 1300 is a NOR logic gate circuit. A NOR logic gate circuit is used for illustration, other types of circuits including other types of NOR logic circuits are within the scope of the present disclosure.

Integrated circuit 1300 includes PMOS transistors P13-1 and P13-2 coupled to NMOS transistors N13-1 and N13-2.

A gate terminal of PMOS transistor P13-1 and NMOS transistor N13-1 are coupled together, and are configured as an input node A2. A gate terminal of PMOS transistor P13-2 and NMOS transistor N13-2 are coupled together, and are configured as an input node A1.

A source terminal of PMOS transistor P13-1 is coupled to the voltage supply VDD.

A source terminal of NMOS transistor N13-1 and a source terminal of NMOS transistor N13-2 are coupled to the reference voltage supply VSS.

A drain terminal of PMOS transistor P13-1 and a source terminal of PMOS transistor P13-2 are coupled to each other.

Figure 14:
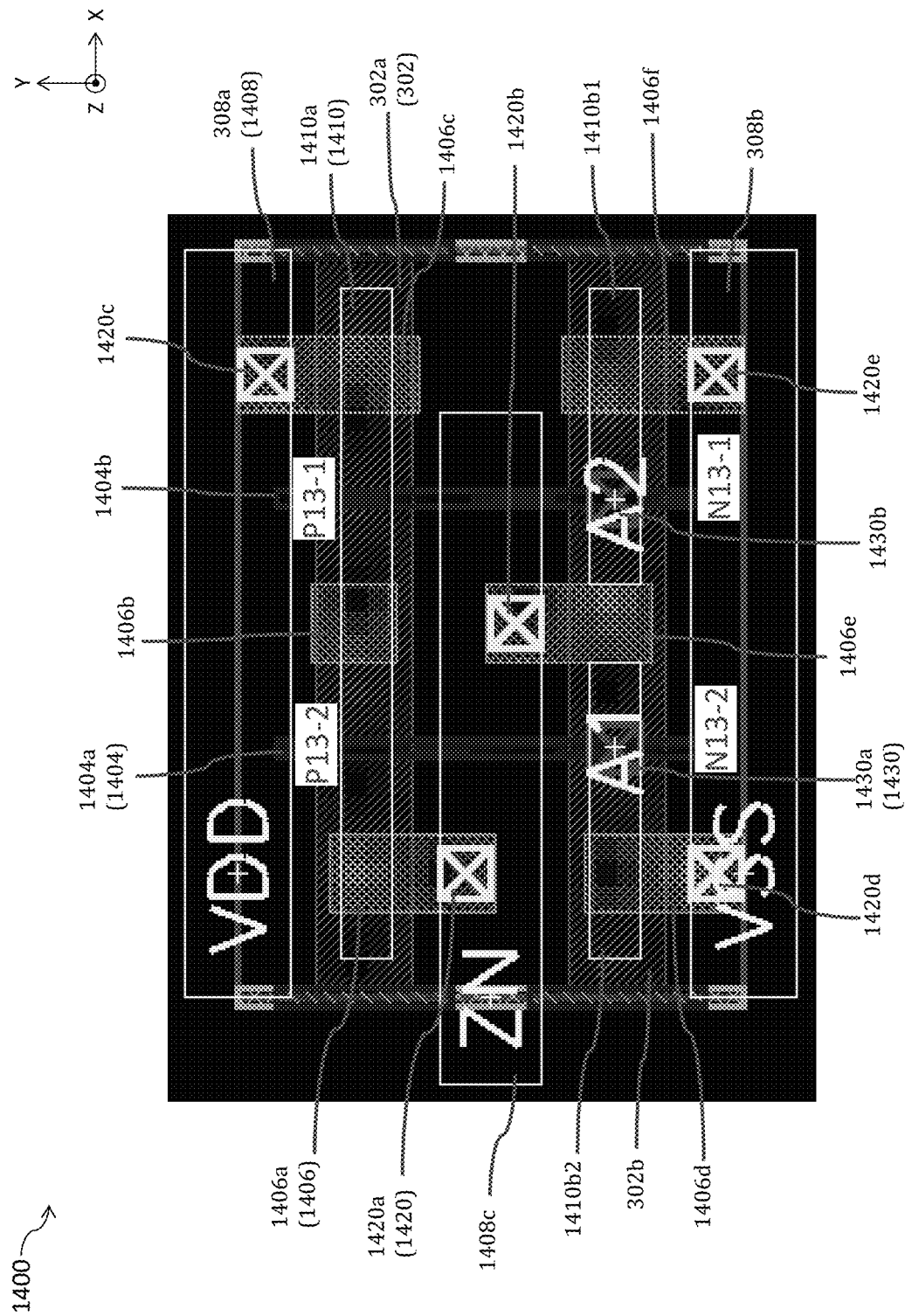
FIG. 14 is a top view of a diagram of an integrated circuit, in accordance with some embodiments.

Each of a drain terminal of PMOS transistor P13-2, a drain terminal of NMOS transistor N13-1 and a drain terminal of NMOS transistor N13-2 are coupled to each other, and are configured as an output node OUT5. As shown in FIG. 14, the drain terminal of PMOS transistor P13-2, and the drain terminals of NMOS transistors N13-1 and N13-2 are electrically coupled together by at least a conductor 1408*c* (described in FIG. 14). In some embodiments, one or more of the drains or sources are flipped with the other.

Other configurations, arrangements or other circuits in integrated circuit 1300 are within the scope of the present disclosure.

FIG. 14 is a top view of a diagram of an integrated circuit 1400, in accordance with some embodiments.

Integrated circuit 1400 is an embodiment of integrated circuit 1300 of FIG. 13. Integrated circuit 1400 is manufactured by a corresponding layout design similar to integrated circuit 1400.

Integrated circuit 1400 includes at least the set of active regions 302, the set of gates 1404, insulating region 303, the set of dummy gates 305, a set of contacts 1406, a set of conductors 1408, a set of conductors 1410, a set of vias 1420 or a set of vias 1430.

Integrated circuit 1400 is a variation of integrated circuit 300 and 800, and similar detailed description is therefore omitted.

The set of gates 1404 replace the set of gates 304 of FIGS. 3A-3F, and similar detailed description is therefore omitted. The set of gates 1404 include at least gate 1404a or 1404b.

Gate 1404a corresponds to the gates of PMOS transistor P13-2 and NMOS transistor N13-2.

Gate 1404b corresponds to the gates of PMOS transistor P13-1 and NMOS transistor N13-1.

The set of contacts 1406 replace the set of contacts 306 of FIGS. 3A-3F, and similar detailed description is therefore omitted. Set of contacts 1406 include at least contact 1406a, 1406b, 1406c, 1406d, 1406e or 1406f.

Contact 1406a corresponds to the drain terminal of PMOS transistor P13-2.

Contact 1406b corresponds to the source terminal of PMOS transistors P13-2 and the drain terminal of PMOS transistor P13-1. Contact 1406b electrically couples the source terminal of PMOS transistors P13-2 and the drain terminal of PMOS transistor P13-1.

Contact 1406c corresponds to the source terminal of PMOS transistor P13-1.

Contact 1406d corresponds to the source terminal of NMOS transistor N13-1.

Contact 1406e corresponds to the drain terminal of NMOS transistor N13-1 and the drain terminal of NMOS transistor N13-2. Contact 1406e electrically couples the drain terminal of NMOS transistor N13-1 and the drain terminal of NMOS transistor N13-2.

Contact 1406f corresponds to the source terminal of NMOS transistor N13-2.

The set of conductors 1408, 1410 replace the corresponding set of conductors 308, 310 of FIGS. 3A-3F, and similar detailed description is therefore omitted.

The set of conductors 1408 include one or more of conductor 308a, 308b or 1408c.

The set of conductors 1410 include one or more of conductor 1410a or 1410b.

Conductor 1410b of FIG. 14 replaces conductor 810b of FIG. 8, and similar detailed description is therefore omitted. In comparison with conductor 810b of FIG. 8, conductor 1410b includes conductors 1410b1 and 1410b2, and similar detailed description is therefore omitted.

The set of vias 1420, 1430 replace the corresponding set of vias 320, 330 of FIGS. 3A-3F, and similar detailed description is therefore omitted.

The set of vias 1420 include at least via 1420a, 1420b, 1420c, 1420d or 1420e.

The set of vias 1430 include at least via 1430a or 1430b.

Via 1430a is between and configured to electrically couple conductor 1410b2 and gate 1404a. Conductor 1410b2 is input node A1 of FIG. 13.

Via 1430b is between and configured to electrically couple conductor 1410b1 and gate 1404b. Conductor 1410b1 is input node A2 of FIG. 13.

Via 1420a is between conductor 1408c and contact 1406a. Via 1420a is configured to electrically couple conductor 1408c and contact 1406a together.

Via 1420b is between conductor 1408c and contact 1406e. Via 1420b is configured to electrically couple conductor 1408c and contact 1406e together.

Via 1420c is between and configured to electrically couple conductor 308a and contact 1406c together.

Via 1420d is between and configured to electrically couple conductor 308b and contact 1406d together.

Via 1420e is between and configured to electrically couple conductor 308b and contact 1406f together.

Conductor 1408c is electrically coupled to contacts 1406a and 1406e by corresponding vias 1420a, 1420b. Thus, conductor 1408c electrically couples the drain region of PMOS transistor P13-2 to the drain regions of NMOS transistors N13-2 and N13-1 by corresponding contacts 1406a and 1406e and corresponding vias 1420a and 1420b, thereby forming output node OUT5 of integrated circuit 1300 and 1400.

Conductor 1408c has an increased width W1b (not labelled) in the second direction Y. In some embodiments, by integrated circuit 1400 including at least conductor 1408c with an increased width W1b, integrated circuit 1400 achieves one or more of the benefits discussed above in FIGS. 1-4C.

In some embodiments, at least conductor 1408c is configured to couple other regions of integrated circuit 1400 together.

Other configurations, arrangements on other layout levels or quantities of elements in integrated circuit 1400 are within the scope of the present disclosure.

Figure 15:
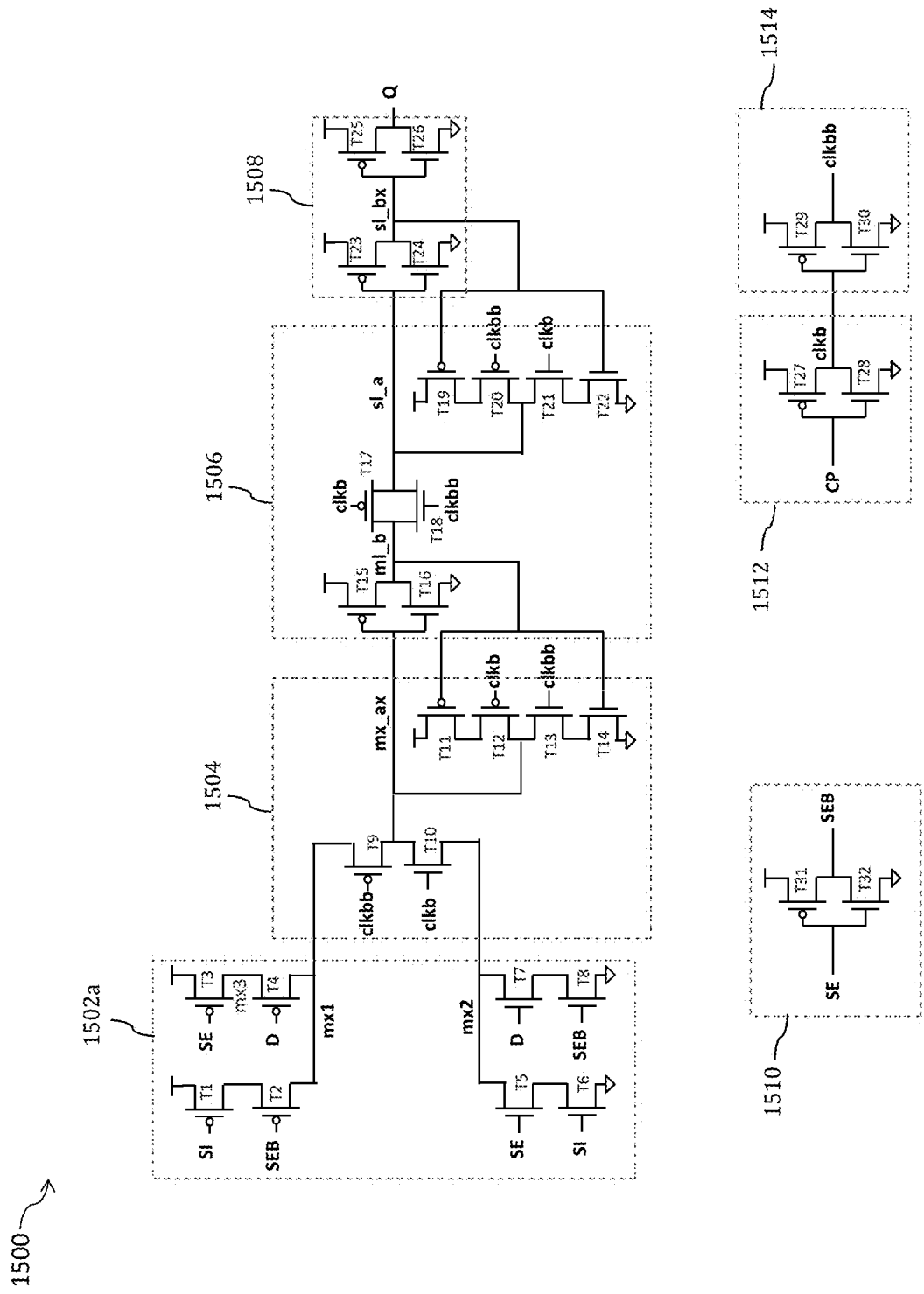
FIG. 15 is a circuit diagram of an integrated circuit, in accordance with some embodiments.

FIG. 15 is a circuit diagram of an integrated circuit 1500, in accordance with some embodiments.

In some embodiments, integrated circuit 1500 is a flip-flop circuit. In some embodiments, integrated circuit 1500 is a multi-bit flip-flop (MBFF) circuit.

Integrated circuit 1500 is a flip-flop circuit. Integrated circuit 1500 is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 1500 includes a multiplexer 1502a, a latch 1504, a latch 1506, an output circuit 1508, an inverter 1510, an inverter 1512 and an inverter 1514.

Multiplexer 1502a includes a first input terminal configured to receive the data signal D, a second input terminal configured to receive the scan in signal SI, a third input terminal configured to receive a scan enable signal SE, and a fourth input terminal configured to receive an inverted scan enable signal SEB. In some embodiments, the scan enable signal SE is a selection signal of multiplexer 1502a, and the inverted scan enable signal SEB is an inverted selection signal of multiplexer 1502a. An output terminal of multiplexer 1502a is coupled to an input terminal of latch 1504. Multiplexer 1502a is configured to output a signal mx1 and mx2 to latch 1504. In some embodiments, multiplexer 1502a is coupled to inverter 1510, and is configured to receive inverted scan enable signal SEB.

Latch 1504 is coupled to multiplexer 1502a and latch 1506. The input terminal of latch 1504 is configured to receive signals mx1 and mx2 from multiplexer 1502a. An output terminal of latch 1504 is coupled to an input terminal of latch 1506. Latch 1504 is configured to output a signal mx_ax to latch 1506 by the output terminal.

In some embodiments, latch 1504 is coupled to inverter 1512, and is configured to receive clock signal CLKB. In some embodiments, latch 1504 is coupled to inverter 1514, and is configured to receive clock signal CLKBB.

Latch 1506 is coupled to latch 1504 and output circuit 1508. The input terminal of latch 1506 is configured to receive signal mx_ax from latch 1504. An output terminal of latch 1506 is coupled to an input terminal of output circuit 1508. Latch 1506 is configured to output a signal sl_a to output circuit 1508 by the output terminal. In some embodiments, latch 1506 is coupled to inverter 1512, and is configured to receive clock signal CLKB. In some embodiments, latch 1506 is coupled to inverter 1514, and is configured to receive clock signal CLKBB.

Output circuit 1508 is coupled to latch 1506. The input terminal of output circuit 1508 is configured to receive signal sl_a from latch 1506. An output terminal of output circuit 1508 is configured to output the output signal Q.

An input terminal of inverter 1510 is configured to receive the scan enable signal SE. In some embodiments, the input terminal of inverter 1510 is coupled to the third input terminal of multiplexer 1502a. An output terminal of inverter 1510 is configured to output the inverted scan enable signal SEB. In some embodiments, the output terminal of inverter 1510 is coupled to the fourth input terminal of multiplexer 1502a.

An input terminal of inverter 1512 is configured to receive clock signal CP. An output terminal of inverter 1512 is configured to output the clock signal CLKB to at least an input terminal of inverter 1514.

An input terminal of inverter 1514 is coupled to at least the output terminal of inverter 1512, and is configured to receive clock signal CLKB. An output terminal of inverter 1514 is configured to output the clock signal CLKBB.

Multiplexer 1502a includes transistors T1-T8. In some embodiments, each of transistors T1, T2, T3 and T4 is a p-type metal oxide semiconductor (PMOS) transistor. In some embodiments, each of transistors T5, T6, T7 and T8 is an n-type metal oxide semiconductor (NMOS) transistor.

A gate terminal of transistor T1 is configured to receive scan in signal SI. A gate terminal of transistor T6 is configured to receive scan in signal SI. In some embodiments, the gate terminal of transistor T1 is coupled to the gate terminal of transistor T6.

A gate terminal of transistor T2 is configured to receive inverted scan enable signal SEB. A source terminal of transistor T1 is coupled to the voltage supply VDD. A drain terminal of transistor T1 is coupled to a source terminal of transistor T2.

A gate terminal of transistor T3 is configured to receive scan enable signal SE. A source terminal of transistor T3 is coupled to the voltage supply VDD. A drain terminal of transistor T3 is coupled to a source terminal of transistor T4.

A gate terminal of transistor T4 is configured to receive data signal D. A gate terminal of transistor T7 is configured to receive data signal D. In some embodiments, the gate terminal of transistor T4 is coupled to the gate terminal of transistor T7.

A source terminal of transistor T6 is coupled to the reference voltage supply VSS. A drain terminal of transistor T6 is coupled to a source terminal of transistor T5. A gate terminal of transistor T5 is configured to receive scan enable signal SE. In some embodiments, the gate terminal of transistor T5 is coupled to the gate terminal of transistor T3.

A gate terminal of transistor T8 is configured to receive inverted scan enable signal SEB. In some embodiments, the gate terminal of transistor T8 is coupled to the gate terminal of transistor T2. A source terminal of transistor T8 is coupled to the reference voltage supply VSS. A drain terminal of transistor T8 is coupled to a source terminal of transistor T7.

Latch 1504 includes transistors T9-T14. In some embodiments, each of transistors T9, T11 and T12 is a PMOS transistor. In some embodiments, each of transistors T10, T13 and T14 is an NMOS transistor.

Each of the source terminal of transistor T9, the drain terminal of transistor T2 and the drain terminal of transistor T4 are coupled together. Signal mx1 is the signal of at least the source terminal of transistor T9, the drain terminal of transistor T2 or the drain terminal of transistor T4.

Each of the source terminal of transistor T10, the drain terminal of transistor T5 and the drain terminal of transistor T7 are coupled together. Signal mx2 is the signal of at least the source terminal of transistor T10, the drain terminal of transistor T5 or the drain terminal of transistor T7.

A gate terminal of transistor T9 is configured to receive clock signal CLKBB. A gate terminal of transistor T10 is configured to receive clock signal CLKB. In some embodiments, clock signal CLKBB is inverted from clock signal CLKB, and vice versa. In some embodiments, clock signal CLKB is inverted from clock signal CP, and vice versa.

Each of the drain terminal of transistor T9, the drain terminal of transistor T10, a drain terminal of transistor T13, a drain terminal of transistor T12, a gate terminal of transistor T15 and a gate terminal of transistor T16 are coupled together. Signal mx_ax is the signal of at least the drain terminal of transistor T9, the drain terminal of transistor T10, the drain terminal of transistor T13, the drain terminal of transistor T12, the gate terminal of transistor T15 or the gate terminal of transistor T16.

A gate terminal of transistor T11 and a gate terminal of transistor T14 are coupled together, and are further coupled to latch 1506.

A source terminal of transistor T11 is coupled to the voltage supply VDD. A drain terminal of transistor T11 is coupled to a source terminal of transistor T12.

A gate terminal of transistor T12 is configured to receive clock signal CLKB. In some embodiments, the gate terminal of transistor T12 is coupled to at least an output terminal of inverter 1512.

A gate terminal of transistor T13 is configured to receive clock signal CLKBB. In some embodiments, the gate terminal of transistor T13 is coupled to at least an output terminal of inverter 1514.

A source terminal of transistor T13 is coupled to a drain terminal of transistor T14. A source terminal of transistor T14 is coupled to the reference voltage supply VSS.

Latch 1506 includes transistors T15-T22. In some embodiments, each of transistors T15, T17, T19 and T20 is a PMOS transistor. In some embodiments, each of transistors T16, T18, T21 and T22 is an NMOS transistor.

Transistors T15 and T16 are configured as an inverter configured to receive signal mx_ax, and to generate signal ml_b. The gate terminals of transistors T15 and T16 are configured to receive signal mx_ax. A source terminal of transistor T15 is coupled to the voltage supply VDD. A source terminal of transistor T16 is coupled to the reference voltage supply VSS.

Each of a source terminal of transistor T15, a source terminal of transistor T16, a source/drain terminal of transistor T17, a source/drain terminal of transistor T18, the gate terminal of transistor T11 and the gate terminal of transistor T14 are coupled together.

Transistors T17 and 18 are configured as a transmission gate (not labelled). A gate terminal of transistor T17 is configured to receive clock signal CLKB. A gate terminal of transistor T18 is configured to receive clock signal CLKBB.

Each of a drain/source terminal of transistor T17, a drain/source terminal of transistor T18, a gate terminal of transistor T23, a gate terminal of transistor T24, a drain terminal of transistor T20 and a drain terminal of transistor T21 are coupled together. Signal sl_a is the signal of at least the drain/source terminal of transistor T17, the drain/source terminal of transistor T18, the gate terminal of transistor T23, the gate terminal of transistor T24, the drain terminal of transistor T20 or the drain terminal of transistor T21.

Each of a gate terminal of transistor T19, a gate terminal of transistor T22, a drain terminal of transistor T23, a drain terminal of transistor T24, a gate terminal of transistor T25 and a gate terminal of transistor T26 are coupled together. The gate terminal of transistor T19 and the gate terminal of transistor T22 are configured to receive signal sl_bx from the drain terminal of transistor T23 and the drain terminal of transistor T24.

A source terminal of transistor T19 is coupled to the voltage supply VDD. A drain terminal of transistor T19 is coupled to a source terminal of transistor T20.

A gate terminal of transistor T20 is configured to receive clock signal CLKBB. In some embodiments, the gate terminal of transistor T20 is coupled to at least an output terminal of inverter 1514.

A gate terminal of transistor T21 is configured to receive clock signal CLKB. In some embodiments, the gate terminal of transistor T21 is coupled to at least an output terminal of inverter 1512.

A source terminal of transistor T21 is coupled to a drain terminal of transistor T22. A source terminal of transistor T22 is coupled to the reference voltage supply VSS.

Output circuit 1508 includes transistors T23-T26. In some embodiments, each of transistors T23 and T25 is a PMOS transistor. In some embodiments, each of transistors T24 and T26 is an NMOS transistor.

Transistors T23 and T24 are configured as an inverter (not labelled) configured to receive signal sl_a, and to generate signal sl_bx. The gate terminals of transistors T23 and T24 are configured to receive signal sl_a. A source terminal of transistor T23 is coupled to the voltage supply VDD. A source terminal of transistor T24 is coupled to the reference voltage supply VSS. The drain terminals of transistors T23 and T24 are configured to output the signal sl_bx.

Transistors T25 and T26 are configured as an inverter (not labelled) configured to receive signal sl_bx, and to generate signal Q. The gate terminals of transistors T25 and T26 are coupled together, and configured to receive signal sl_bx. A source terminal of transistor T25 is coupled to the voltage supply VDD. A source terminal of transistor T26 is coupled to the reference voltage supply VSS. The drain terminals of transistors T25 and T26 are coupled together, and configured to output the signal Q.

Inverter 1510 includes transistors T31-T32. In some embodiments, transistor T31 is a PMOS transistor. In some embodiments, transistor T32 is an NMOS transistor.

A gate terminal of transistor T31 and a gate terminal of transistor T32 are configured to receive scan enable signal SE. The gate terminals of transistor T31 and transistor T32 are coupled together. A source terminal of transistor T31 is coupled to the voltage supply VDD. A drain terminal of transistor T31 and a drain terminal of transistor T32 are coupled together, and are configured to output inverted scan enable signal SEB. A source terminal of transistor T32 is coupled to the reference voltage supply VSS.

Inverter 1512 includes transistors T27-T28. In some embodiments, transistor T27 is a PMOS transistor. In some embodiments, transistor T28 is an NMOS transistor.

A gate terminal of transistor T27 and a gate terminal of transistor T28 are configured to receive clock signal CP. The gate terminals of transistor T27 and transistor T28 are coupled together. A source terminal of transistor T27 is coupled to the voltage supply VDD. A drain terminal of transistor T27 and a drain terminal of transistor T28 are coupled together, and are configured to output inverted clock signal CLKB. A source terminal of transistor T28 is coupled to the reference voltage supply VSS.

Inverter 1514 includes transistors T29-T30. In some embodiments, transistor T29 is a PMOS transistor. In some embodiments, transistor T30 is an NMOS transistor.

Each of the drain terminal of transistor T27, the drain terminal of transistor T28, a gate terminal of transistor T29 and a gate terminal of transistor T30 are coupled together. The gate terminal of transistor T29 and the gate terminal of transistor T30 are configured to receive clock signal CLKB. A source terminal of transistor T29 is coupled to the voltage supply VDD. A drain terminal of transistor T29 and a drain terminal of transistor T30 are coupled together, and are configured to output inverted clock signal CLKBB. A source terminal of transistor T30 is coupled to the reference voltage supply VSS.

In some embodiments, one or more NMOS transistors are changed to one or more PMOS transistors, and vice versa. In some embodiments, one or more of the drains or sources are flipped with the other.

Other configurations, arrangements or other circuits in integrated circuit 1500 are within the scope of the present disclosure.

Figure 16:
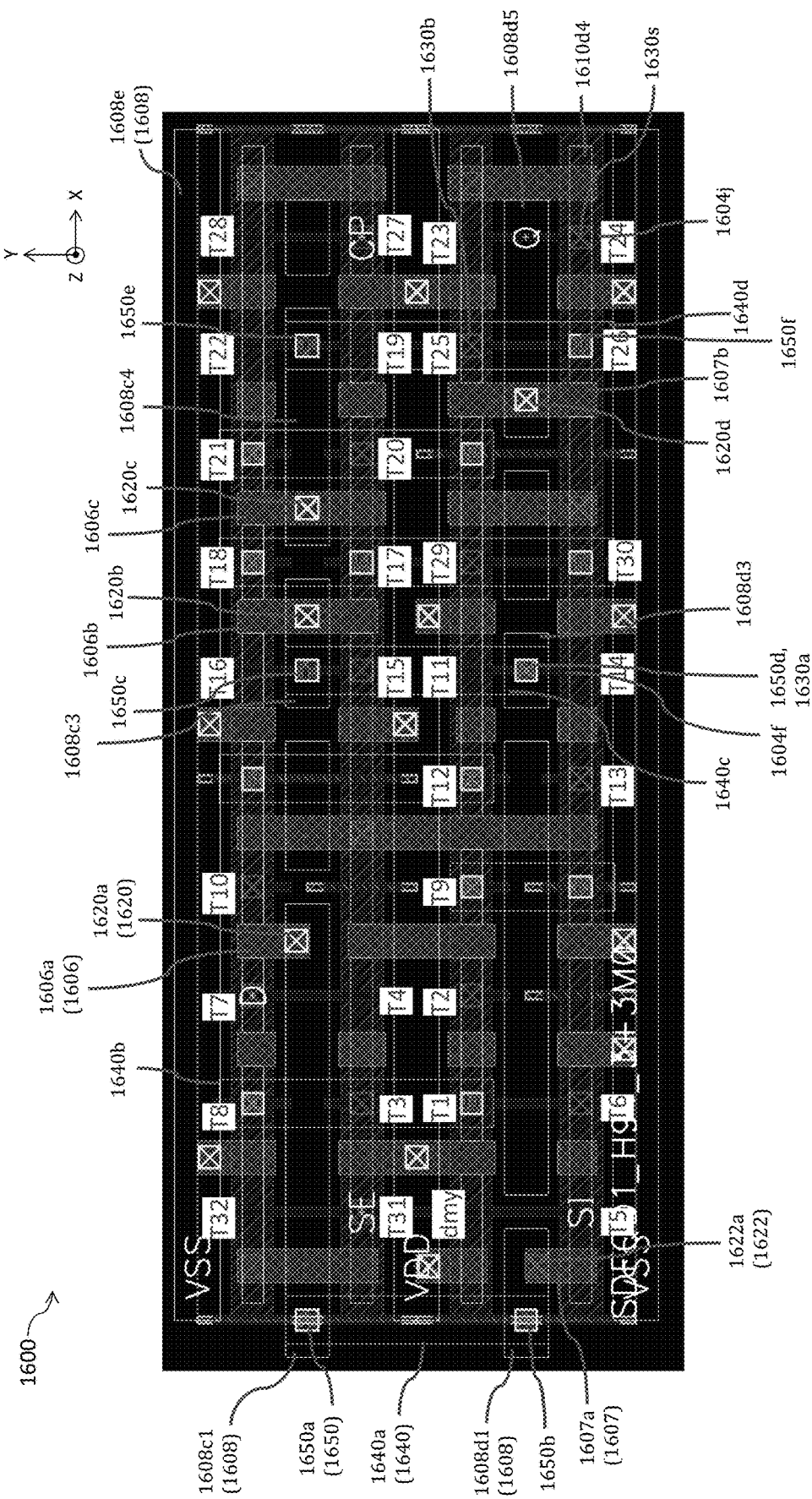
FIG. 16 is a top view of a diagram of an integrated circuit, in accordance with some embodiments.

FIG. 16 is a top view of a diagram of an integrated circuit 1600, in accordance with some embodiments.

Integrated circuit 1600 is an embodiment of integrated circuit 1500 of FIG. 15. Integrated circuit 1600 is manufactured by a corresponding layout design similar to integrated circuit 1600.

Integrated circuit 1600 includes at least the set of active regions 1602, a set of gates 1604, insulating region 303, the set of dummy gates 305, a set of contacts 1606 and 1607, a set of conductors 1608, a set of conductors 1610, a set of vias 1620, a set of vias 1622, a set of vias 1630, a set of conductors 1640 or a set of vias 1650.

For ease of illustration, each of the elements in integrated circuit 1600 of FIG. 16 are not labelled.

Integrated circuit 1600 is a variation of integrated circuit 300, 800, 1000, 1200 or 1400, and similar detailed description is therefore omitted.

The set of active regions 1602 replace the set of active regions 302 of FIGS. 3A-3F, and similar detailed description is therefore omitted. The set of active regions 1602 include at least active regions 1602a, 1602b, 1602c or 1604d.

The set of gates 1604 replace the set of gates 304 of FIGS. 3A-3F, and similar detailed description is therefore omitted. The set of gates 1604 include at least gate 1604a, ..., 1604i or 1604j.

In some embodiments, each of the gates in the set of gates 1604 are shown in FIG. 16 with labels "T1-T32" that identify corresponding transistors of FIG. 15 having corresponding gates in FIG. 16, and are omitted for brevity.

The set of contacts 1606 replace the set of contacts 306 of FIGS. 3A-3F, and similar detailed description is therefore omitted. Set of contacts 1606 include at least contact 1606a, ..., 1606n or 1606m.

The set of contacts 1607 replace the set of contacts 306 of FIGS. 3A-3F, and similar detailed description is therefore omitted. Set of contacts 1607 include at least contact 1607a, ..., 1607q or 1607r.

The set of conductors 1608, 1610 replace the corresponding set of conductors 308, 310 of FIGS. 3A-3F, and similar detailed description is therefore omitted.

The set of conductors 1608 include one or more of conductor 308a, 308b, 1608c, 1608d or Conductor 1608c of FIG. 16 replaces conductor 808c of FIG. 8, and similar detailed description is therefore omitted. In comparison with conductor 808c of FIG. 8, conductor 1608c includes conductors 1608c1, . . . , 1608c5, and similar detailed description is therefore omitted.

Conductor 1608d is variation of conductor 808c of FIG. 8, and similar detailed description is therefore omitted. In comparison with conductor 808c of FIG. 8, conductor 1608d includes conductors 1608d1, . . . , 1608d5, and similar detailed description is therefore omitted.

Conductor 1608e is variation of conductor 308b of FIGS. 3A-3F, and similar detailed description is therefore omitted. Conductor 1608e is a power rail for reference voltage VSS.

The set of conductors 1610 include one or more of conductor 1610a, 1610b, 1610c or 1610d.

Conductor 1610a of FIG. 16 replaces conductor 810a of FIG. 8, and similar detailed description is therefore omitted. In comparison with conductor 810a of FIG. 8, conductor 1610a includes conductors 1610a1, . . . , 1610a6, and similar detailed description is therefore omitted.

Conductor 1610b of FIG. 16 replaces conductor 810a of FIG. 8, and similar detailed description is therefore omitted. In comparison with conductor 810a of FIG. 8, conductor 1610b includes conductors 1610b1, . . . , 1610b5, and similar detailed description is therefore omitted.

Conductor 1610c of FIG. 16 replaces conductor 810a of FIG. 8, and similar detailed description is therefore omitted. In comparison with conductor 810a of FIG. 8, conductor 1610c includes conductors 1610c1, . . . , 1610c5, and similar detailed description is therefore omitted.

Conductor 1610d of FIG. 16 replaces conductor 810a of FIG. 8, and similar detailed description is therefore omitted. In comparison with conductor 810a of FIG. 8, conductor 1610d includes conductors 1610d1, . . . , 1610d4, and similar detailed description is therefore omitted.

The set of vias 1620, 1622, 1630 replace the corresponding set of vias 320, 322, 330 of FIGS. 3A-3F, and similar detailed description is therefore omitted.

The set of vias 1620 include at least via 1620a, . . . , 1620o or 1620p.

The set of vias 1622 include at least via 1622a, . . . , 1622e or 1622f.

The set of vias 1630 include at least via 1630a, . . . , 1630r or 1630s.

The set of conductors 1640 are similar to at least conductor 340 of FIGS. 3A-3F, and similar detailed description is therefore omitted. The set of conductors 1640 include at least conductor 1640a, . . . , 1640g or 1640h.

The set of vias 1650 are similar to at least via 410, 412, 430, 432 or 440 of FIGS. 4A-4C, and similar detailed description is therefore omitted. The set of vias 1650 include at least via 1650a, . . . , 1650p or 1650q.

Via 1650a is between and configured to electrically couple conductor 1640a and conductor 1608c1. Via 1620a is between and configured to electrically couple conductor 1608c1 and contact 1606a.

Via 1650b is between and configured to electrically couple conductor 1640a and conductor 1608d1. Via 1622a is between and configured to electrically couple conductor 1608d1 and contact 1607a.

Conductor 1640a is electrically coupled to conductors 1608c1 and 1608d1 by corresponding vias 1650a and 1650b, and conductors 1608c1 and 1608d1 are electrically coupled to corresponding contacts 1606a and 1607a by corresponding vias 1650a and 1650b, thereby electrically coupling the drain of NMOS transistor T7, the source of NMOS transistor T10, and the drain of NMOS transistor T5 together.

Via 1650c is between and configured to electrically couple conductor 1640c and conductor 1608c3. Via 1620b is between and configured to electrically couple conductor 1608c3 and contact 1606b.

Via 1650d is between and configured to electrically couple conductor 1640c and conductor 1608d3. Via 1630a is between and configured to electrically couple conductor 1608d3 and gate 1604f.

Conductor 1640c is electrically coupled to conductors 1608c3 and 1608d3 by corresponding vias 1650c and 1650d, and conductor 1608c3 is electrically coupled to contact 1606b by via 1620b, and conductor 1608d3 is electrically coupled to gate 1604f by via 1630a, thereby electrically coupling the drains of NMOS transistor T16 and PMOS transistor T15, and the gates of NMOS transistor T14 and PMOS transistor T11 together.

Via 1650e is between and configured to electrically couple conductor 1640d and conductor 1608c4. Via 1620c is between and configured to electrically couple conductor 1608c4 and contact 1606c.

Via 1650f is between and configured to electrically couple conductor 1640d and conductor 1610d4. Via 1630s is between and configured to electrically couple conductor 1610d4 and gate 1604j.

Conductor 1640d is electrically coupled to conductors 1608c4 and 1610d4 by corresponding vias 1650e and 1650f, and conductor 1608c4 is electrically coupled to contact 1606c by via 1620c, and conductor 1610d4 is electrically coupled to gate 1604j by via 1630s, thereby electrically coupling the drains/sources of NMOS transistor T17 and PMOS transistor T18, the drains of NMOS transistor T20 and PMOS transistor T21, and the gates of NMOS transistor T23 and PMOS transistor T24 together.

At least conductor 1608c1, 1608d1, 1608c3, 1608d3 or 1608c4 has an increased width W1b (not labelled) in the second direction Y. In some embodiments, by integrated circuit 1600 including at least conductor 1608c1, 1608d1, 1608c3, 1608d3 or 1608c4 with an increased width W1b, integrated circuit 1600 achieves one or more of the benefits discussed above in FIGS. 1-4C.

In some embodiments, at least conductor 1608c1, 1608d1, 1608c3, 1608d3 or 1608c4 is configured to couple other regions of integrated circuit 1600 together.

Other configurations, arrangements on other layout levels or quantities of elements in integrated circuit 1600 are within the scope of the present disclosure.

FIG. 17 is a functional flow chart of a method 1700 of manufacturing an IC device, in accordance with some embodiments. It is understood that additional operations may be performed before, during, and/or after the method 1700 depicted in FIG. 17, and that some other processes may only be briefly described herein.

In some embodiments, other order of operations of method 1700 is within the scope of the present disclosure. Method 1700 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1700, 1800 or 1900 is not performed.

In some embodiments, method 1700 is an embodiment of operation 1804 of method 1800. In some embodiments, the method 1700 is usable to manufacture or fabricate at least integrated circuit 100 or 300-1600, or an integrated circuit with similar features as at least layout design 200.

In operation 1702 of method 1700, a set of transistors are fabricated on a front-side of a semiconductor wafer or substrate 390. In some embodiments, the set of transistors of method 1700 includes one or more transistors in the set of active regions 302 or 1602. In some embodiments, the set of transistors of method 1700 includes one or more transistors described herein.

In some embodiments, operation 1702 further includes at least operation 1702a, 1704 or In some embodiments, operation 1702a (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1702 further includes operation 1704. In some embodiments, operation 1704 includes depositing a first conductive material over source/drain regions of the set of transistors on a first level thereby forming contacts of the set of transistors. In some embodiments, the first level of method 1700 includes the MD level or the POLY level.

In some embodiments, the source/drain regions of the set of transistors of method 1700 includes the source/drain regions of one or more transistors in the set of active regions 302 or 1602.

In some embodiments, the set of contacts of method 1700 include set of contacts 306, 606, 806, 1006, 1406 or 1606.

In some embodiments, operation 1702 further includes operation 1706. In some embodiments, operation 1706 includes forming gate regions of the set of transistors. In some embodiments, the gate regions of method 1700 include the set of gates 304, 305, 604, 804, 1004, 1204, 1404 or 1604.

In some embodiments, the gate region is between the drain region and the source region. In some embodiments, the gate region is over the first well and the substrate. In some embodiments, fabricating the gate regions of operation 1706 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1708 of method 1700, a first set of vias are formed over the first level. In some embodiments, the first set of vias of method 1700 are in the VD1, VD2 or the VG level.

In some embodiments, the first set of vias of method 1700 includes the set of vias 320, 620, 820, 1420 or 1620. In some embodiments, the first set of vias of method 1700 includes the set of vias 322, 622, 1022 or 1622. In some embodiments, the first set of vias of method 1700 includes the set of vias 330, 630, 830, 1030, 1430 or 1630.

In some embodiments, operation 1706 includes forming a first set of self-aligned contacts (SACs) in the insulating layer over the front-side of the wafer. In some embodiments, the first set of vias is electrically coupled to at least the set of transistors.

In operation 1710 of method 1700, a second conductive material is deposited on a second level thereby forming a first set of conductors. In some embodiments, the second level of method 1700 includes the M0 layer. In some embodiments, operation 1710 includes at least depositing a first set of conductive regions over the front-side of the integrated circuit.

In some embodiments, the first set of conductors of method 1700 includes one or more portions of at least the set of conductors 308, 608, 808, 1008, 1208, 1408 or 1608. In some embodiments, the first set of conductors of method 1700 includes one or more conductors similar to at least conductor 402 or 424.

In some embodiments, the first set of conductors of method 1700 includes one or more portions of at least the set of conductors 310, 610, 810, 1010, 1210, 1410 or 1610. In some embodiments, the first set of conductors of method 1700 includes one or more conductors similar to at least conductor 404, 422 or 426.

In some embodiments, operation 1708 is performed by at least two or more M0 masks.

In operation 1712 of method 1700, a second set of vias are formed over the second level. In some embodiments, the second set of vias of method 1700 are in the V0 level. In some embodiments, the second set of vias of method 1700 includes the set of vias 1650 or at least via 410, 412, 430, 432 or 440. In some embodiments, the second set of vias of method 1700 includes one or more vias similar to at least vias in the V0 layer.

In some embodiments, operation 1712 includes forming a second set of self-aligned contacts (SACs) in the insulating layer over the front-side of the wafer. In some embodiments, the second set of vias is electrically coupled to at least the set of transistors.

In operation 1714 of method 1700, a third conductive material is deposited on a third level thereby forming a second set of conductors. In some embodiments, the third level of method 1700 includes the M1 layer. In some embodiments, operation 1710 includes at least depositing a second set of conductive regions over the front-side of the integrated circuit.

In some embodiments, the second set of conductors of method 1700 includes one or more portions of at least the set of conductors 340 or 1640. In some embodiments, the second set of conductors of method 1700 includes one or more conductors similar to at least conductors in the M1 layer.

In some embodiments, one or more of operations 1704, 1706, 1708, 1710, 1712 or 1714 of method 1700 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 21:
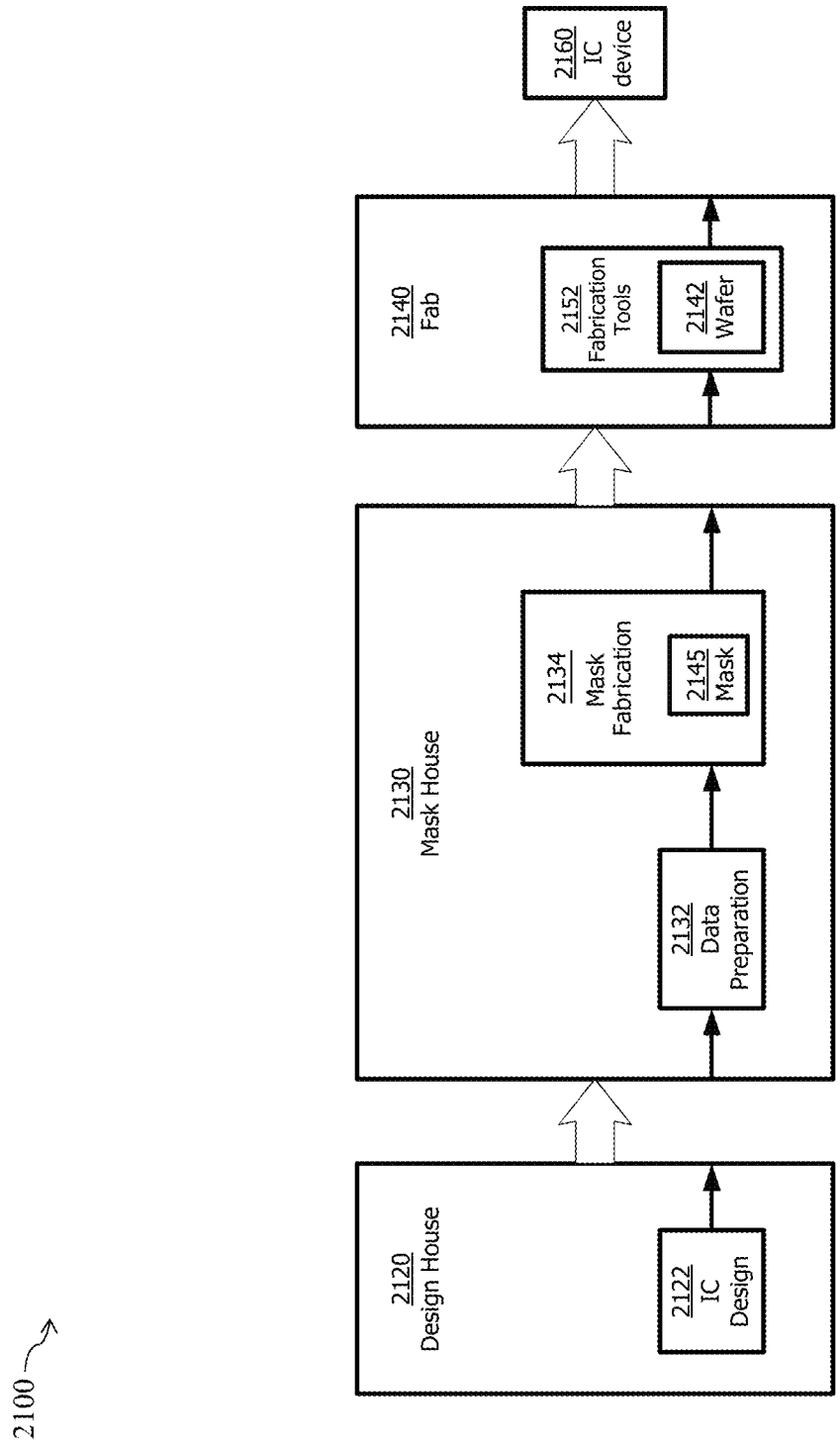
FIG. 21 is a block diagram of an IC manufacturing system, and an IC manufacturing flow associated therewith, in accordance with at least one embodiment of the present disclosure.

In some embodiments, at least one or more operations of method 1700 is performed by system 2100 of FIG. 21. In some embodiments, at least one method(s), such as method 1700 discussed above, is performed in whole or in part by at least one manufacturing system, including system 2100. One or more of the operations of method 1700 is performed by IC fab 2140 (FIG. 21) to fabricate IC device 2160. In some embodiments, one or more of the operations of method 1700 is performed by fabrication tools 2152 to fabricate wafer 2142.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1704, 1706, 1708, 1710, 1712 or 1714, the conductive material is planarized to provide a level surface for subsequent steps.

In some embodiments, one or more of the operations of method 1700, 1800 or 1900 is not performed.

One or more of the operations of methods 1800-1900 is performed by a processing device configured to execute instructions for manufacturing an integrated circuit, such as at least integrated circuit 100 or 300-1600. In some embodiments, one or more operations of methods 1800-1900 is performed using a same processing device as that used in a different one or more operations of methods 1800-1900. In some embodiments, a different processing device is used to perform one or more operations of methods 1800-1900 from that used to perform a different one or more operations of methods 1800-1900. In some embodiments, other order of operations of method 1700, 1800 or 1900 is within the scope of the present disclosure. Method 1700, 1800 or 1900 includes exemplary operations, but the operations are not necessarily performed in the order shown. Operations in method 1700, 1800 or 1900 may be added, replaced, changed order, and/or eliminated as appropriate, in accordance with the spirit and scope of disclosed embodiments.

Figure 18:
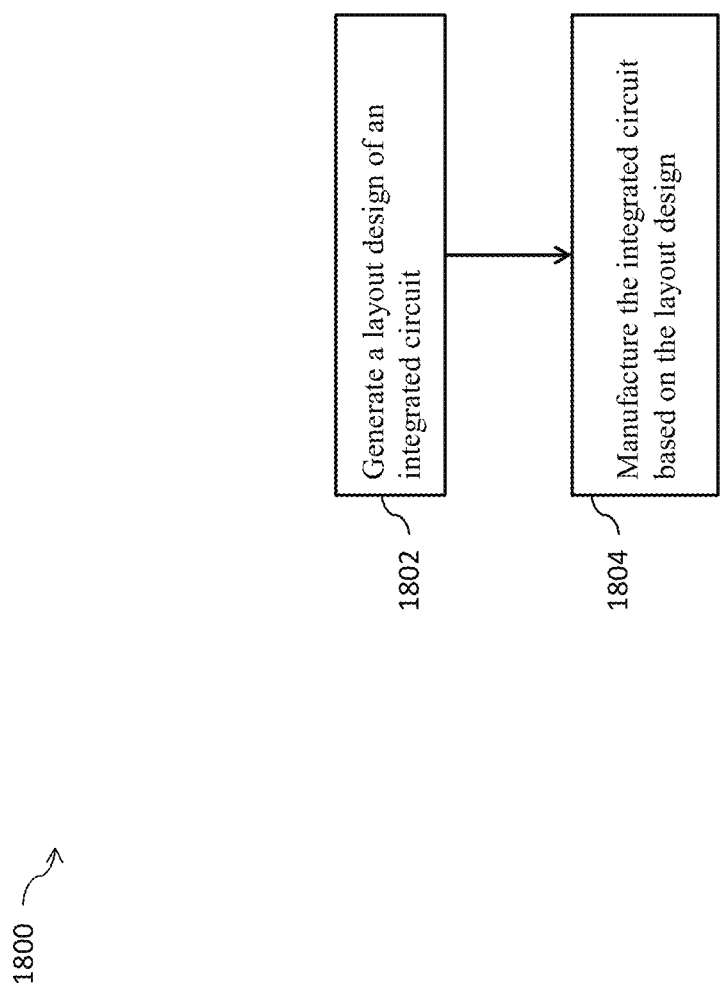
FIG. 18 is a flow chart of a method of manufacturing an IC device, in accordance with some embodiments.

FIG. 18 is a flowchart of a method 1800 of forming or manufacturing an integrated circuit in accordance with some embodiments. It is understood that additional operations may be performed before, during, and/or after the method 1800 depicted in FIG. 18, and that some other operations may only be briefly described herein. In some embodiments, the method 1800 is usable to form integrated circuits, such as at least integrated circuit 100 or 300-1600. In some embodiments, the method 1800 is usable to form integrated circuits having similar features and similar structural relationships as one or more of layout design 200.

In operation 1802 of method 1800, a layout design of an integrated circuit is generated. Operation 1802 is performed by a processing device (e.g., processor 2002 (FIG. 20)) configured to execute instructions for generating a layout design. In some embodiments, the layout design of method 1800 includes one or more patterns of at least layout design 200, or one or more features similar to at least integrated circuit 100 or 300-1600. In some embodiments, the layout design of the present application is in a graphic database system (GDSII) file format.

In operation 1804 of method 1800, the integrated circuit is manufactured based on the layout design. In some embodiments, operation 1804 of method 1800 comprises manufacturing at least one mask based on the layout design, and manufacturing the integrated circuit based on the at least one mask.

Figure 19:
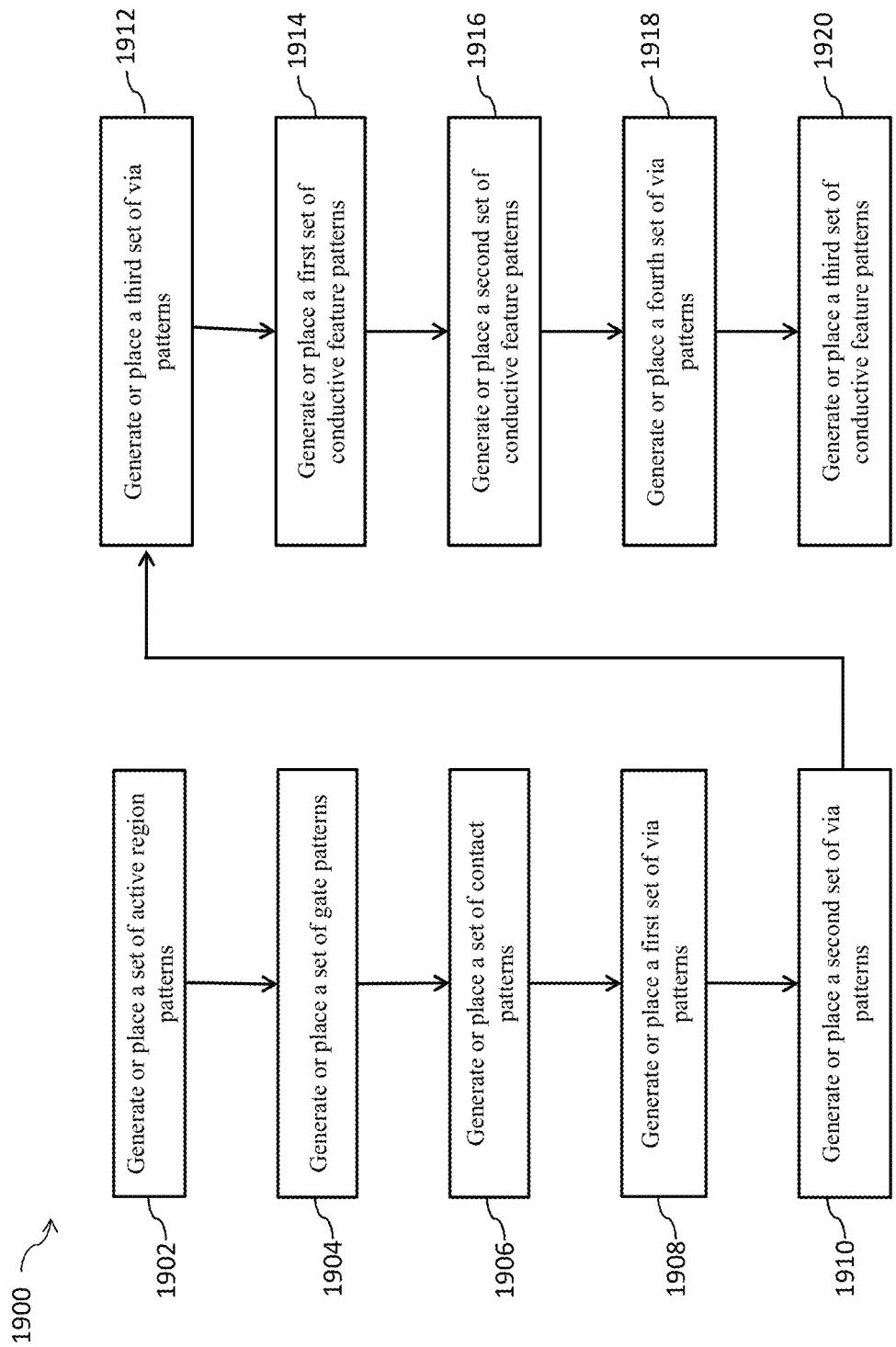
FIG. 19 is a flowchart of a method of generating a layout design of an integrated circuit in accordance with some embodiments.

FIG. 19 is a flowchart of a method 1900 of generating a layout design of an integrated circuit, in accordance with some embodiments. It is understood that additional operations may be performed before, during, and/or after the method 1900 depicted in FIG. 19, and that some other processes may only be briefly described herein. In some embodiments, method 1900 is an embodiment of operation 1802 of method 1800. In some embodiments, method 1900 is usable to generate one or more layout patterns of at least layout design 200, or one or more features similar to at least integrated circuit 300-1600.

In some embodiments, method 1900 is usable to generate one or more layout patterns having structural relationships including alignment, distances, lengths and widths, as well as configurations and layers of at least layout design 200, or one or more features similar to at least integrated circuit 300-1600, and similar detailed description will not be described in FIG. 19, for brevity.

In operation 1902 of method 1900, a set of active region patterns is generated or placed on the layout design. In some embodiments, the set of active region patterns of method 1900 includes at least portions of one or more patterns of set of active region patterns 202. In some embodiments, the set of active region patterns of method 1900 includes one or more active regions similar to the set of active regions 302 or 1602.

In operation 1904 of method 1900, a set of gate patterns is generated or placed on the layout design. In some embodiments, the set of gate patterns of method 1900 includes at least portions of one or more patterns of set of gate patterns 204 or 205. In some embodiments, the set of gate patterns of method 1900 includes one or more gates similar to at least the set of gates 304, 305, 604, 804, 1004, 1204, 1404 or 1604.

In operation 1906 of method 1900, a set of contact patterns is generated or placed on the layout design. In some embodiments, the set of contact patterns of method 1900 includes at least portions of one or more patterns of at least the set of contact patterns 206.

In some embodiments, the set of contact patterns of method 1900 includes one or more contacts similar to at least the set of contacts 306, 606, 806, 1006, 1406 or 1606. In some embodiments, the set of contact patterns of method 1900 includes one or more contacts similar to at least contacts in the MD layer.

In operation 1908 of method 1900, a first set of via patterns is generated or placed on the layout design. In some embodiments, the first set of via patterns of method 1900 includes at least portions of one or more patterns of set of via patterns 220. In some embodiments, the first set of via patterns of method 1900 includes one or more vias similar to at least the set of vias 320, 620, 820, 1420 or 1620.

In some embodiments, the first set of via patterns of method 1900 includes one or more vias similar to at least vias in the VD2 layer.

In operation 1910 of method 1900, a second set of via patterns is generated or placed on the layout design. In some embodiments, the second set of via patterns of method 1900 includes at least portions of one or more patterns of set of via patterns 222. In some embodiments, the second set of via patterns of method 1900 includes one or more vias similar to at least the set of vias 322, 622, 1022 or 1622.

In some embodiments, the second set of via patterns of method 1900 includes one or more vias similar to at least vias in the VD1 layer.

In operation 1912 of method 1900, a third set of via patterns is generated or placed on the layout design. In some embodiments, the third set of via patterns of method 1900 includes at least portions of one or more patterns of set of via patterns 230. In some embodiments, the third set of via patterns of method 1900 includes one or more vias similar to at least the set of vias 330, 630, 830, 1030, 1430 or 1630.

In some embodiments, the third set of via patterns of method 1900 includes one or more vias similar to at least vias in the VG layer.

In operation 1914 of method 1900, a first set of conductive patterns is generated or placed on the layout design. In some embodiments, the first set of conductive patterns of method 1900 includes at least portions of one or more patterns of at least the set of conductive patterns 208.

In some embodiments, the first set of conductive patterns of method 1900 includes one or more conductors similar to at least the set of conductors 308, 608, 808, 1008, 1208, 1408 or 1608. In some embodiments, the first set of conductive patterns of method 1900 includes one or more conductors similar to at least conductor 402 or 424.

In some embodiments, the first set of conductive patterns of method 1900 includes one or more conductors similar to at least conductors in the M0 or MOA layer.

In operation 1916 of method 1900, a second set of conductive patterns is generated or placed on the layout design. In some embodiments, the second set of conductive patterns of method 1900 includes at least portions of one or more patterns of at least the set of conductive patterns 210.

In some embodiments, the second set of conductive patterns of method 1900 includes one or more conductors similar to at least the set of conductors 310, 610, 810, 1010, 1210, 1410 or 1610. In some embodiments, the second set of conductive patterns of method 1900 includes one or more conductors similar to at least conductor 404, 422 or 426.

In some embodiments, the second set of conductive patterns of method 1900 includes one or more conductors similar to at least conductors in the M0 or MOB layer.

In operation 1918 of method 1900, a fourth set of via patterns is generated or placed on the layout design. In some embodiments, the fourth set of via patterns of method 1900 includes at least portions of one or more patterns of set of via patterns in the V0 layer. In some embodiments, the fourth set of via patterns of method 1900 includes one or more vias similar to at least the set of vias 1650 or at least via 410, 412, 430, 432 or 440.

In some embodiments, the fourth set of via patterns of method 1900 includes one or more vias similar to at least vias in the V0 layer.

In operation 1920 of method 1900, a third set of conductive patterns is generated or placed on the layout design. In some embodiments, the third set of conductive patterns of method 1900 includes at least portions of one or more patterns of at least the set of conductive patterns 240.

In some embodiments, the third set of conductive patterns of method 1900 includes one or more conductors similar to at least the set of conductors 340 or 1640.

In some embodiments, the third set of conductive patterns of method 1900 includes one or more conductors similar to at least conductors in the M1 layer.

Figure 20:
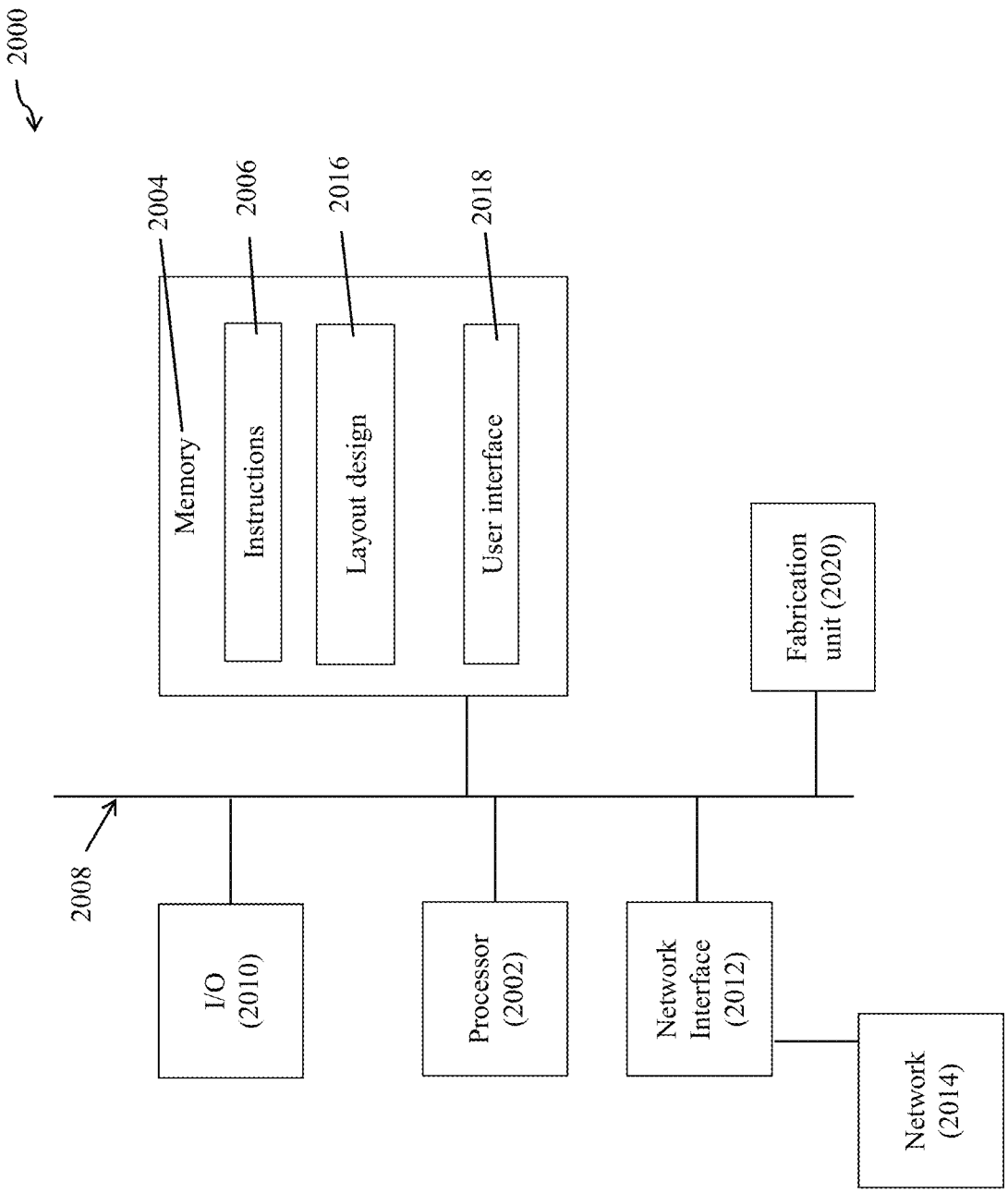
FIG. 20 is a schematic view of a system for designing an IC layout design and manufacturing an IC in accordance with some embodiments.

FIG. 20 is a schematic view of a system 2000 for designing an IC layout design and manufacturing an IC in accordance with some embodiments.

In some embodiments, system 2000 generates or places one or more IC layout designs described herein. System 2000 includes a hardware processor 2002 and a non-transitory, computer readable storage medium 2004 (e.g., memory 2004) encoded with, i.e., storing, the computer program code 2006, i.e., a set of executable instructions 2006. Computer readable storage medium 2004 is configured for interfacing with manufacturing machines for producing the integrated circuit. The processor 2002 is electrically coupled to the computer readable storage medium 2004 via a bus 2008. The processor 2002 is also electrically coupled to an I/O interface 2010 by bus 2008. A network interface 2012 is also electrically connected to the processor 2002 via bus 2008. Network interface 2012 is connected to a network 2014, so that processor 2002 and computer readable storage medium 2004 are capable of connecting to external elements via network 2014. The processor 2002 is configured to execute the computer program code 2006 encoded in the computer readable storage medium 2004 in order to cause system 2000 to be usable for performing a portion or all of the operations as described in method 1800-1900.

In some embodiments, the processor 2002 is a central processing unit (CPU), a multi-processor, a distributed processing system, an application specific integrated circuit (ASIC), and/or a suitable processing unit.

In some embodiments, the computer readable storage medium 2004 is an electronic, magnetic, optical, electromagnetic, infrared, and/or a semiconductor system (or apparatus or device). For example, the computer readable storage medium 2004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2004 includes a compact disk-read only memory (CD-ROM), a compact disk-read/write (CD-R/W), and/or a digital video disc (DVD).

In some embodiments, the storage medium 2004 stores the computer program code 2006 configured to cause system 2000 to perform method 1800-1900. In some embodiments, the storage medium 2004 also stores information needed for performing method 1800-1900 as well as information generated during performing method 1800-1900, such as layout design 2016, user interface 2018 and fabrication unit 2020, and/or a set of executable instructions to perform the operation of method 1800-1900. In some embodiments, layout design 2016 comprises one or more of layout patterns of at least layout design 200, or features similar to at least integrated circuit 100 or 300-1600.

In some embodiments, the storage medium 2004 stores instructions (e.g., computer program code 2006) for interfacing with manufacturing machines. The instructions (e.g., computer program code 2006) enable processor 2002 to generate manufacturing instructions readable by the manufacturing machines to effectively implement method 1800-1900 during a manufacturing process.

System 2000 includes I/O interface 2010. I/O interface 2010 is coupled to external circuitry. In some embodiments, I/O interface 2010 includes a keyboard, keypad, mouse, trackball, trackpad, and/or cursor direction keys for communicating information and commands to processor 2002.

System 2000 also includes network interface 2012 coupled to the processor 2002. Network interface 2012 allows system 2000 to communicate with network 2014, to which one or more other computer systems are connected. Network interface 2012 includes wireless network interfaces such as BLUETOOTH, WIFI, WIMAX, GPRS, or WCDMA; or wired network interface such as ETHERNET, USB, or IEEE-2094. In some embodiments, method 1800-1900 is implemented in two or more systems 2000, and information such as layout design, and user interface are exchanged between different systems 2000 by network 2014.

System 2000 is configured to receive information related to a layout design through I/O interface 2010 or network interface 2012. The information is transferred to processor 2002 by bus 2008 to determine a layout design for producing at least integrated circuit 100 or 300-1600. The layout design is then stored in computer readable storage medium 2004 as layout design 2016. System 2000 is configured to receive information related to a user interface through I/O interface 2010 or network interface 2012. The information is stored in computer readable storage medium 2004 as user interface 2018. System 2000 is configured to receive information related to a fabrication unit 2020 through I/O interface 2010 or network interface 2012. The information is stored in computer readable storage medium 2004 as fabrication unit 2020. In some embodiments, the fabrication unit 2020 includes fabrication information utilized by system 2000. In some embodiments, the fabrication unit 2020 corresponds to mask fabrication 2234 of FIG. 22.

In some embodiments, method 1800-1900 is implemented as a standalone software application for execution by a processor. In some embodiments, method 1800-1900 is implemented as a software application that is a part of an additional software application. In some embodiments, method 1800-1900 is implemented as a plug-in to a software application. In some embodiments, method 1800-1900 is implemented as a software application that is a portion of an EDA tool. In some embodiments, method 1800-1900 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1800-1900 is implemented by a manufacturing device to manufacture an integrated circuit using a set of masks manufactured based on one or more layout designs generated by system 2000. In some embodiments, system 2000 is a manufacturing device configured to manufacture an integrated circuit using a set of masks manufactured based on one or more layout designs of the present disclosure. In some embodiments, system 2000 of FIG. 20 generates layout designs of an integrated circuit that are smaller than other approaches. In some embodiments, system 2000 of FIG. 20 generates layout designs of integrated circuit structure that occupy less area and provide better routing resources than other approaches.

FIG. 21 is a block diagram of an integrated circuit (IC) manufacturing system 2100, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 2100.

In FIG. 21, IC manufacturing system 2100 (hereinafter "system 2100") includes entities, such as a design house 2120, a mask house 2130, and an IC manufacturer/fabricator ("fab") 2140, that interact with one another in the design, development, and manufacturing cycles and/or services related to manufacturing an IC device 2160. The entities in system 2100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 2120, mask house 2130, and IC fab 2140 is owned by a single larger company. In some embodiments, one or more of design house 2120, mask house 2130, and IC fab 2140 coexist in a common facility and use common resources.

Design house (or design team) 2120 generates an IC design layout 2122. IC design layout 2122 includes various geometrical patterns designed for an IC device 2160. The geometrical patterns correspond to patterns of metal, oxide, or semiconductor layers that make up the various components of IC device 2160 to be fabricated. The various layers combine to form various IC features. For example, a portion of IC design layout 2122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 2120 implements a proper design procedure to form IC design layout 2122. The design procedure includes one or more of logic design, physical design or place and route. IC design layout 2122 is presented in one or more data files having information of the geometrical patterns. For example, IC design layout 2122 can be expressed in a GDSII file format or DFII file format.

Mask house 2130 includes data preparation 2132 and mask fabrication 2134. Mask house 2130 uses IC design layout 2122 to manufacture one or more masks 2145 to be used for fabricating the various layers of IC device 2160 according to IC design layout 2122. Mask house 2130 performs mask data preparation 2132, where IC design layout 2122 is translated into a representative data file (RDF). Mask data preparation 2132 provides the RDF to mask fabrication 2134. Mask fabrication 2134 includes a mask writer. A mask writer converts the RDF to an image on a substrate, such as a mask (reticle) 2145 or a semiconductor wafer 2142. The design layout 2122 is manipulated by mask data preparation 2132 to comply with particular characteristics of the mask writer and/or requirements of IC fab 2140. In FIG. 21, mask data preparation 2132 and mask fabrication 2134 are illustrated as separate elements. In some embodiments, mask data preparation 2132 and mask fabrication 2134 can be collectively referred to as mask data preparation.

In some embodiments, mask data preparation 2132 includes optical proximity correction (OPC) which uses lithography enhancement techniques to compensate for image errors, such as those that can arise from diffraction, interference, other process effects and the like. OPC adjusts IC design layout 2122. In some embodiments, mask data preparation 2132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 2134, which may undo part of the modifications performed by OPC in order to meet mask creation rules.

In some embodiments, mask data preparation 2132 includes lithography process checking (LPC) that simulates processing that will be implemented by IC fab 2140 to fabricate IC device 2160. LPC simulates this processing based on IC design layout 2122 to create a simulated manufactured device, such as IC device 2160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 2122.

It should be understood that the above description of mask data preparation 2132 has been simplified for the purposes of clarity. In some embodiments, data preparation 2132 includes additional features such as a logic operation (LOP) to modify the IC design layout according to manufacturing rules. Additionally, the processes applied to IC design layout 2122 during data preparation 2132 may be executed in a variety of different orders.

After mask data preparation 2132 and during mask fabrication 2134, a mask 2145 or a group of masks 2145 are fabricated based on the modified IC design layout 2122. In some embodiments, mask fabrication 2134 includes performing one or more lithographic exposures based on IC design 2122. In some embodiments, an electron-beam (e-beam) or a mechanism of multiple e-beams is used to form a pattern on a mask (photomask or reticle) 2145 based on the modified IC design layout 2122. The mask 2145 can be formed in various technologies. In some embodiments, the mask 2145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 2145 includes a transparent substrate (e.g., fused quartz) and an opaque material (e.g., chromium) coated in the opaque regions of the binary mask. In another example, the mask 2145 is formed using a phase shift technology. In the phase shift mask (PSM) version of mask 2145, various features in the pattern formed on the mask are configured to have proper phase difference to enhance the resolution and imaging quality. In various examples, the phase shift mask can be attenuated PSM or alternating PSM. The mask(s) generated by mask fabrication 2134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 2140 is an IC fabrication entity that includes one or more manufacturing facilities for the fabrication of a variety of different IC products. In some embodiments, IC Fab 2140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 2140 includes wafer fabrication tools 2152 (hereinafter "fabrication tools 2152") configured to execute various manufacturing operations on semiconductor wafer 2142 such that IC device 2160 is fabricated in accordance with the mask(s), e.g., mask 2145. In various embodiments, fabrication tools 2152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2140 uses mask(s) 2145 fabricated by mask house 2130 to fabricate IC device 2160. Thus, IC fab 2140 at least indirectly uses IC design layout 2122 to fabricate IC device 2160. In some embodiments, a semiconductor wafer 2142 is fabricated by IC fab 2140 using mask(s) 2145 to form IC device 2160. In some embodiments, the IC fabrication includes performing one or more lithographic exposures based at least indirectly on IC design 2122. Semiconductor wafer 2142 includes a silicon substrate or other proper substrate having material layers formed thereon. Semiconductor wafer 2142 further includes one or more of various doped regions, dielectric features, multilevel interconnects, and the like (formed at subsequent manufacturing steps).

System 2100 is shown as having design house 2120, mask house 2130 or IC fab 2140 as separate components or entities. However, it is understood that one or more of design house 2120, mask house 2130 or IC fab 2140 are part of the same component or entity.

Details regarding an integrated circuit (IC) manufacturing system (e.g., system 2100 of FIG. 21), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a set of transistors including a set of active regions, a set of power rails, a first set of conductors and a first conductor. In some embodiments, the set of transistors includes a set of active regions. In some embodiments, the set of active regions extends in a first direction, and is on a first level of a substrate. In some embodiments, the set of power rails extends in the first direction, is configured to supply a first supply voltage or a second supply voltage to the set of transistors, and is on a second level different from the first level. In some embodiments, the set of power rails has a first width. In some embodiments, the first set of conductors extends in the first direction, is on the second level, is separated from the set of power rails in a second direction different from the first direction, and overlaps the set of active regions. In some embodiments, the first set of conductors has a second width different from the first width. In some embodiments, the first conductor extends in the first direction, is on the second level and is between the first set of conductors. In some embodiments, the first conductor has the first width. In some embodiments, the first conductor electrically couples a first transistor of the set of transistors to a second transistor of the set of transistors.

Another aspect of this description relates to an integrated circuit. In some embodiments, the integrated circuit includes a first active region, a second active region, a set of power rails, a first conductor, a second conductor, and a third conductor. In some embodiments, the first active region extends in a first direction, and is on a first level of a substrate. In some embodiments, the second active region extends in the first direction, is on the first level of the substrate, and is separated from the first active region in a second direction different from the first direction. In some embodiments, the set of power rails extends in the first direction, configured to supply a first supply voltage or a second supply voltage, and is on a second level different from the first level. In some embodiments, the first conductor extends in the first direction, overlaps the first active region, is between the set of power rails, and has a first width. In some embodiments, the second conductor extends in the first direction, overlaps the second active region, is between the set of power rails, and has the first width. In some embodiments, the third conductor extends in the first direction, is on the second level and is between the first conductor and the second conductor. In some embodiments, the third conductor has a second width different from the first width, and the third conductor electrically couples a first region of the first active region to a first region of the second active region.

Still another aspect of this description relates to a method of fabricating an integrated circuit. In some embodiments, the method includes fabricating a set of transistors in a front-side of a substrate; depositing a first conductive material over the set of transistors on a first level thereby forming a set of contacts for the set of transistors; fabricating a first set of vias over the set of transistors; depositing a second conductive material over the set of contacts on a second level thereby forming a set of power rails, the set of power rails having a first width, the second level being above the first level; depositing a third conductive material over the set of contacts on the second level thereby forming a second set of conductors, the second set of conductors having the first width, the second set of conductors overlapping the set of contacts, the second set of conductors being electrically coupled to the set of contacts by the first set of vias; and depositing a fourth conductive material over the set of contacts on the second level thereby forming a third set of conductors, the third set of conductors having a second width different from the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a set of transistors including a set of active regions, the set of active regions extending in a first direction, and being on a first level of a substrate, wherein the set of active regions comprises:
a first active region extending in the first direction, the first active region corresponding to a first drain/source of a first transistor of the set of transistors;
a set of power rails extending in the first direction, configured to supply a first supply voltage or a second supply voltage to the set of transistors, and being on a second level different from the first level, the set of power rails having a first width;
a first set of conductors extending in the first direction, being on the second level, being separated from the set of power rails in a second direction different from the first direction, and overlapping the set of active regions, the first set of conductors having a second width different from the first width;
a first conductor extending in the first direction, being on the second level and being between the first set of conductors, the first conductor having the first width, and the first conductor electrically coupling the first transistor of the set of transistors to a second transistor of the set of transistors; and
a first contact of the first drain/source, the first contact extending in the second direction, being on a third level different from the first level and the second level, and overlapping the first active region.

2. The integrated circuit of claim 1, wherein the set of active regions further comprises:
a second active region extending in the first direction, and being separated from the first active region in the second direction, the second active region corresponding to a second drain/source of the second transistor of the set of transistors.

3. The integrated circuit of claim 2, wherein the set of power rails comprises:
a first power rail extending in the first direction, and configured to supply the first supply voltage to the first active region; and
a second power rail extending in the first direction, configured to supply the second supply voltage to the second active region, and being separated from the first power rail in the second direction.

4. The integrated circuit of claim 2, wherein the first set of conductors comprises:
a first conductor portion extending in the first direction, and overlapping the first active region; and
a second conductor portion extending in the first direction, and overlapping the second active region.

5. The integrated circuit of claim 2, further comprising:
a second contact of the second drain/source, the second contact extending in the second direction, being on the third level, and overlapping the second active region.

6. The integrated circuit of claim 5, further comprising:
a first via between the first contact and the first conductor, the first via electrically coupling the first contact and the first conductor together; and
a second via between the second contact and the first conductor, the second via electrically coupling the second contact and the first conductor together.

7. The integrated circuit of claim 6, wherein the first contact and the second contact are not aligned in the second direction.

8. The integrated circuit of claim 6, wherein the first conductor overlaps the first contact and the second contact.

9. The integrated circuit of claim 6, further comprising:
a first gate structure of at least a third transistor of the set of transistors, the first gate structure being on a fourth level different from the first level and the second level, the first gate structure overlapping the first active region and the second active region.

10. The integrated circuit of claim 9, further comprising:
a third via between the first gate structure and the first conductor, the third via electrically coupling the first gate structure and the first conductor together.

11. An integrated circuit comprising:
a first active region extending in a first direction, and being on a first level of a substrate;
a second active region extending in the first direction, being on the first level of the substrate, and being separated from the first active region in a second direction different from the first direction;
a set of power rails extending in the first direction, configured to supply a first supply voltage or a second supply voltage, and being on a second level different from the first level;
a first conductor extending in the first direction, overlapping the first active region, being between the set of power rails, and having a first width;
a second conductor extending in the first direction, overlapping the second active region, being between the set of power rails, and having the first width;
a third conductor extending in the first direction, being on the second level and being between the first conductor and the second conductor, the third conductor having a second width different from the first width, and the third conductor electrically coupling a first region of the first active region to a first region of the second active region; and
a first set of conductors extending in the second direction, being on a third level different from the first level and the second level, the first set of conductors overlapping the third conductor.

12. The integrated circuit of claim 11, wherein the set of power rails comprises:
a first power rail extending in the first direction, and configured to supply the first supply voltage to the first active region, the first power rail having a third width different from the first width; and
a second power rail extending in the first direction, configured to supply the second supply voltage to the second active region, and being separated from the first power rail in the second direction, the second power rail having the third width.

13. The integrated circuit of claim 11, further comprising:
a set of gates extending in the second direction, being on a fourth level different from the first level and the second level, the set of gates overlapping the first active region and the second active region.

14. The integrated circuit of claim 13, wherein
the first set of conductors further overlapping the set of gates.

15. The integrated circuit of claim 14, further comprising:
a first contact of a first drain/source of the first active region and a second drain/source of the second active region, the first contact extending in the second direction, being on a fifth level different from the first level, the second level and the fourth level, and overlapping the first active region and the second active region; and
a first via between the first contact and the third conductor, the first via electrically coupling the first contact and the third conductor together.

16. The integrated circuit of claim 15, further comprising:
a first conductor of the first set of conductors overlapping a first gate of the set of gates, a second gate of the set of gates, and the third conductor; and
a second via between the first conductor of the first set of conductors and the third conductor, the second via electrically coupling the first conductor of the first set of conductors and the third conductor together.

17. The integrated circuit of claim 16, further comprising:
a fourth conductor extending in the first direction, being on the second level and overlapping the second gate of the set of gates, and the fourth conductor having the second width;
a third via between the first conductor of the first set of conductors and the fourth conductor, the third via electrically coupling the first conductor of the first set of conductors and the fourth conductor together; and
a fourth via between the fourth conductor and the second gate of the set of gates, the fourth via electrically coupling the fourth conductor and the second gate of the set of gates together.

18. The integrated circuit of claim 14, further comprising:
a first contact of a first drain/source of the first active region, the first contact extending in the second direction, being on a fifth level different from the first level, the second level and the fourth level, and overlapping the first active region; and
a second contact of a second drain/source of the second active region, the second contact extending in the second direction, being on the fifth level, and overlapping the second active region,
wherein the first contact and the second contact are not aligned in the second direction.

19. The integrated circuit of claim 18, further comprising:
a first via between the first contact and the third conductor, the first via electrically coupling the first contact and the third conductor together; and
a second via between the second contact and the third conductor, the second via electrically coupling the second contact and the third conductor together.

20. An integrated circuit comprising:
a first set of transistors of a first type, the first set of transistors including a first active region extending in a first direction, and being on a first level of a substrate;
a second set of transistors of a second type different from the first type, the second set of transistors including a second active region extending in the first direction, being on the first level of the substrate, and being separated from the first active region in a second direction different from the first direction;
a set of power rails extending in the first direction, configured to supply a first supply voltage or a second supply voltage different from the first supply voltage, being on a second level different from the first level, and the set of power rails having a first width;
a first conductor extending in the first direction, overlapping the first active region, being between the set of power rails, and having a second width different from the first width;
a second conductor extending in the first direction, overlapping the second active region, being between the set of power rails, and having the second width;
a third conductor extending in the first direction, being on the second level and being between the first conductor and the second conductor, the third conductor having the first width, and the third conductor electrically coupling a first drain/source region of the first active region to a first drain/source region of the second active region; and
a first contact of the first drain/source region of the first active region, the first contact extending in the second direction, being on a third level different from the first level and the second level, and overlapping the first active region.

* * * * *